(12) United States Patent
Iazikov et al.

(10) Patent No.: US 10,830,929 B2
(45) Date of Patent: Nov. 10, 2020

(54) PHASE-TRANSFORMING OPTICAL ELEMENT FORMED BY PARTIAL ETCHING OR BY PARTIAL ETCHING WITH REFLOW

(71) Applicant: Finisar Corporation, Sunnyvale, CA (US)

(72) Inventors: Dmitri Iazikov, Eugene, OR (US); Thomas W. Mossberg, Springfield, OR (US); Christoph M. Greiner, Eugene, OR (US); John H. Clark, Sunnyvale, CA (US)

(73) Assignee: II-VI Delaware Inc., Wilmington, DE (US)

( * ) Notice: Subject to any disclaimer, the term of this patent is extended or adjusted under 35 U.S.C. 154(b) by 130 days.

(21) Appl. No.: 16/355,803

(22) Filed: Mar. 17, 2019

(65) Prior Publication Data

US 2019/0212479 A1 Jul. 11, 2019

Related U.S. Application Data

(62) Division of application No. 15/784,702, filed on Oct. 16, 2017, now Pat. No. 10,539,723.

(Continued)

(51) Int. Cl.
*G02B 5/18* (2006.01)
*G02B 5/08* (2006.01)
(Continued)

(52) U.S. Cl.
CPC .............. *G02B 5/0883* (2013.01); *G02B 3/08* (2013.01); *G02B 5/1847* (2013.01);
(Continued)

(58) Field of Classification Search
CPC .. G02B 5/1847; G02B 5/1861; G02B 5/1866; G02B 5/1871; G02B 5/0883
(Continued)

(56) References Cited

U.S. PATENT DOCUMENTS 5,330,862 A 7/1994 Tabuchi et al.
5,840,447 A 11/1998 Peng
(Continued)

FOREIGN PATENT DOCUMENTS

EP 1 486 803 A2 12/2004
JP 2001-108812 4/2001
(Continued)

OTHER PUBLICATIONS

Search Report and Written Opinion dated Jul. 20, 2016 in counterpart international App No. PCT/US2016/026835 (cited in parent).
(Continued)

*Primary Examiner* — Ricky D Shafer
(74) *Attorney, Agent, or Firm* — Maschoff Brennan

(57) ABSTRACT

An optical element includes a transmissive layer comprising a multitude of discrete volumes of first and second optical media arranged along the transmissive layer. The discrete volumes are arranged to approximate a desired phase function (typically modulo 2π) and are smaller than an operational wavelength in order to provide a range of phase delays needed to adequately approximate the desired phase function. Effecting at least partial reflow of one or both of the optical media can smooth the morphology of the transmissive layer so as to reduce unwanted diffraction or scattering.

47 Claims, 32 Drawing Sheets

Related U.S. Application Data

(60) Provisional application No. 62/507,776, filed on May 17, 2017, provisional application No. 62/410,380, filed on Oct. 19, 2016.

(51) Int. Cl.
    *G02B 3/08*      (2006.01)
    *G02B 5/30*      (2006.01)
    *C23F 1/02*      (2006.01)
    *H01J 37/305*      (2006.01)

(52) U.S. Cl.
    CPC ......... *G02B 5/1861* (2013.01); *G02B 5/1866* (2013.01); *G02B 5/1871* (2013.01); *G02B 5/3083* (2013.01); *C23F 1/02* (2013.01); *H01J 37/3056* (2013.01)

(58) Field of Classification Search
    USPC .................. 359/565, 573, 577, 871, 900
    See application file for complete search history.

(56) References Cited

U.S. PATENT DOCUMENTS

| | | | |
|---|---|---|---|
| 5,928,813 | A | 7/1999 | Krivokapic et al. |
| 6,545,808 | B1 | 4/2003 | Ehbets et al. |
| 6,599,666 | B2 | 7/2003 | Rolfson |
| 6,977,127 | B2 | 12/2005 | Shiah et al. |
| 6,985,656 | B2 | 1/2006 | Iazikov et al. |
| 6,987,911 | B2 | 1/2006 | Mossberg et al. |
| 7,057,819 | B1 | 6/2006 | Maheshwari |
| 7,173,767 | B2 | 2/2007 | Satzke |
| 7,260,290 | B1 | 8/2007 | Greiner et al. |
| RE39,865 | E | 10/2007 | Hill et al. |
| 7,663,084 | B2 | 2/2010 | Toshikiyo et al. |
| 7,692,129 | B2 | 4/2010 | Toshikiyo et al. |
| 8,009,355 | B2 | 8/2011 | Nakai |
| 8,178,010 | B2 | 5/2012 | Hirai et al. |
| 8,559,110 | B2 | 10/2013 | Tanikawa |
| 8,755,118 | B2 | 6/2014 | Chang-Hasnain et al. |
| 8,765,360 | B2 | 7/2014 | Wang et al. |
| 9,618,664 | B2 | 4/2017 | Mossberg et al. |
| 10,386,553 | B2 * | 8/2019 | Mossberg et al. ... G02B 5/1861 |
| 10,539,723 | B2 * | 1/2020 | Iazikov et al. ....... G02B 5/0883 |
| 2004/0218270 | A1 | 11/2004 | Wang |
| 2005/0045799 | A1 | 3/2005 | Deng et al. |
| 2005/0226122 | A1 | 10/2005 | Ooi et al. |
| 2005/0277063 | A1 | 12/2005 | Wang et al. |
| 2006/0049056 | A1 | 3/2006 | Wang et al. |
| 2006/0127829 | A1 | 6/2006 | Deng et al. |
| 2007/0103782 | A1 | 5/2007 | Lee et al. |
| 2009/0041971 | A1 | 2/2009 | Wang et al. |
| 2009/0053655 | A1 | 2/2009 | Deng et al. |
| 2009/0116790 | A1 | 5/2009 | Mossberg et al. |
| 2012/0002286 | A1 | 1/2012 | Tanikawa |
| 2012/0105962 | A1 | 5/2012 | Fattal et al. |
| 2013/0137016 | A1 | 5/2013 | Li et al. |
| 2014/0002911 | A1 | 1/2014 | Peloux et al. |
| 2015/0090862 | A1 | 4/2015 | Matsui et al. |
| 2017/0168202 | A1 | 6/2017 | Mossberg et al. |
| 2018/0128948 | A1 | 5/2018 | Iazikov et al. |

FOREIGN PATENT DOCUMENTS

| | | |
|---|---|---|
| JP | 2001-318217 | 11/2001 |
| JP | 3308021 B2 | 7/2002 |
| JP | 2004-061905 | 2/2004 |
| JP | 3547665 B2 | 7/2004 |
| JP | 2005-266188 | 9/2005 |
| JP | 2006-011121 A | 1/2006 |
| JP | 2008-258367 | 10/2008 |
| JP | 4508278 B2 | 7/2010 |
| JP | 2011-040441 | 2/2011 |
| JP | 2012-014067 | 1/2012 |

OTHER PUBLICATIONS

Co-owned U.S. Appl. No. 16/449,472, filed Jun. 24, 2019; Mossberg et al; Phase-transforming optical element.

* cited by examiner

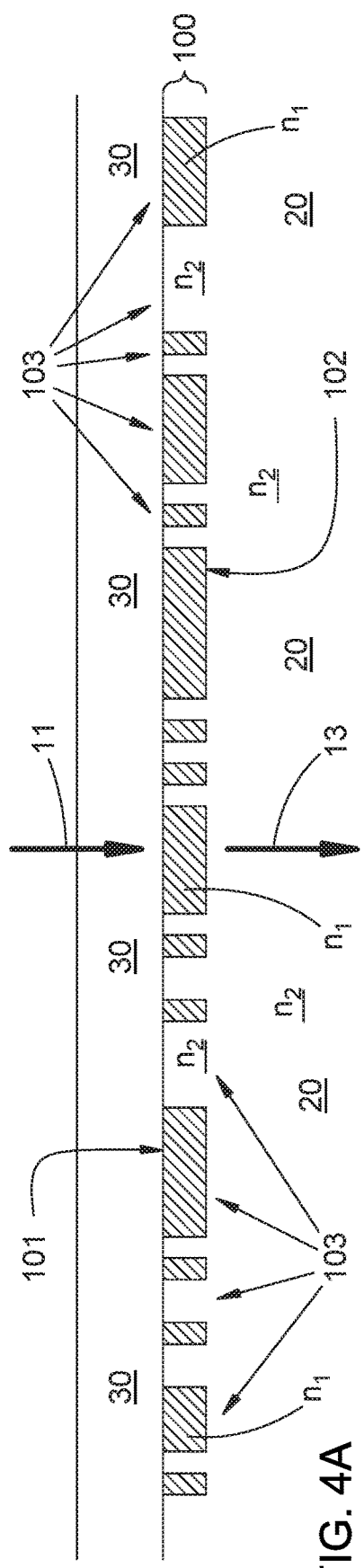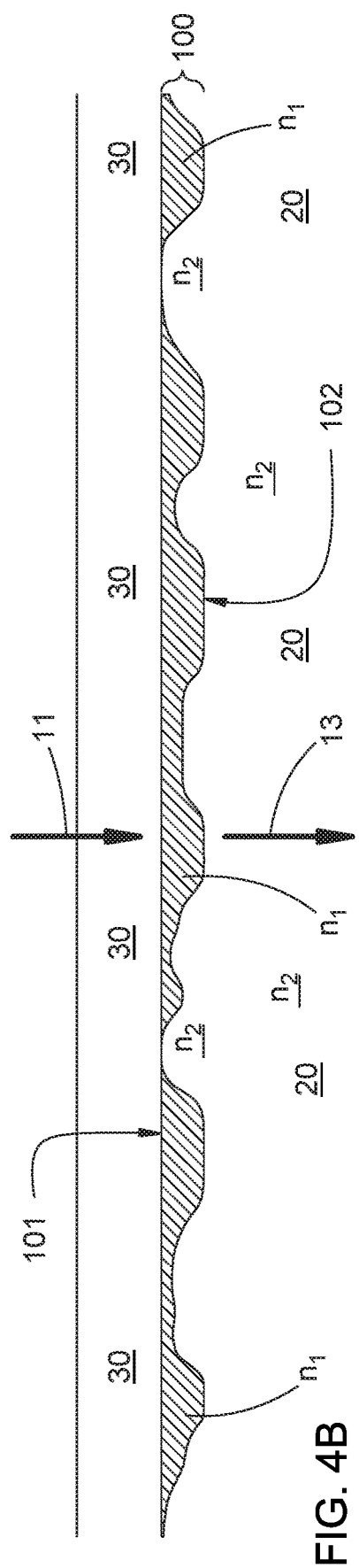

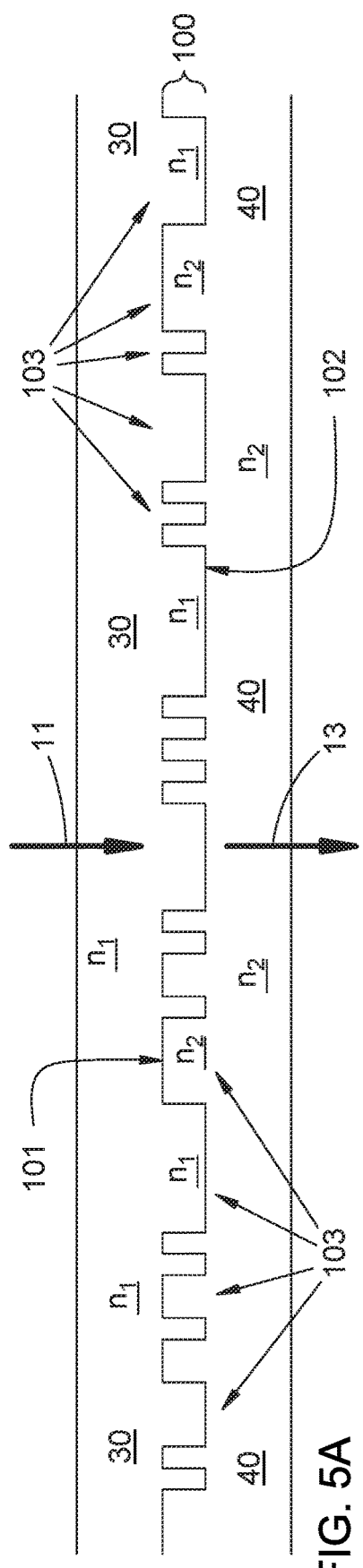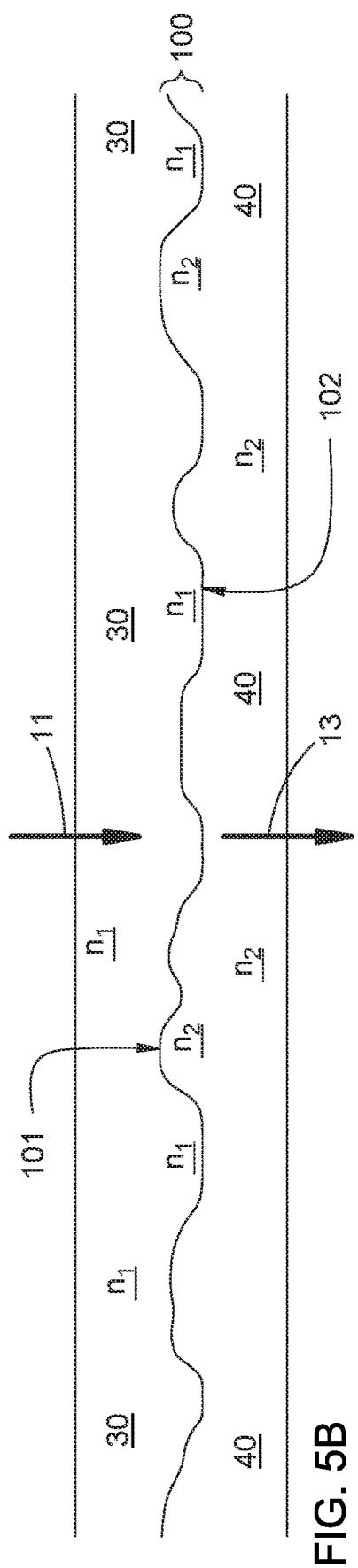

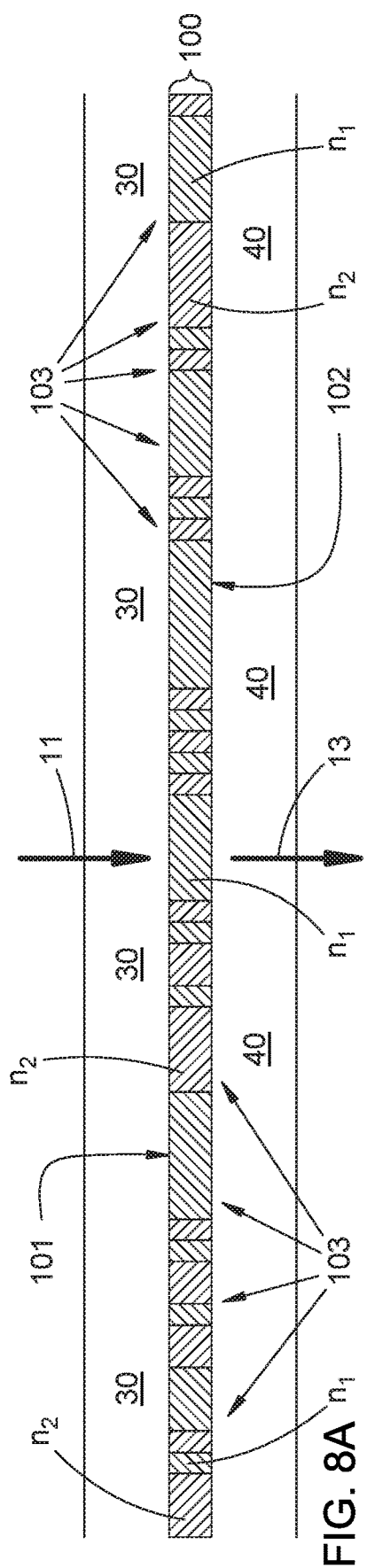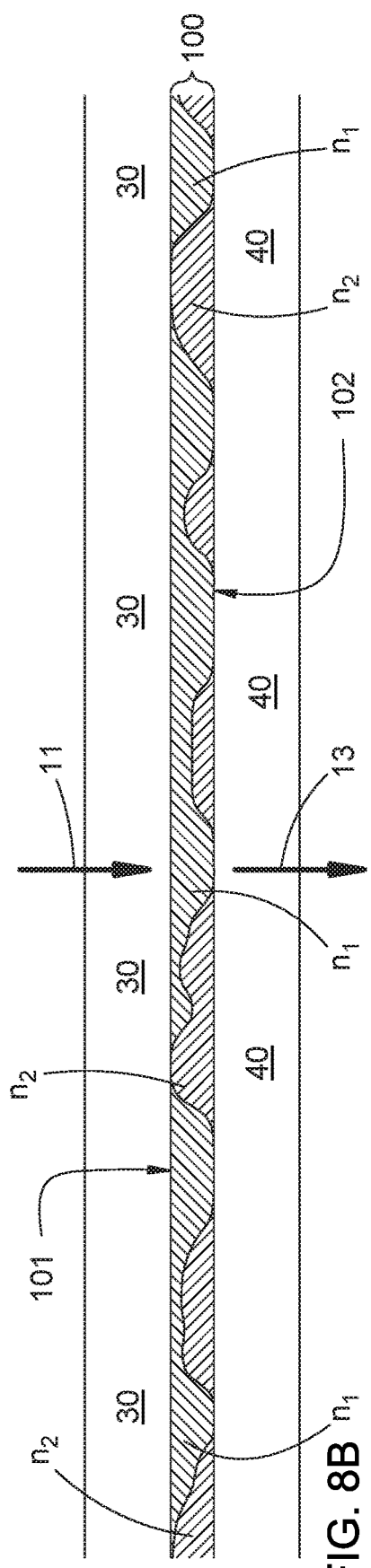

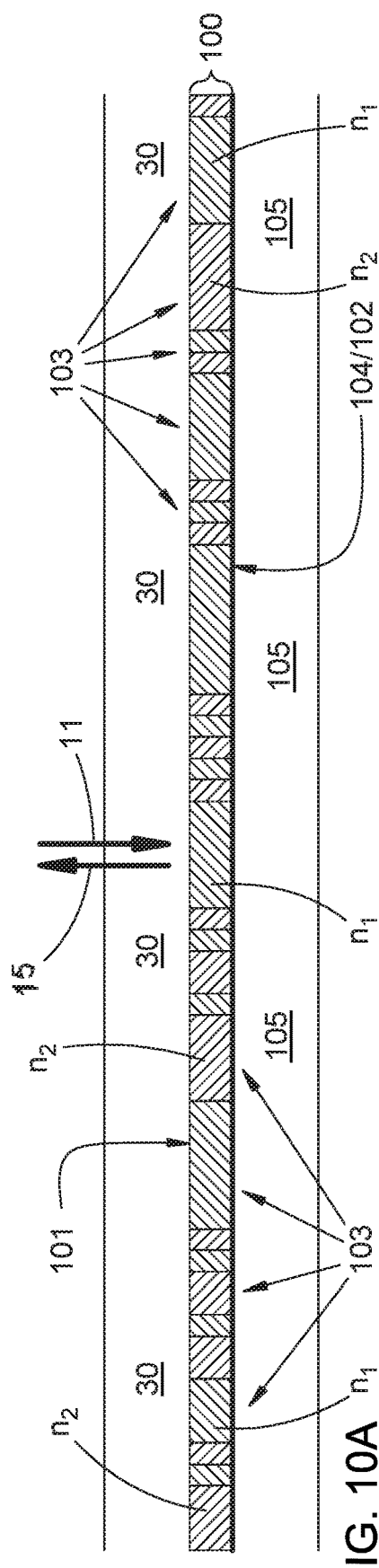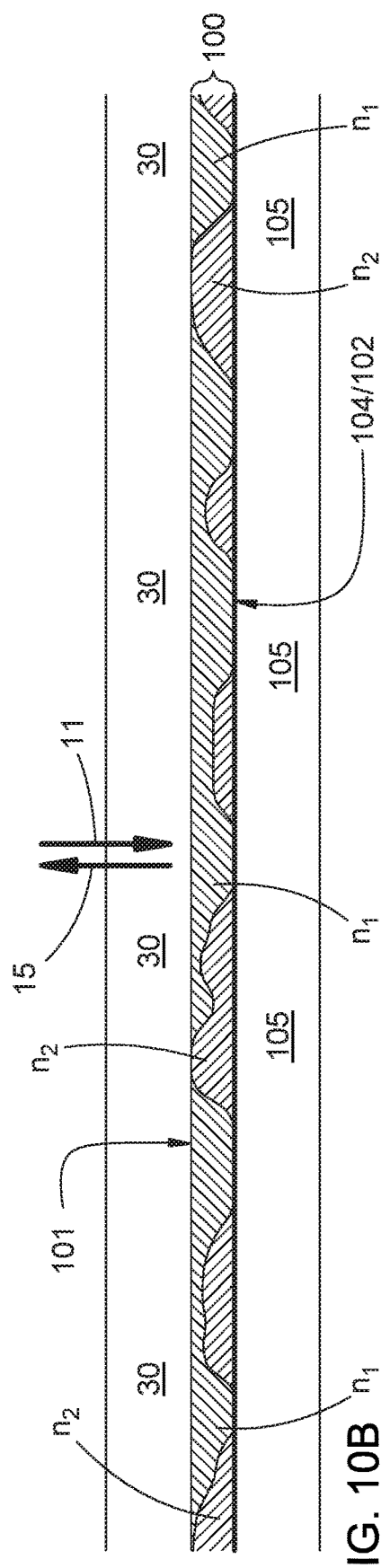

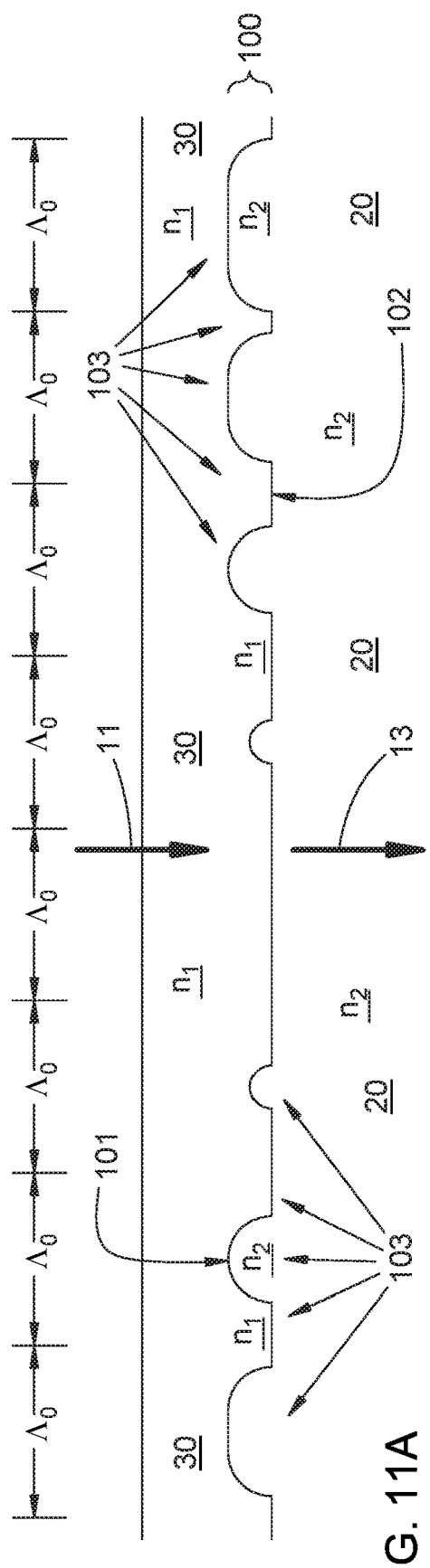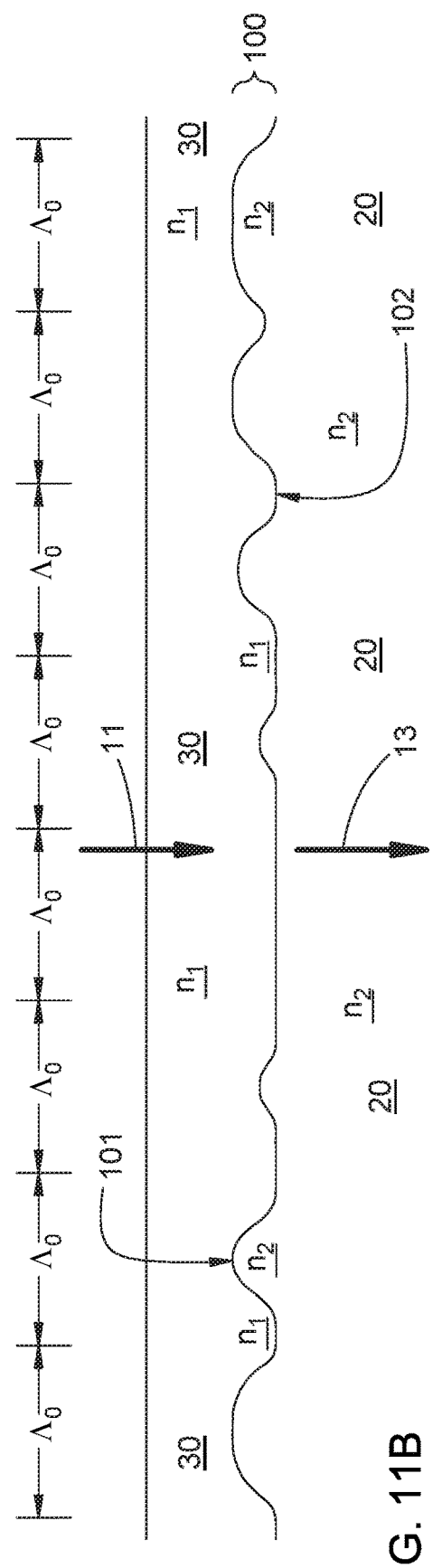

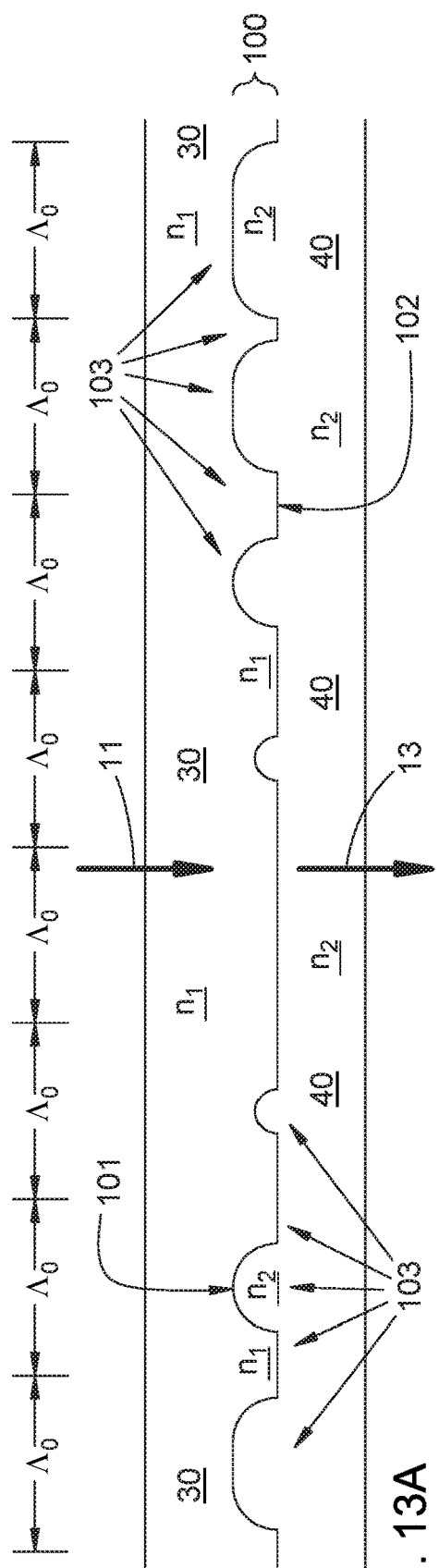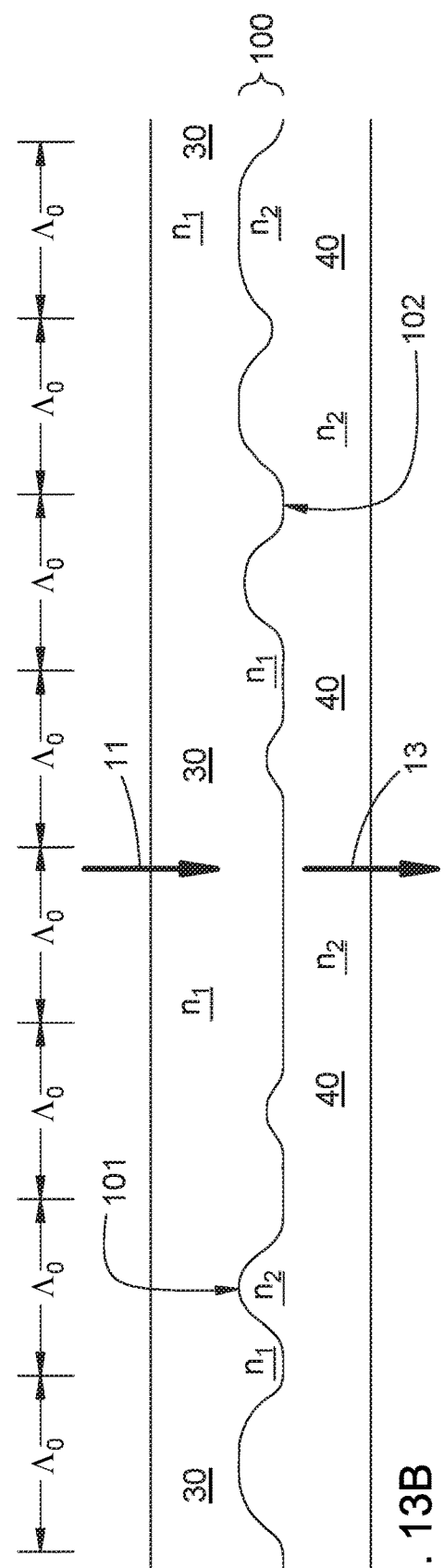

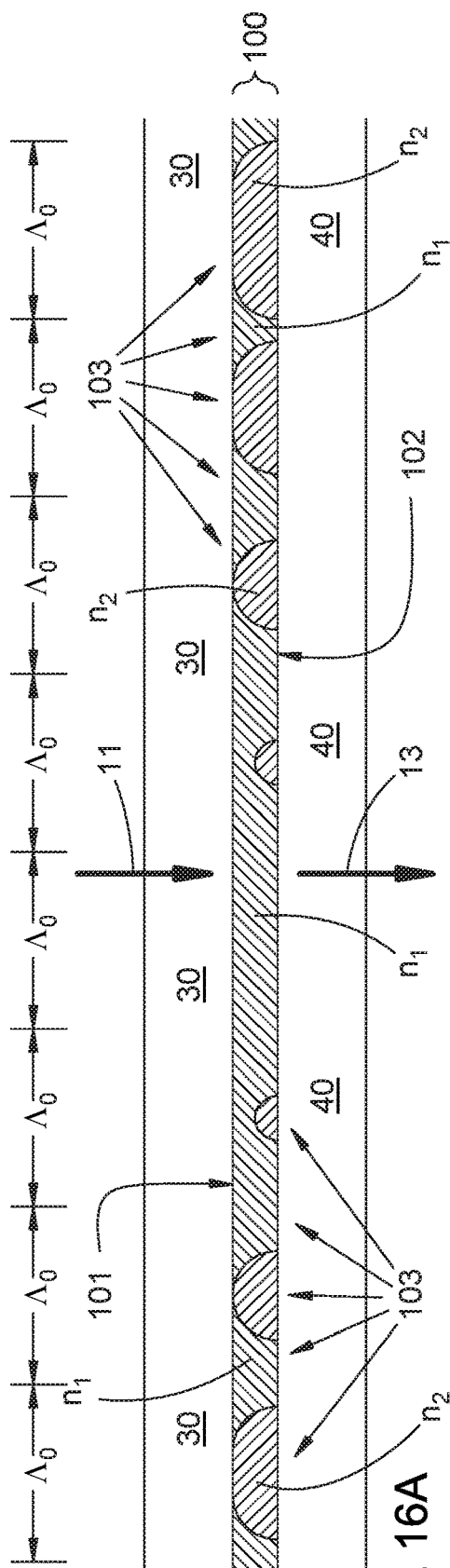
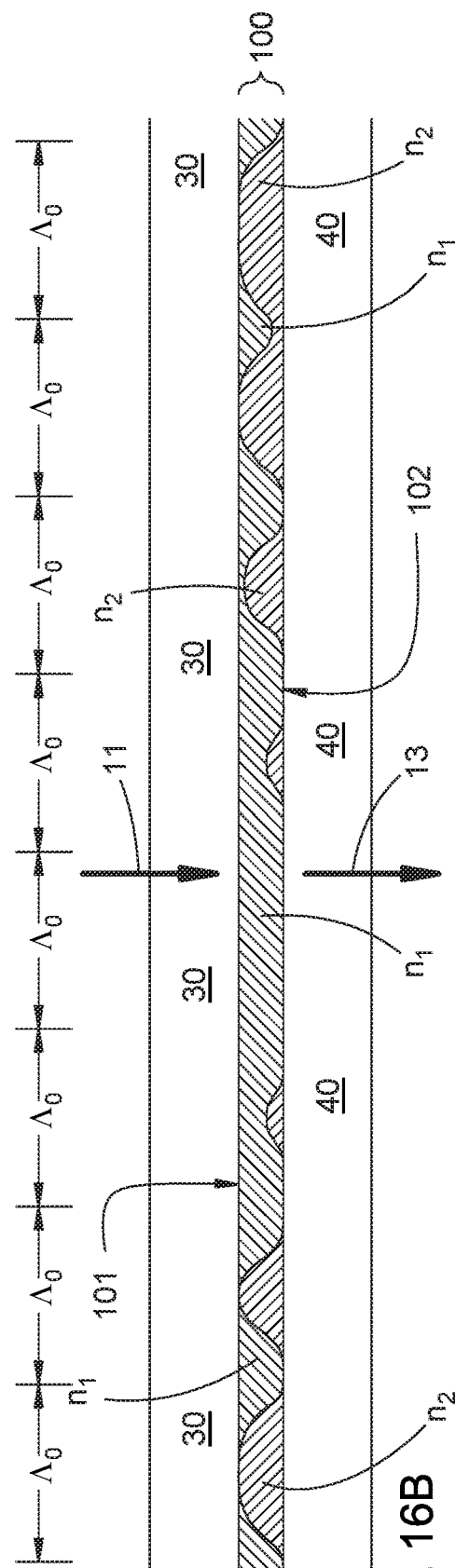
FIG. 16A
FIG. 16B

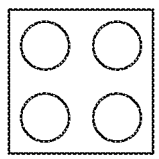 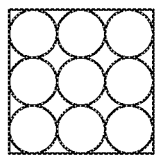 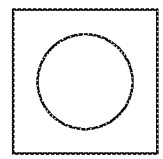 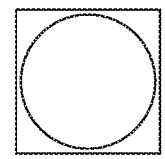
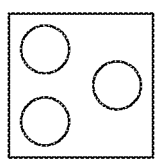 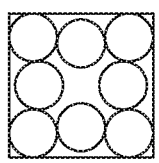 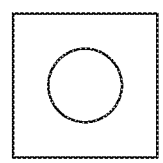 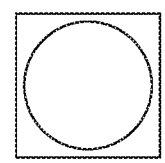
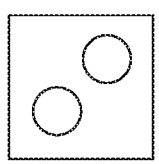 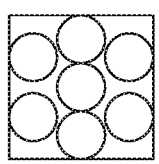 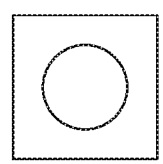 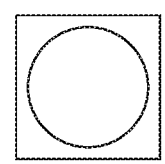
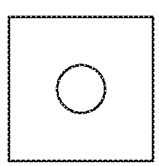 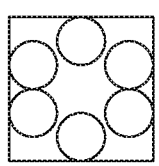 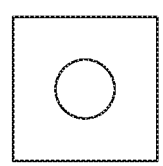 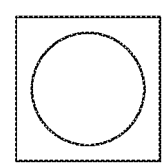
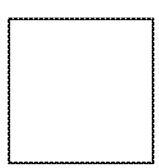 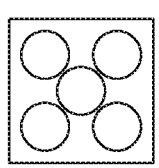 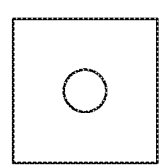 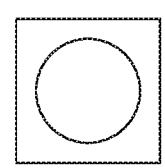
FIG. 19
FIG. 20

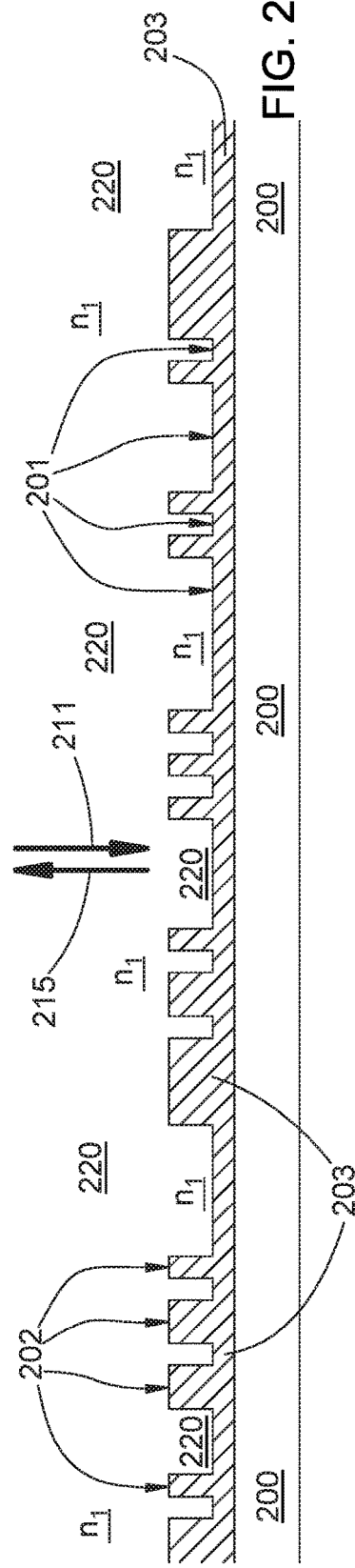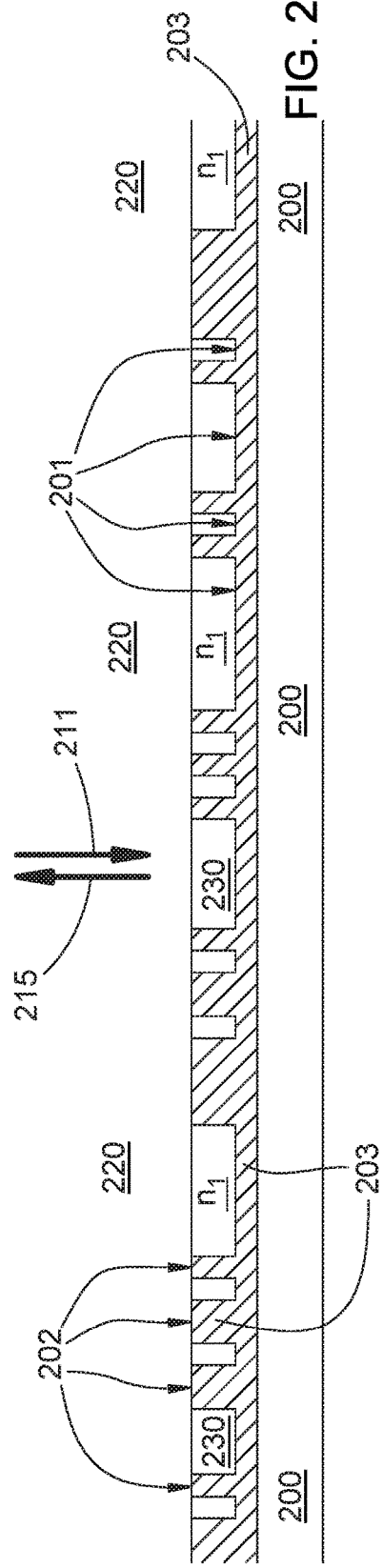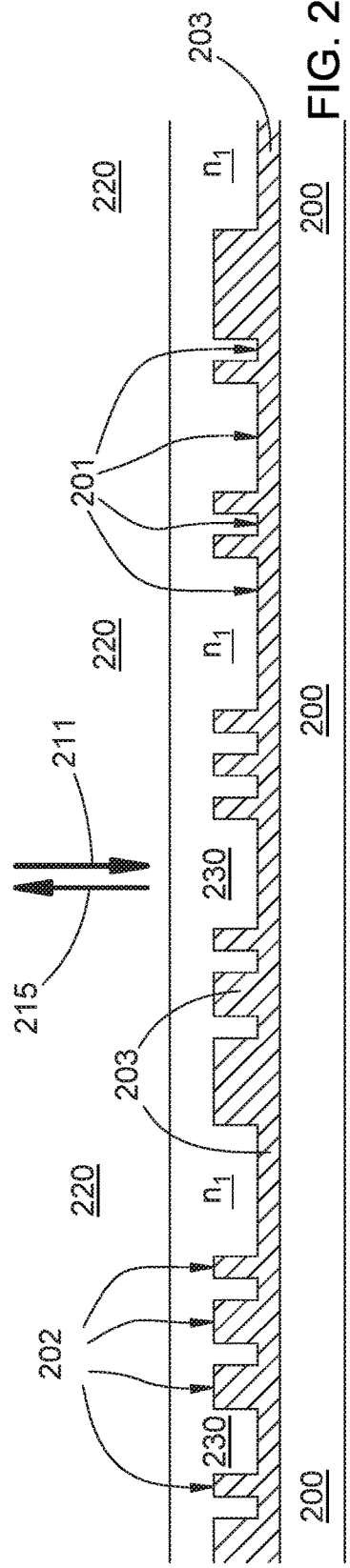

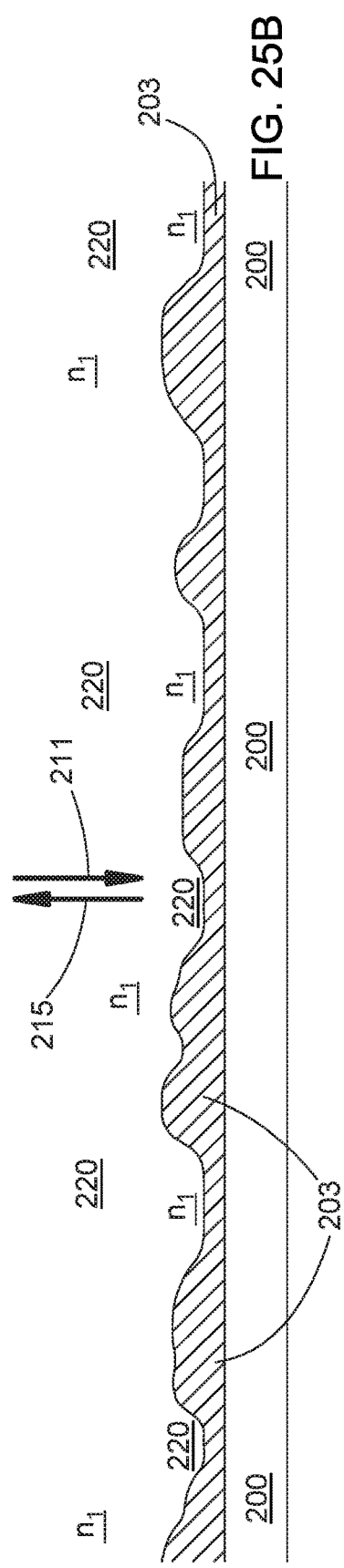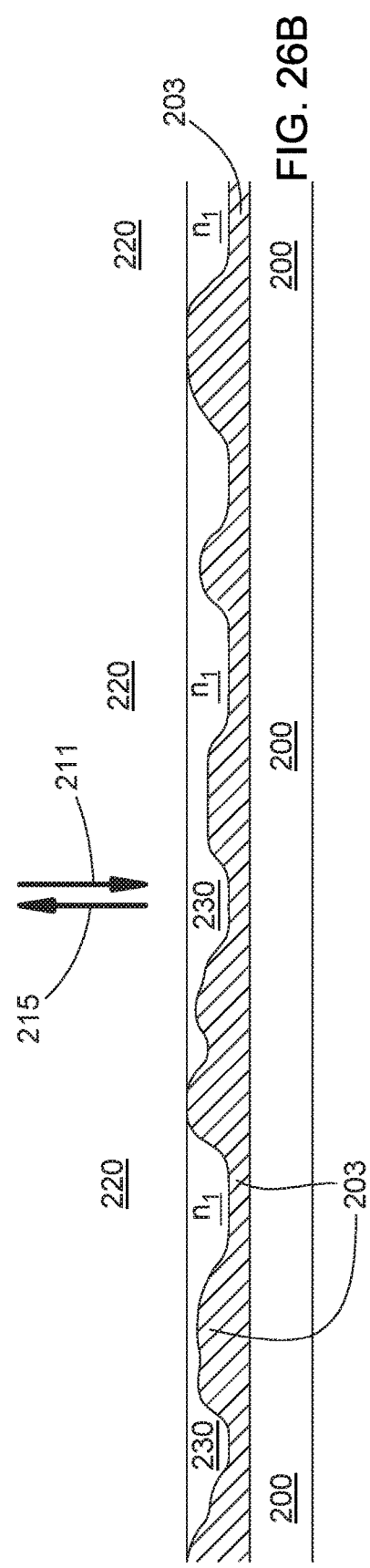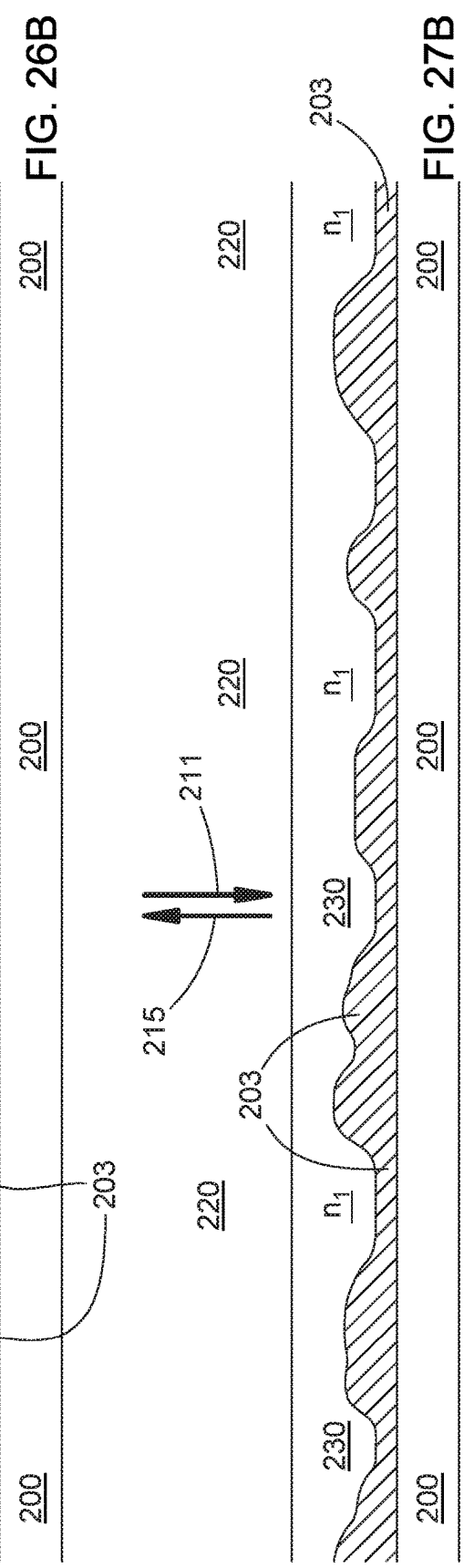

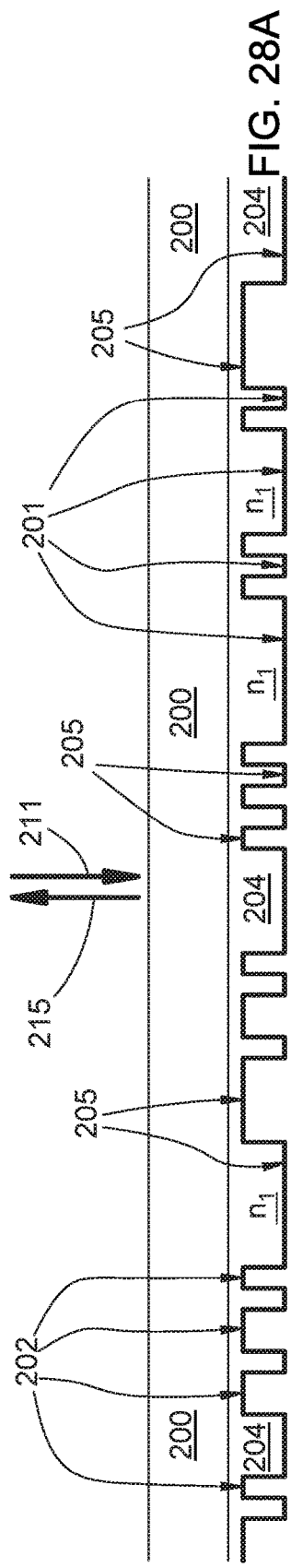
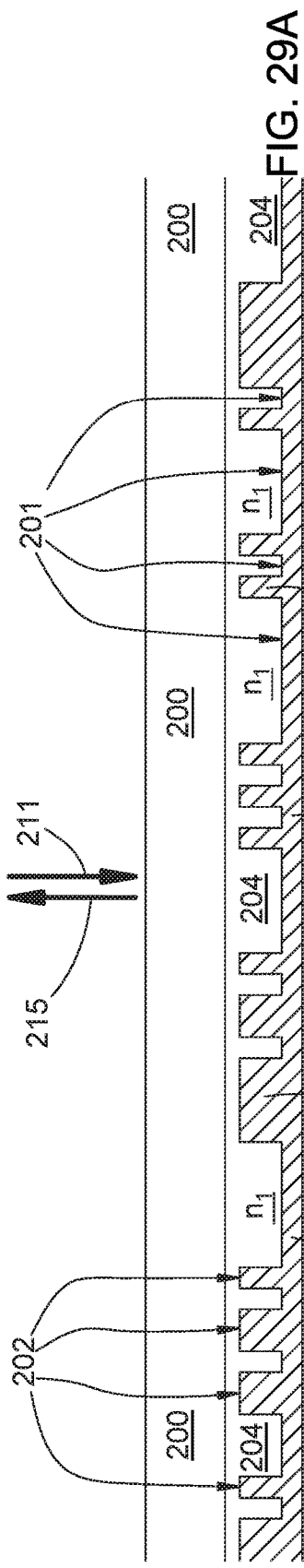
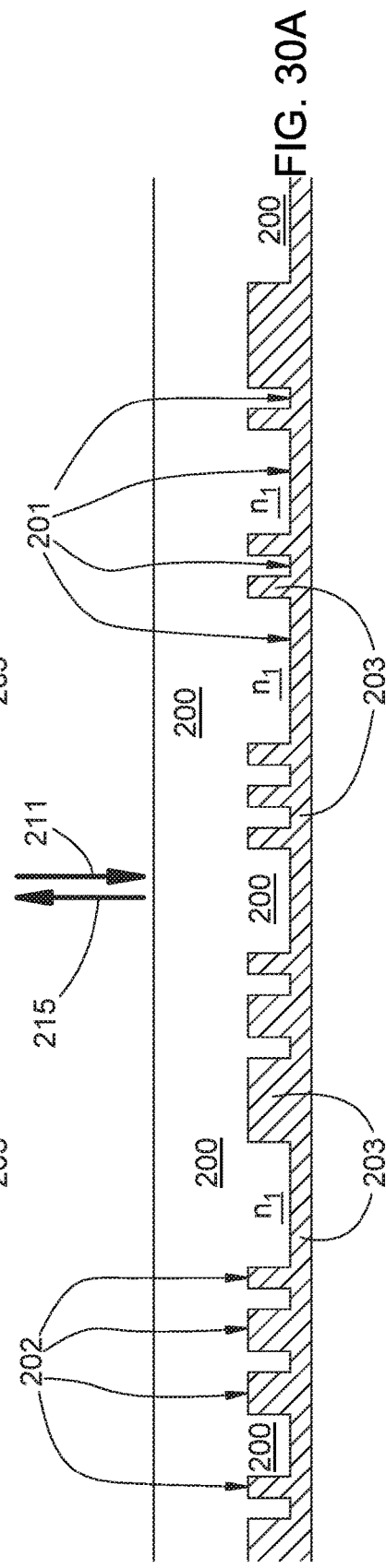

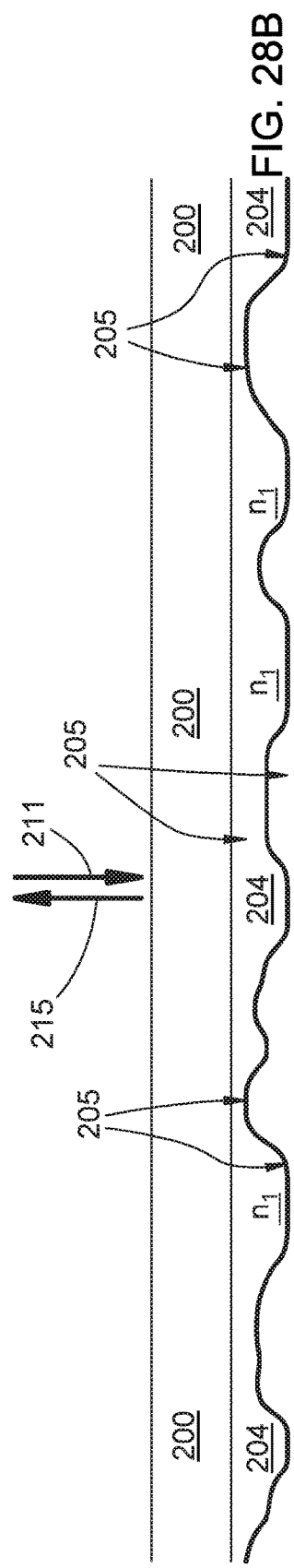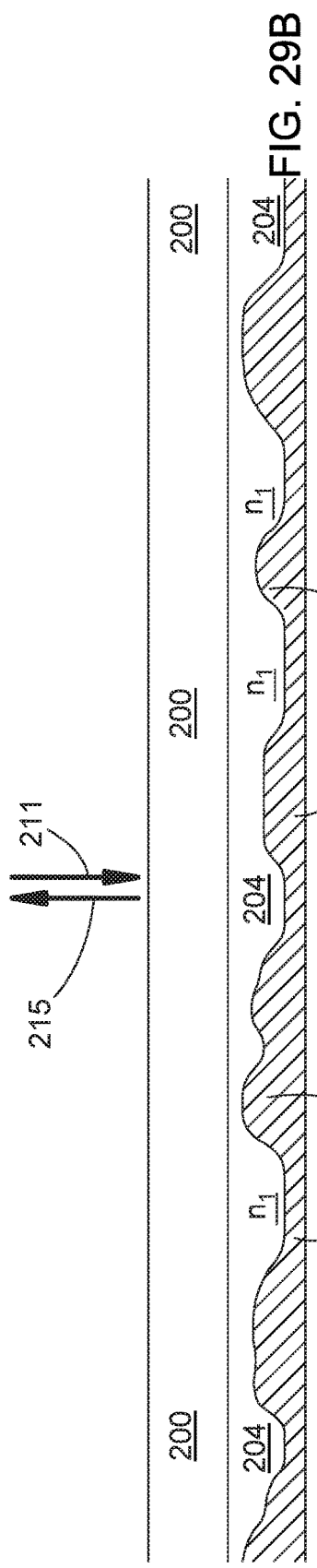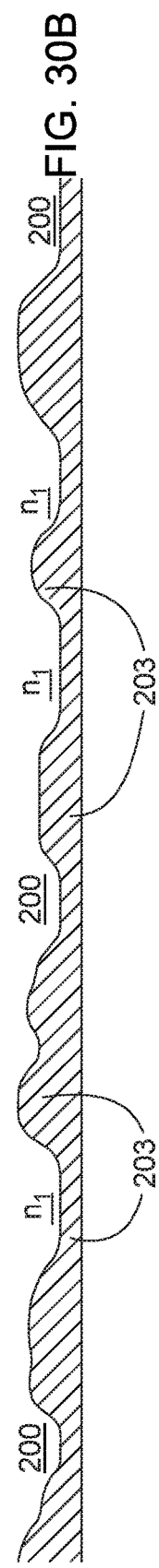

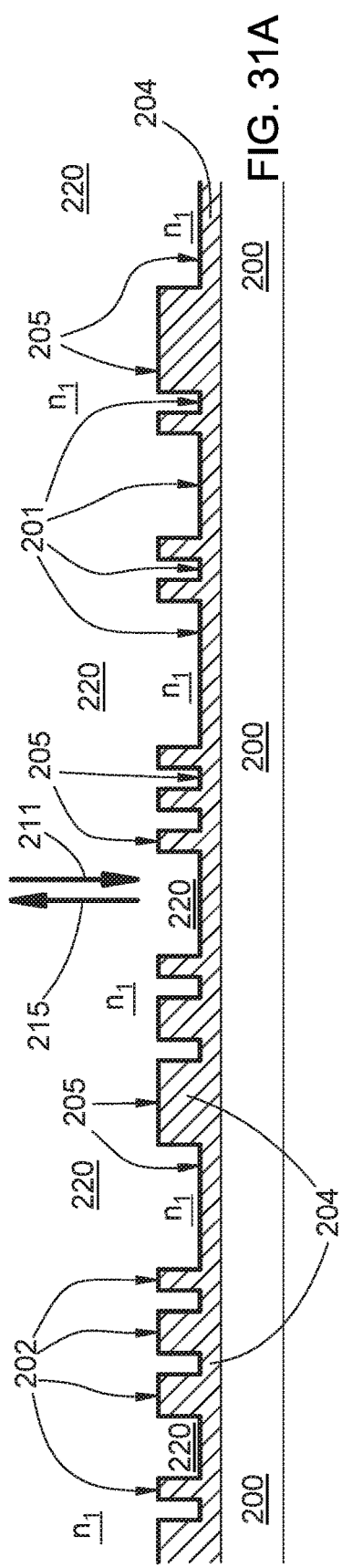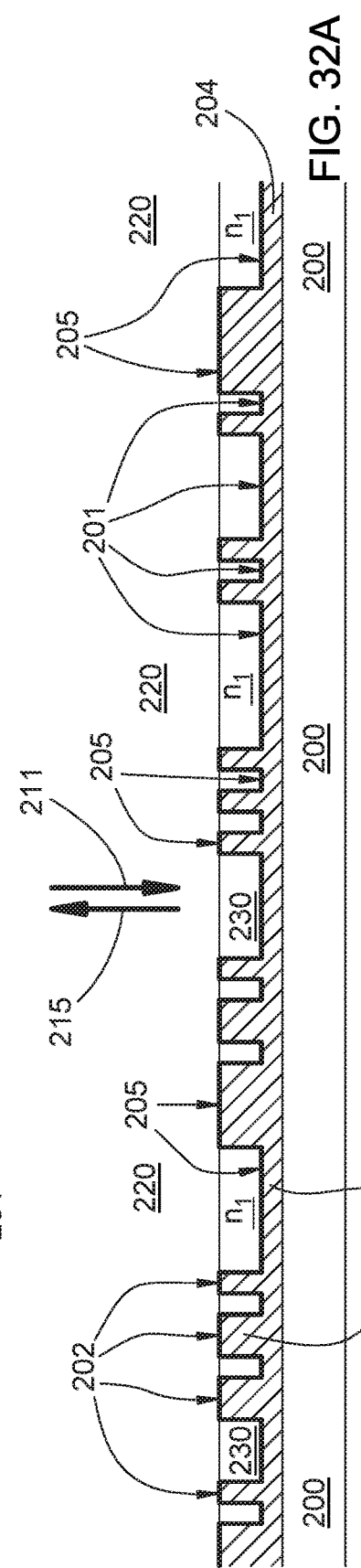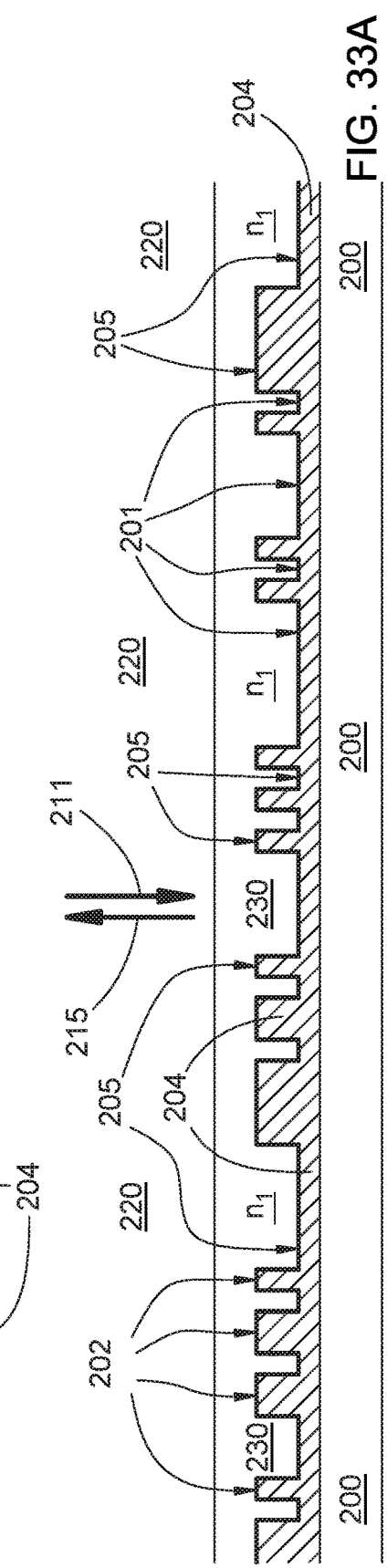

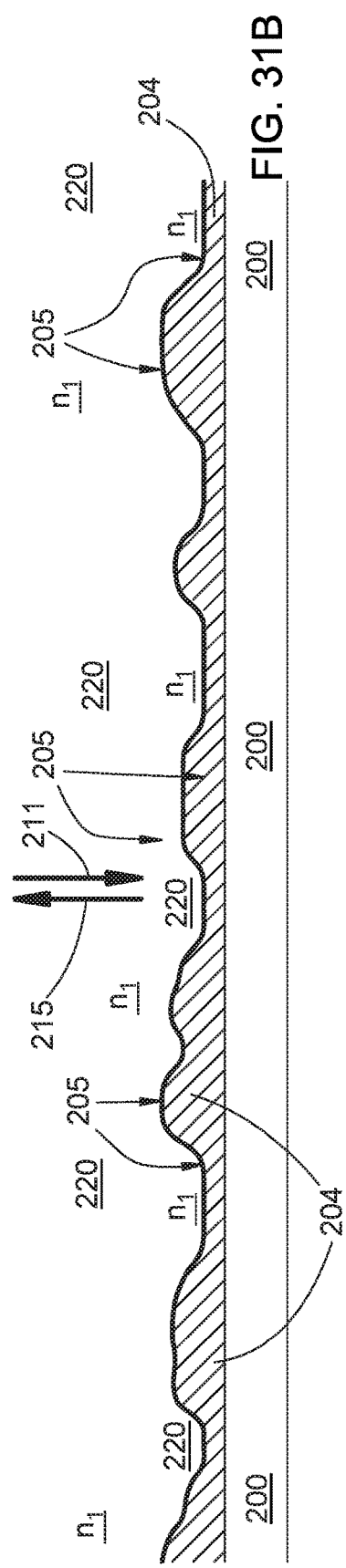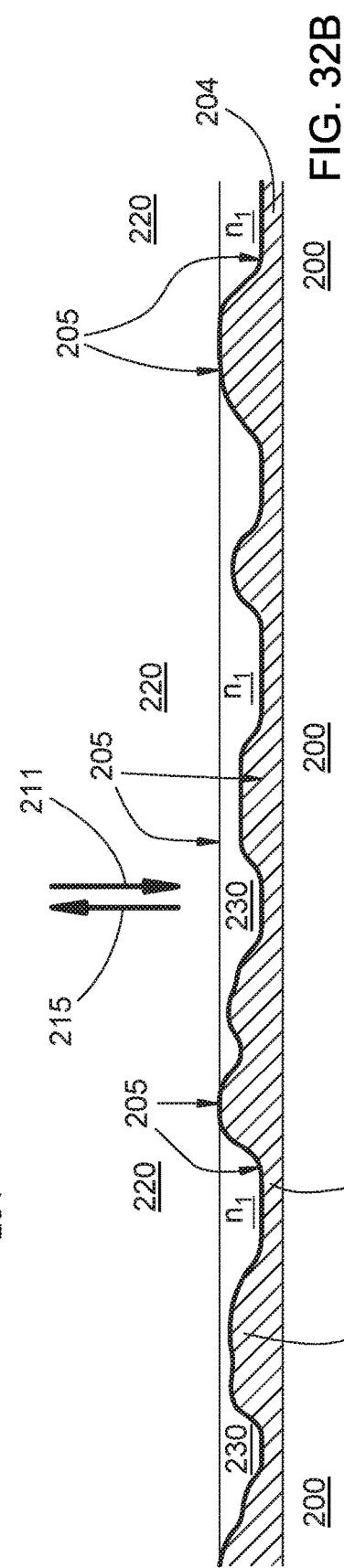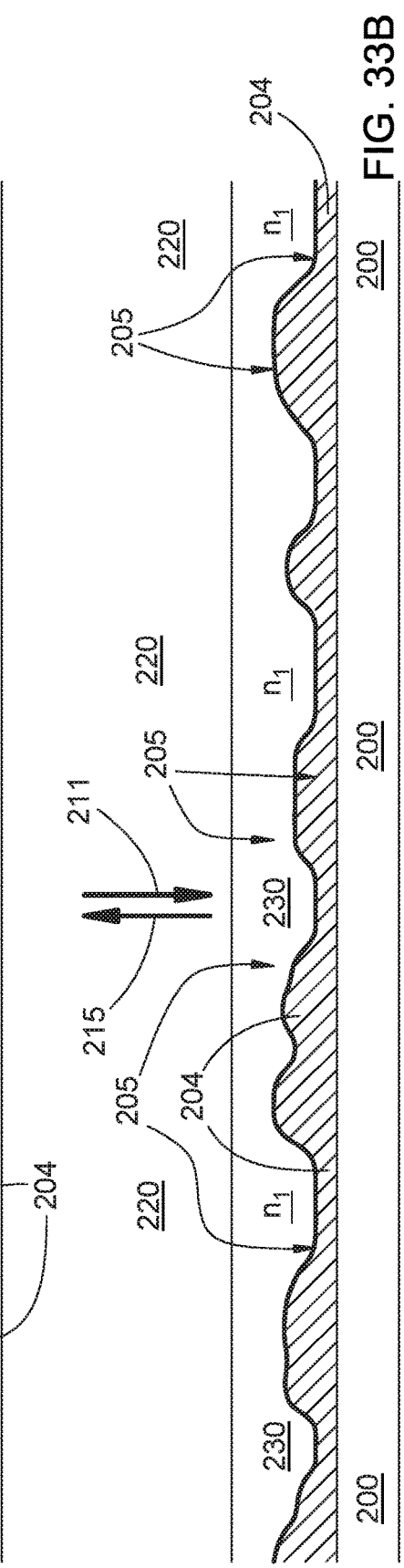

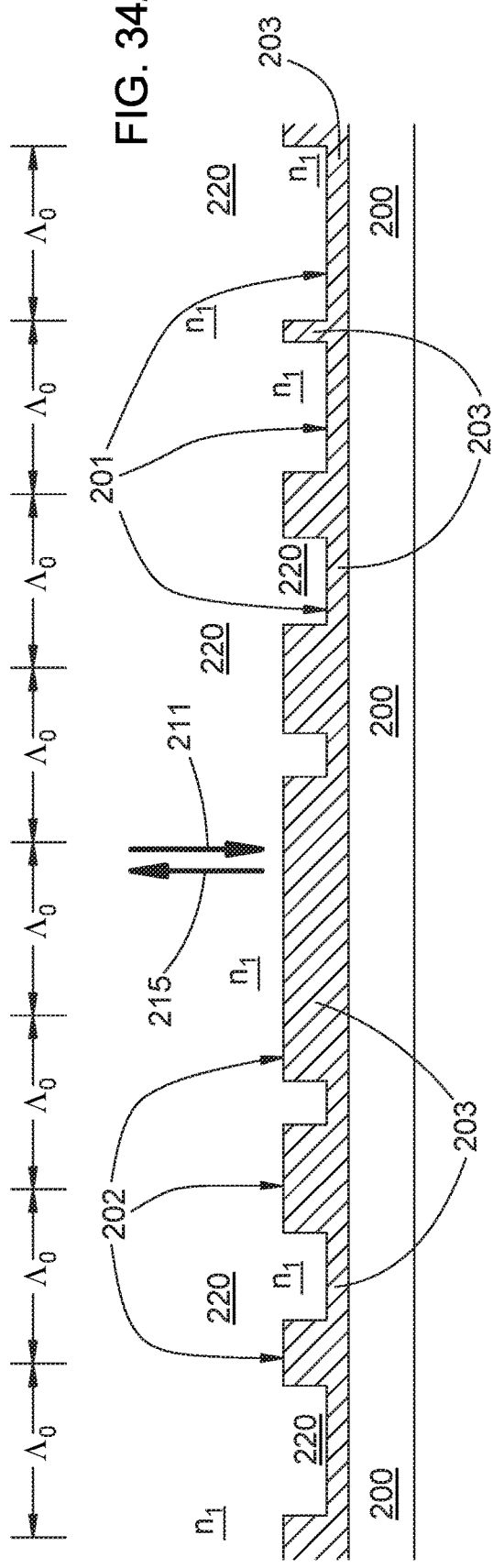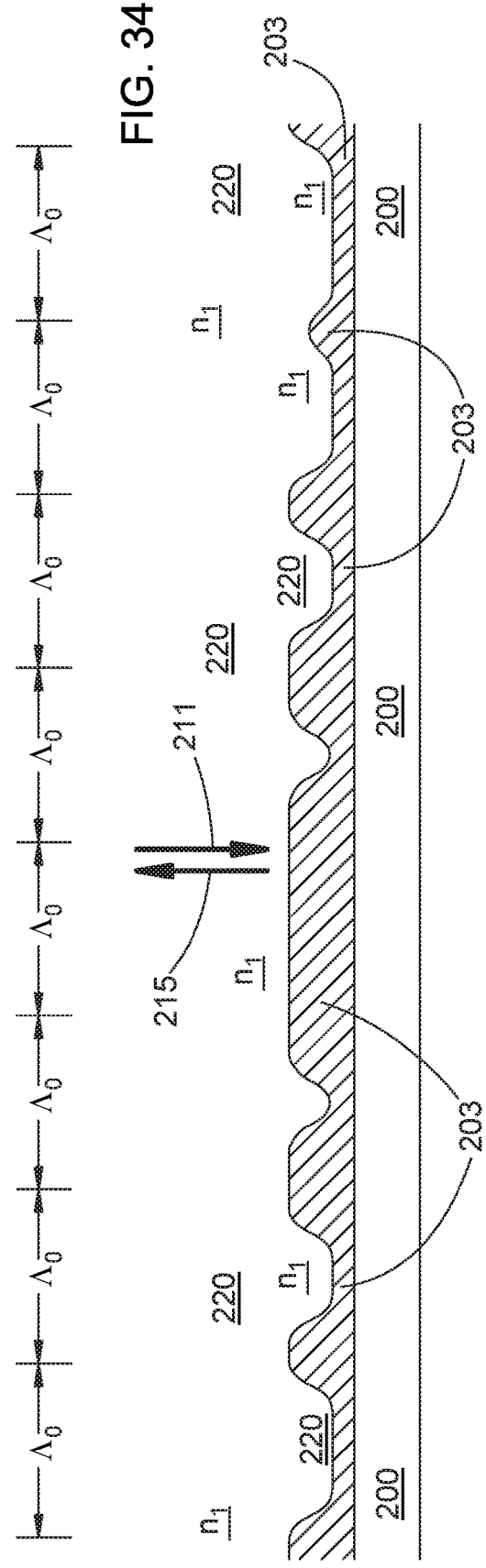

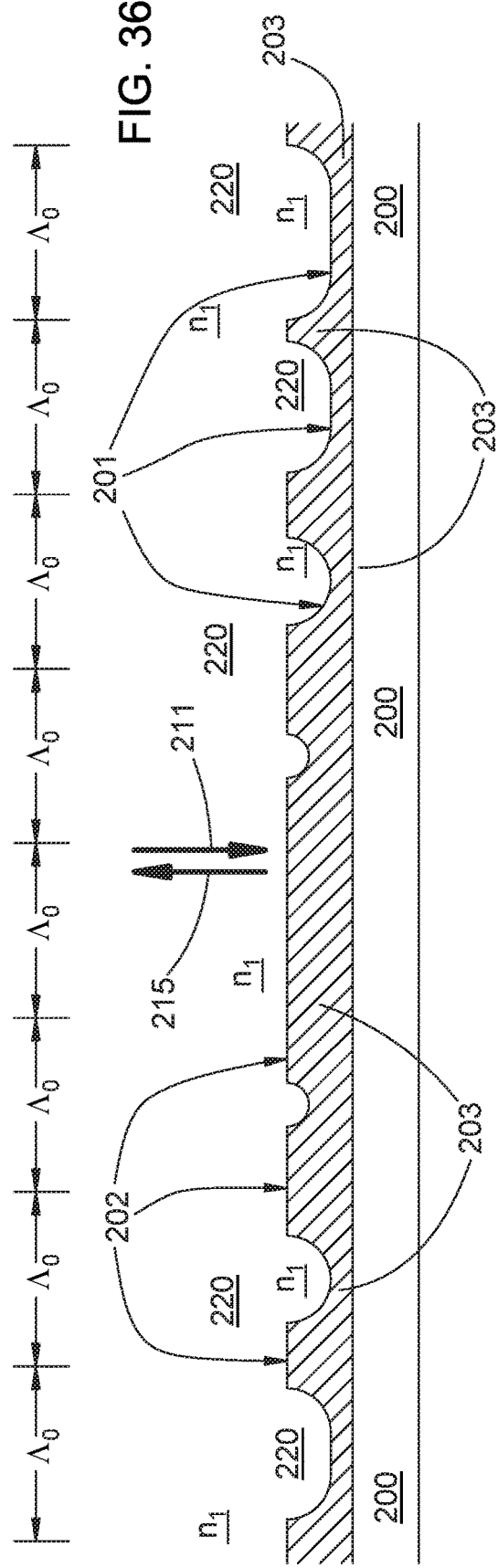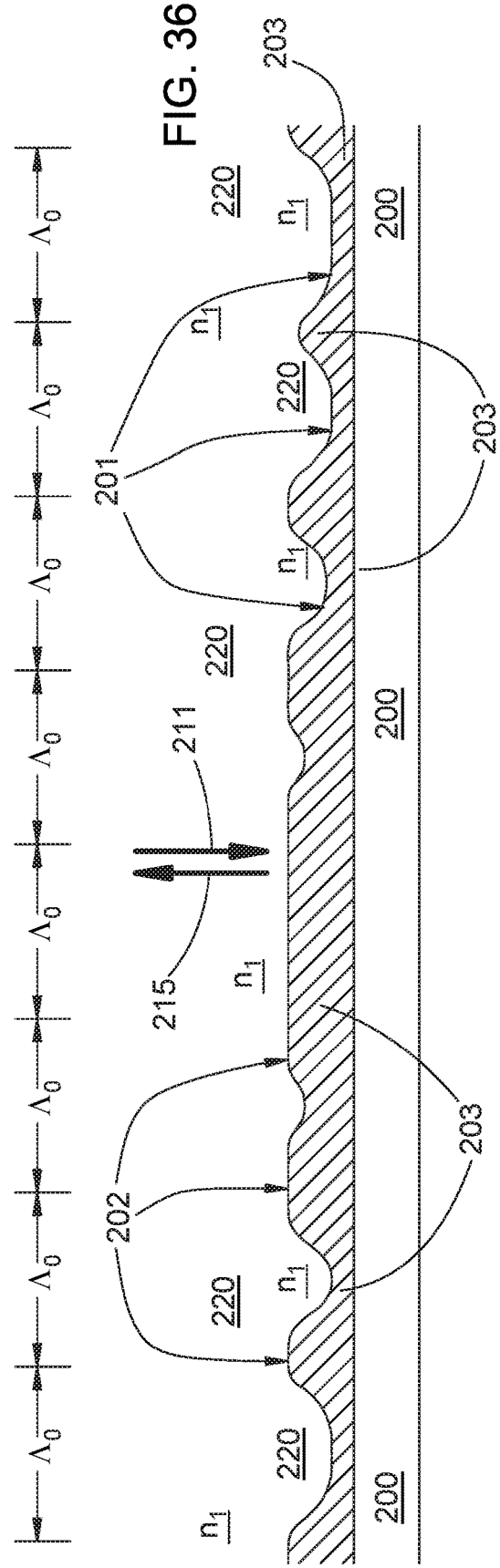

PHASE-TRANSFORMING OPTICAL ELEMENT FORMED BY PARTIAL ETCHING OR BY PARTIAL ETCHING WITH REFLOW

BENEFIT CLAIMS TO RELATED APPLICATIONS

This application is a divisional of U.S. non-provisional application Ser. No. 15/784,702 entitled "Phase-transforming optical reflector formed by partial etching or by partial etching with reflow" filed Oct. 16, 2017 in the names of Dmitri Iazikov, Thomas W. Mossberg, Christoph M. Greiner, and John H. Clark, which claims benefit of U.S. provisional App. No. 62/410,380 entitled "Partially etched phase-transforming optical reflector" filed Oct. 19, 2016 in the names of Dmitri Iazikov, Thomas W. Mossberg, Christoph M. Greiner, and John H. Clark, and U.S. provisional App. No. 62/507,776 entitled "Phase-transforming optical element formed by partial etching or by partial etching with reflow" filed May 17, 2017 in the names of Dmitri Iazikov, Thomas W. Mossberg, Christoph M. Greiner, and John H. Clark; each of said provisional and non-provisional applications is hereby incorporated by reference as if fully set forth herein.

FIELD OF THE INVENTION

The field of the present invention relates to phase-transforming optical elements. In particular, methods are disclosed for making such optical elements using partial etching or using partial etching with reflow.

SUMMARY

An optical element comprises a transmissive layer comprising first and second optical media. The first optical medium is a solid reflowed material; the second optical medium can be vacuum, gaseous, liquid, or solid, and if solid can be a reflowed material. The first and second optical media are arranged within the layer as a contiguous multitude of discrete volumes, including a non-empty subset of volumes of the multitude having a largest transverse dimension less than about $\lambda_0$; each discrete volume comprises either the first optical medium or the second optical medium, but not both. The optical element receives an incident optical signal and transmits or reflects at least a portion of the incident optical signal transformed substantially according to a specified effective phase transformation function $\varphi_{eff}(x,y)$. The effective phase transformation function $\varphi_{eff}(x,y)$ varies as a function of two-dimensional position coordinates x and y along the transmissive layer. The discrete volumes of the first and second optical media are variously sized and distributed on the transmissive layer so as to impart on the transmitted or reflected portion of the incident optical signal the effective phase transformation $\varphi_{eff}(x,y)$.

A method for making such an optical element comprises: (A) spatially selectively removing certain volumes of the first optical medium from a layer of the first optical medium; (B) heating the transmissive layer to cause at least partial reflow of the first optical medium; and (C) arranging the second optical medium to form a portion of the transmissive layer. After part (A) but before part (B), the first optical medium is arranged according to a local thickness $d_1(x,y)$ through the first optical medium. After part (B), the first optical medium is arranged according to a local thickness $d_{1R}(x,y)$ through the first optical medium; over at least a portion of the transmissive layer, $d_{1R}(x,y) \neq d_1(x,y)$. After part (C), the second optical medium is arranged according to a local thickness $d_{2R}(x,y)$ through the second optical medium. In some instances the second optical medium can be vacuum, gaseous, liquid, or solid, and can be arranged in the transmissive layer after the reflow of part (B). In some other instances the second optical medium is solid and is arranged in the transmissive layer before part (B) according to a local thickness $d_2(x,y)$ through the second optical medium; in such examples, the reflow of part (B) includes at least partial reflow of the second optical medium so that $d_{2R}(x,y) \neq d_2(x,y)$ over at least a portion of the transmissive layer. An iterative design, fabrication, and characterization process can be employed to make an optical element that imparts the specified effective phase transformation $\varphi_{eff}(x,y)$ to within a specified allowable phase error.

Objects and advantages pertaining to phase-transforming optical elements may become apparent upon referring to the example embodiments illustrated in the drawings and disclosed in the following written description or appended claims.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

BRIEF DESCRIPTION OF THE DRAWINGS

FIGS. 3A-8B illustrate schematically various examples of a single-pass-transmissive optical element.

FIGS. 9A-10B illustrate schematically various examples of a double-pass-reflective optical element.

FIGS. 11A-16B illustrate schematically various example unit cell arrangements of a single-pass-transmissive optical element.

FIGS. 19 and 20 illustrate schematically two example unit cell arrangements.

FIGS. 25A-33B illustrate schematically various examples of a surface-reflective optical element.

FIGS. 34A-37B illustrate schematically various example unit cell arrangements of a surface-reflective optical element.

Figure 1A:
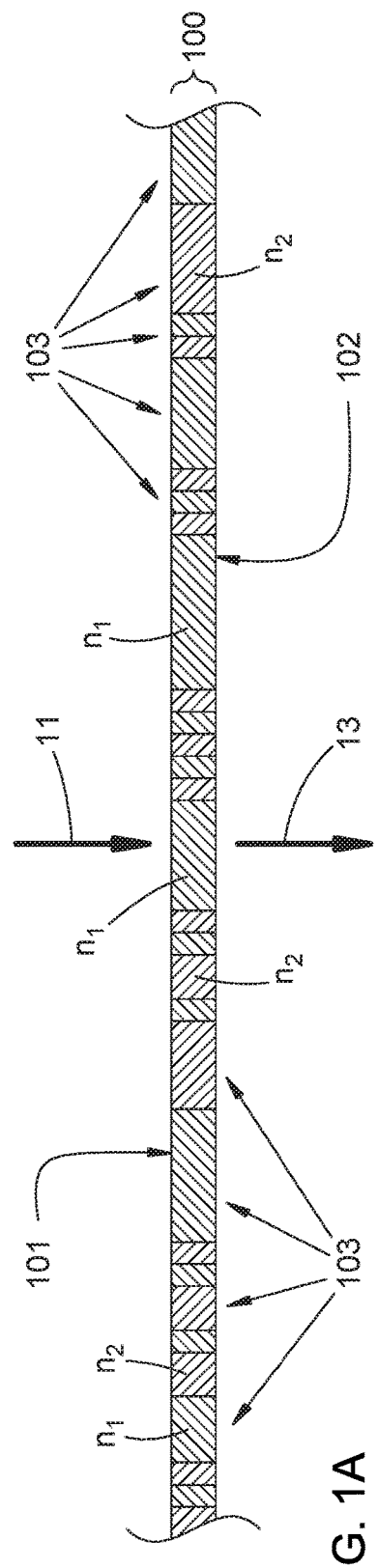
FIGS. 1A and 1B illustrate schematically a transmission layer of example transmissive and reflective optical elements, respectively.

The embodiments depicted are shown only schematically: all features may not be shown in full detail or in proper proportion, certain features or structures may be exaggerated relative to others for clarity, and the drawings should not be regarded as being to scale. For example, the actual optical elements depicted as having a handful of discrete areas or volumes might have thousands or millions of such areas or volumes per square millimeter; the number of such areas or volumes is reduced in the drawings for clarity. In addition, the height, depth, or width of each area or volume often can be exaggerated relative to, e.g., the thickness of an underlying substrate. The examples depicted all show normal incidence of an optical signal, however, the apparatus and methods disclosed herein can be employed with non-normal incidence of optical signals. The embodiments shown are only examples; they should not be construed as limiting the scope of the present disclosure or appended claims.

DETAILED DESCRIPTION OF EMBODIMENTS

The present application is related to subject matter disclosed in (i) U.S. non-provisional application. Ser. No. 14/687,882 filed Apr. 15, 2015 in the names of Mossberg et al (now U.S. Pat. No. 9,618,664), and (ii) U.S. provisional App. No. 62/410,380 filed Oct. 19, 2016 in the names of Iazikov et al. Each of said applications is incorporated by reference as if fully set forth herein.

Optical elements of various types can be described generally as imposing some desired phase transformation function $\varphi(x,y)$ onto an optical signal propagating through or reflected from the optical element (where x and y are two-dimensional position coordinates along a surface of the optical element in directions substantially transverse to the propagation direction of the optical signal). In some transmissive optical elements, the phase transformation is imparted by a single-pass transmission; in some reflective optical elements, the phase transformation is imparted by double-pass transmission with an intervening reflection; in some reflective optical elements, the phase transformation is imparted by surface reflection. Such a phase transformation function may also be referred to herein as a phase shift function, phase delay function, or phase function. Note that it is the relative phase delay across an optical signal wavefront that is relevant, not the absolute phase delay. One example of a phase transformation function is a linear phase transformation function of the form $\varphi(x,y)=Ax+By$, which results in angular deflection of the optical signal without otherwise altering its spatial properties (somewhat analogous to refraction, with the direction of deflection depending on the values of the constants A and B). A second example is a quadratic phase transformation function of the form $\varphi(x,y)=Ax^2+By^2$; $\varphi(x,y)$ written in this form assumes the coordinates x and y are centered with respect to $\varphi(x,y)$ and rotated to coincide with principal axes of $\varphi(x,y)$. A quadratic phase transformation acts as a positive or negative lens in the corresponding transverse dimension according to the signs of the constants A and B. If either A or B (but not both) is zero, then the phase transformation acts as a cylindrical lens (in the paraxial limit). If A=B, the phase transformation acts as a spherical lens (in the paraxial limit). A third example is an angular phase transformation function of the form $\varphi(x,y)=M\theta$ for $0 \leq \theta < 2\pi$, where $\theta$ is related to x and y by $\cos\theta = x/(x^2+y^2)^{1/2}$ and $\sin\theta = y/(x^2+y^2)^{1/2}$ and M is an integer. An angular phase transformation acts as a so-called vortex lens that can be used, e.g., to convert an optical beam with a Gaussian transverse profile into a beam with a doughnut-shaped transverse profile. Phase transformation functions are additive, i.e., a phase transformation function $\varphi(x,y)$ can be a sum of two (or more) distinct, specified, position-dependent phase transformation functions $\varphi_1(x,y)$ and $\varphi_2(x,y)$. In one such example, $\varphi_1(x,y)$ can be a quadratic function and $\varphi_2(x,y)$ can be an angular function; the sum $\varphi(x,y)$ can result in, e.g., focusing of a Gaussian beam while simultaneously converting it to a doughnut-shaped beam, thereby combining the functions of a spherical lens and a vortex lens in a single optical element.

A specified phase transformation function $\varphi(x,y)$ can be imposed by an optical element that imparts a position-dependent phase shift or phase delay onto a transmitted or reflected optical beam. For a transmissive layer 100 of a transmissive optical element (e.g., as in FIGS. 1A, 2, 3A-8B, and 11A-16B; referred to herein as single-pass-transmissive optical elements) comprising a set of one or more transmissive optical media, the phase transformation function $\varphi(x,y)$ for a given vacuum wavelength $\lambda$ can be generally approximated (for a transmitted optical signal at normal incidence) by $\varphi(x,y) \approx (2\pi/\lambda) \cdot \Sigma_i n_i(\lambda) \cdot d_i(x,y)$, where $n_i(\lambda)$ is the refractive index of each optical medium and $d_i(x,y)$ is the local thickness of each optical medium through which the signal propagates. A similar approximation can be calculated for non-normal incidence. Assuming back-surface reflection for a reflective optical element that includes such a transmissive layer 100 (e.g., as in FIGS. 1B, 9A-10B and 17A-18B; referred to herein as double-pass-reflective optical elements), the phase transformation function $\varphi(x,y)$ at normal incidence can be approximated by $\varphi(x,y) \approx (4\pi/\lambda) \cdot \Sigma_i n_i(\lambda) \cdot d_i(x,y)$ because the optical signal propagates through the optical media twice. A similar approximation can be calculated for non-normal incidence. In some other examples of a reflective optical element that includes a reflective surface with multiple recessed and non-recessed areas, those areas can be characterized by a depth function $d(x,y)$ that equals zero in the non-recessed areas and that assumes non-zero values up to a maximum depth $D_R$ in the recessed areas (e.g., as in the examples of FIGS. 25A-37B; referred to herein as surface-reflective optical elements). In some of those examples, the recessed regions can all have a uniform depth $D_R$ (i.e., the depth function $d(x,y)$ equals zero in the non-recessed areas and equals $D_R$ in the recessed areas). The phase transformation effected by reflection from such a reflective surface at normal incidence can be approximated by $\varphi(x,y) \approx (4\pi/\lambda) \cdot n_1(\lambda) \cdot d(x,y)$, where $n_1(\lambda)$ is the bulk refractive index of the medium filling the recessed areas (vacuum, gas, liquid, or solid). A similar approximation can be calculated for non-normal incidence.

In a singlet refractive lens, a single optical medium is employed and the thickness varies with respect to transverse position. In so-called gradient-index elements (e.g., a GRIN lens), the refractive index varies with transverse position. Certain phase transformation profiles are relatively easy to produce by standard manufacturing techniques. Spherical lenses, for example, provide a quadratic phase transformation (in the paraxial limit) and are easily manufactured; GRIN lenses can be readily manufactured from segments of optical fiber. Other more arbitrary phase transformation functions $\varphi(x,y)$ are not necessarily quite so readily produced. It would be desirable to produce an optical element having an arbitrarily specified phase transformation function $\varphi(x,y)$.

Figure 21:
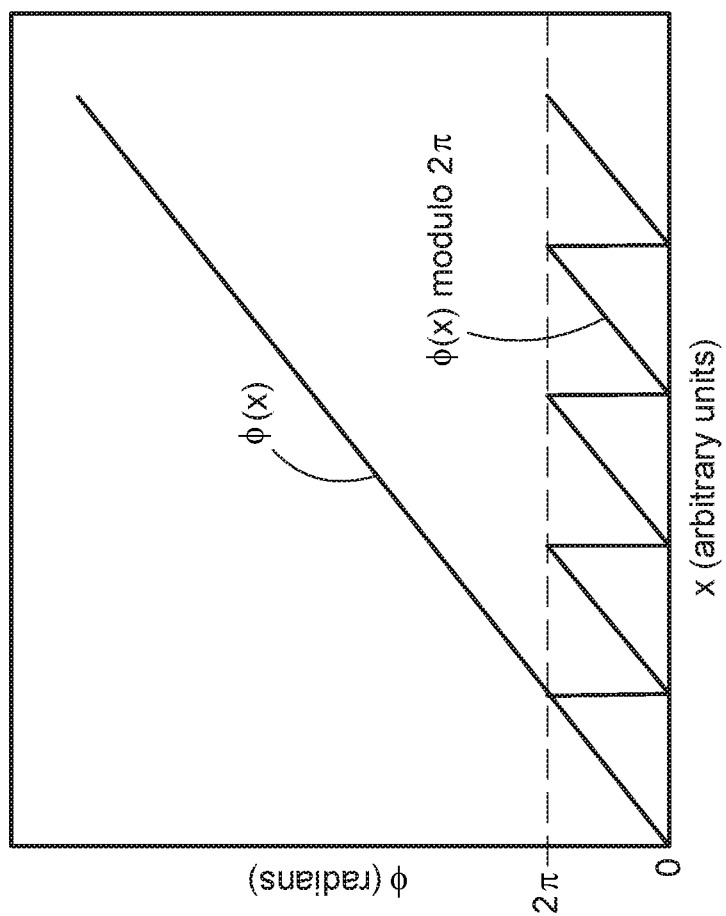
FIGS. 21 and 22 are plots of two example phase functions and their modulo $2\pi$ equivalents.
Figure 22:
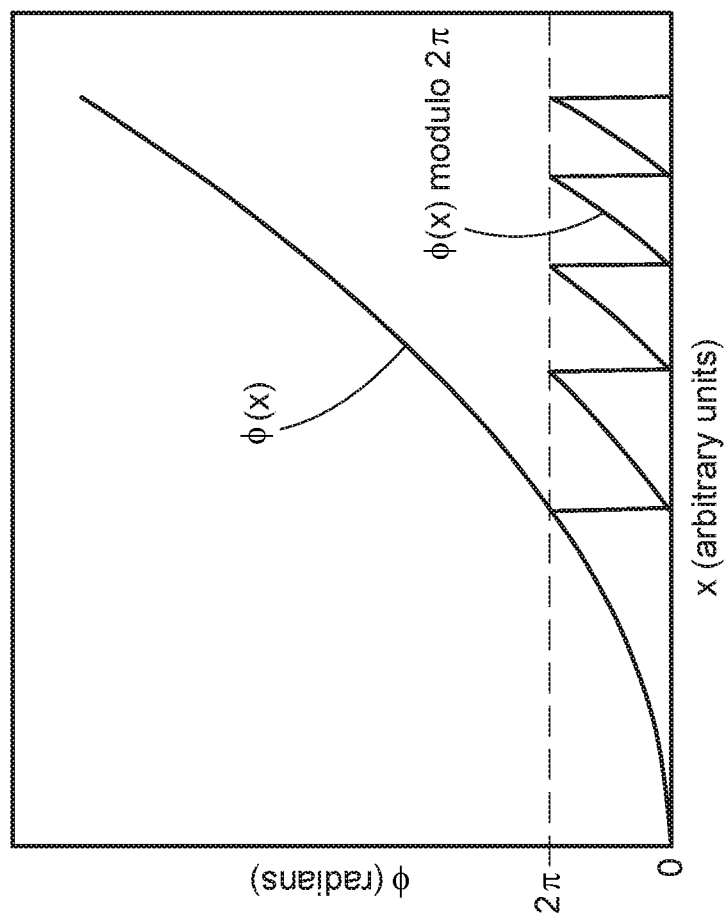

Because of the periodic nature of optical signals, phase delays separated by integer multiples of $2\pi$ all have the same effect on the optical signal. Because of the periodicity, any given phase transformation function can be replaced with an equivalent modulo $2\pi$ function, i.e., each function value can be replaced by the corresponding value from 0 to $2\pi$ that differs from the original value by an integer multiple of $2\pi$. The original phase function and its modulo $2\pi$ equivalent effect the same transformation on an optical signal. Illustrative examples are shown in FIG. 21 (showing a linear phase shift function $\varphi(x)$ and its modulo $2\pi$ equivalent) and FIG. 22 (showing a quadratic phase shift function $\varphi(x)$ and its modulo $2\pi$ equivalent). In addition, phase transformation functions that differ from one another at any given point by an integer multiple of 2π (and not necessarily the same multiple of 2π at each point) can be regarded as being equal to one another.

Spatially selective material processing techniques, e.g., photolithography or e-beam lithography, can in principle be employed to produce an optical element that imparts a specified, arbitrary phase transformation function φ(x,y). However, most such techniques are best suited for forming a spatial profile having only two levels, (e.g., a given area can be etched or not, photo-exposed or not, doped or not) and so are not so readily employed to provide an arbitrary phase transformation function with a continuous (or near continuous) relative phase distribution. Grayscale or multi-level lithography techniques can produce an optical element that imparts a continuous, arbitrary phase function, but such techniques are far more complex and are difficult to implement at production scales. It would be more desirable to enable use of a two-level lithographic technique (i.e., binary lithography) to produce such optical elements. Reflow of one or more of the lithographically patterned materials can then be employed in some instances to alter further the spatial profile of the reflowed material. Inventive optical elements disclosed herein are formed using binary lithographic techniques, and in some instances followed by reflow, to impart a specified, arbitrary phase transformation function, or at least an operationally acceptable approximation thereof. In the context of the instant specification and appended claims, the phrase operationally acceptable indicates a condition or arrangement that deviates from an ideal condition or arrangement by an amount that still enables the optical device to perform adequately in a given operational context. For example, a conventional singlet lens that deviates from an ideal spherical surface by as much as $\lambda/4$ might be sufficient for some imaging applications, while other imaging applications might require more stringent surface accuracy, e.g., $\lambda/10$ or $\lambda/20$.

In any of the disclosed arrangements (single-pass transmission, double-pass reflection, or surface reflection), the actual phase shift that results depend, inter alia, on the angle of incidence, the wavelength of the incident optical signal, and on the details of the spatial variation of the functions $d_i(x,y)$ or $d(x,y)$. Given a desired phase transformation φ(x,y), an initial estimate of the functions $d_i(x,y)$ or $d(x,y)$ can be calculated. In many examples, however, an iterative design/fabrication/measurement process can be advantageously employed to find functions $d_i(x,y)$ or $d(x,y)$ that yield an optical element that provides an effective phase transformation $\varphi_{\mathit{eff}}(x,y)$ that exhibits acceptably small (i.e., operationally acceptable) phase error relative to the designed phase transformation φ(x,y). The functions $d_i(x,y)$ or $d(x,y)$ that result from such an iterative process can differ from those calculated based on φ(x,y).

Figure 1B:
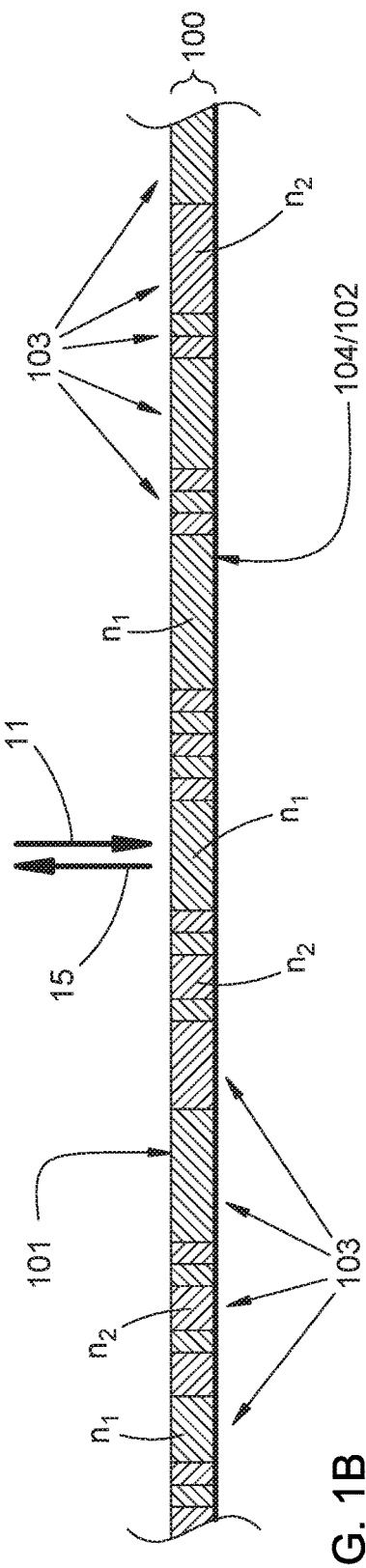

Some examples of an inventive optical element 10 comprises a transmissive layer 100, illustrated schematically in FIGS. 1A and 1B, that comprises first and second transmissive optical media. The first and second optical media are substantially transparent over an operational wavelength range that includes a design vacuum wavelength $\lambda_0$ and are characterized by differing respective first and second wavelength-dependent bulk refractive indices $n_1(\lambda)$ and $n_2(\lambda)$. The first optical medium comprises a substantially solid material (amorphous, crystalline, or polycrystalline), e.g., one or more of a doped or undoped dielectric material, a doped or undoped semiconductor material, or a doped or undoped polymer. In some examples, the second optical medium can comprise vacuum, air, one or more inert gases, or other substantially transparent gaseous or liquid material; in other examples, the second optical medium can comprise a solid material, including those example materials listed above for the first optical medium. The first and second optical media are arranged within the layer 100 as a multitude of discrete, contiguous volumes 103, wherein each volume comprises either the first optical medium or the second optical medium, but not both.

A non-empty subset of the volumes 103 of the multitude have transverse dimensions (i.e., dimensions parallel to the transmissive layer 100) that are less than about $\lambda_0$ (i.e., a non-empty subset of the volumes 103 are sub-wavelength features of the transmissive layer 100). The multitude of discrete volumes 103 can be arranged so that any given simply connected (topologically) sample volume of a transmission region of the transmissive layer 100, having both transverse dimensions about equal to $\lambda_0$ along the first surface 101 and extending from the first surface 101 through the transmissive layer 100 to the second surface 102, includes only the first optical medium, only the second optical medium, or both the first and second optical media of at least portions of two or more of the discrete volumes 103. Typically, the multitude of discrete volumes 103 is arranged so that any locally perpendicular straight-line path, extending from a first surface 101 of the transmissive layer 100 to a second surface 102 of the transmissive layer 100, passes through only the first optical medium, through only the second optical medium, or through only one discrete volume 103 of each of the first and second optical media. Note that for each of the surfaces 101 and 102, in some examples the surface can be a distinct physical interface or boundary between differing structures or materials (e.g., wherein the transmissive layer 100 comprises an etched layer of one material on a substrate of another material, as in the example of, inter alia, FIG. 4A), while in other examples the surface can be a virtual boundary between different regions of a single structure or material (e.g., wherein the transmissive layer 100 comprises an etched surface of a substrate, as in the example of, inter alia, FIG. 3A).

The discrete volumes 103 are variously sized and distributed on the transmissive layer so as to impart on the transmitted or reflected portion of the incident optical signal the effective phase transformation $\varphi_{\mathit{eff}}(x,y)$. In some examples, the discrete volumes 103 can be distributed on the transmissive layer 100 so that $(2\pi/\lambda_0) \cdot (n_1(\lambda_0) \cdot d_1(x,y) + n_2(\lambda_0) \cdot d_2(x,y))$, as a function of two-dimensional position coordinates x and y along the first surface of the transmissive layer, averaged over an area having transverse dimensions about equal to $\lambda_0$ on the first surface of the transmissive layer, is substantially equal to, or substantially proportional to, a specified position-dependent effective phase transformation function $\varphi_{\mathit{eff}}(x,y)$ for a single-pass-transmissive optical element (or substantially equal to $\frac{1}{2} \cdot \varphi_{\mathit{eff}}(x,y)$ for a double-pass-reflective optical element), where (i) $d_1(x,y)$ and $d_2(x,y)$ are the respective local thicknesses through the first and second optical media along the locally perpendicular straight-line path through a given position (x,y), and (ii) $\varphi_{\mathit{eff}}(x,y)$ varies with one or both x or y.

In some examples in which an optical signal is received at substantially normal incidence relative to the transmissive layer 100, the transmissive layer 100 can impart a local phase delay (at wavelength $\lambda_0$) for single-pass transmission, that can be approximated by $(2\pi/\lambda_0) \cdot (n_1(\lambda_0) \cdot d_1(x,y) + n_2(\lambda_0) \cdot d_2(x,y))$, that varies with two-dimensional position (x,y) along the first surface 101 of the transmissive layer 100. A similar approximation can be calculated for non-normal incidence. In general the thicknesses $d_1(x,y)$ and $d_2(x,y)$ can vary in any suitable way; however, in many examples those thicknesses will be subject to the constraint that the transmissive layer 100 has a substantially uniform thickness $d_1(x,y)+d_2(x,y)=D_T$ (i.e., substantially uniform to within limits imposed by constraints of fabrication processes employed; see below). Such an arrangement arises naturally when employing a lithographic process on a substrate surface (where $D_T$ would typically be equal to the etch depth) or on a uniform surface layer on a substrate (where $D_T$ would typically equal the surface layer thickness). Another common arrangement is one in which the transmissive layer 100 includes areal regions for which either $d_1(x,y)$ or $d_2(x,y)$, but not both, equals zero; in other words, the transmissive layer includes regions wherein only one of the optical media spans the transmissive layer 100 by extending from the first surface 101 through the transmissive layer 100 to the second surface 102. In some examples, all such regions comprise only one of the optical media and no volume of the other optical medium spans the transmissive layer 100; in other examples, some such regions comprise the first optical medium while other such regions comprise the second optical medium; in some of those latter examples, every areal region of the transmissive layer 100 comprises only one or the other optical medium extending from the first surface 101 to the second surface 102 (as in FIGS. 1A/1B, 2, 3A, 4A, 5A, 6A, 7A, 8A, 9A, and 10A).

Propagation of an optical signal at wavelength $\lambda_0$ through the transmissive layer 100 at normal incidence at given position (x,y) would nominally result in a phase delay of $(2\pi/\lambda_0)\cdot(n_1(\lambda_0)\cdot d_1(x,y)+n_2(\lambda_0)\cdot d_2(x,y))$ for single-pass transmission. However, due to the wave nature of the optical signal having wavelength $\lambda_0$, the optical signal propagating through one of the subwavelength discrete volumes 103 is affected by (i.e., effectively "samples") other nearby discrete volumes 103 (i.e., discrete volumes 103, or portions thereof, within a surrounding region having transverse dimensions about equal to $\lambda_0$), some of which may have index $n_1(\lambda_0)$ and some of which may have index $n_2(\lambda_0)$. The optical signal is affected at position (x,y) as if it were transmitted through a medium having an average index, between $n_1$ and $n_2$, that is about equal to a spatial average of the indices of the nearby discrete volumes 103 or nearby portions thereof. At normal incidence the transmissive layer 100 therefore imparts a spatially varying effective phase transformation function $\varphi_{\mathit{eff}}(x,y,\lambda_0)$ that is about equal to the quantity $(2\pi/\lambda_0)\cdot(n_1(\lambda_0)\cdot d_1(x,y)+n_2(\lambda_0)\cdot d_2(x,y))$ (for a single pass), or about equal to the quantity $(4\pi/\lambda_0)\cdot(n_1(\lambda_0)\cdot d_1(x,y)+n_2(\lambda_0)\cdot d_2(x,y))$ (for a double pass), spatially averaged over a sampling area having transverse dimensions about equal to $\lambda_0$. Similar approximation and averaging can be applied for non-normal incidence. The discrete volumes 103 can be sized and distributed on the transmissive layer 100 so that $(2\pi/\lambda_0)\cdot(n_1(\lambda_0)\cdot d_1(x,y)+n_2(\lambda_0)\cdot d_2(x,y))$ (for a single pass), or $(4\pi/\lambda_0)\cdot(n_1(\lambda_0)\cdot d_1(x,y)+n_2(\lambda_0)\cdot d_2(x,y))$ (for a double pass), approximates (or is approximately proportional to) a specified phase transformation function $\varphi(x,y)$ that varies with both x and y, including those described above. The optical element is structurally arranged so as to receive an optical signal 11 incident on the first surface 101 and to transmit (FIG. 1A; transmitted optical signal 13) or reflect (FIG. 1B; optical signal 15 reflected from reflector 104) at least a portion of the incident optical signal 11 transformed substantially according to the effective phase transformation function $\varphi_{\mathit{eff}}(x,y)$.

Some illustrative examples follow. For $n_1$ of about 1.5 and $n_2$ of unity (e.g., glass or silica and air), the thickness required to effect a $2\pi$ relative phase shift in a single pass is about 1.6 μm for $\lambda_0$ of about 800 nm. For $n_1$ of about 3 and $n_2$ of unity (e.g., a semiconductor and air), the thickness required to effect a $2\pi$ relative phase shift in a single pass is about 0.75 μm at $\lambda_0$ of about 1500 nm. The greater the index contrast between the first and second optical media, the smaller the thickness of the transmissive layer 100 can be while still providing a sufficiently large phase shift.

Similar behavior is exhibited by reflective surfaces made up of recessed and non-recessed areas 201 and 202, respectively, that include a non-empty subset of areas of the multitude having a largest transverse dimension less than about $\lambda_0$ (e.g., as in the examples of FIGS. 25A, 26A, 27A, 28A, 29A, 30A, 31A, 32A, 33A, 34A, and 35A). The recessed and non-recessed areas 201/202 are variously sized and distributed on the reflective surface so as to impart on the reflected portion of the incident optical signal the effective phase transformation $\varphi_{\mathit{eff}}(x,y)$. The recessed and non-recessed areas 201/202 are characterized by the depth function $d(x,y)$, that equals zero in the non-recessed regions 202 and assumes non-zero values up to a maximum depth $D_R$ in the recessed regions 201. An optical signal at normal incidence that is reflected from a recessed area 201 acquires a phase delay approximated by $(4\pi/\lambda)\cdot n_1(\lambda)\cdot d(x,y)$ relative to an optical signal reflected from a non-recessed area 202, wherein $n_1(\lambda)$ is the bulk refractive index of the medium filling the recessed areas 201 (vacuum, gas, liquid, or solid). A similar approximation can be calculated for non-normal incidence. In some examples the recessed and non-recessed areas 201/202 can be distributed along the reflective surface so that $(4\pi/\lambda_0)\cdot n_1(\lambda_0)\cdot d(x,y)$, as a function of two-dimensional position coordinates x and y along the reflective surface, averaged over a sampling area having transverse dimensions about equal to $\lambda_0$ along the reflective surface, is substantially equal or proportional to a specified position-dependent effective phase transformation function $\varphi_{\mathit{eff}}(x,y)$. The optical element is structurally arranged so as to receive an optical signal 211 incident on the reflective surface (normal or non-normal incidence) and to reflect at least a portion 215 of the incident optical signal transformed substantially according to the effective phase transformation function $\varphi_{\mathit{eff}}(x,y)$.

As with the transmissive layer 100, the wave nature of the incident optical signal 211 having wavelength $\lambda_0$ causes the optical signal propagating through one of the subwavelength discrete areas 201/202 to be affected by (i.e., effectively "samples") other nearby discrete areas 201/202 (i.e., discrete areas 201/202, or portions thereof, within a surrounding region having transverse dimensions about equal to $\lambda_0$), some of which may be recessed and some of which may be non-recessed. The optical signal is affected at position (x,y) as if it were reflected by a surface recessed to an average depth, between zero and $D_R$, that is about equal to a spatial average of the depths of the nearby discrete areas 201/202 or nearby portions thereof. The reflective surface therefore imparts upon reflection a spatially varying effective phase transformation function $\varphi_{\mathit{eff}}(x,y,\lambda_0)$ that can be approximated (at normal incidence) by the quantity $(4\pi/\lambda_0)\cdot n_1(\lambda_0)\cdot d(x,y)$ spatially averaged over a sampling area having transverse dimensions about equal to $\lambda_0$. Similar approximation and averaging can be applied for non-normal incidence.

Some illustrative examples follow. For $n_1$ of about 1 (e.g., the reflective surface in immersed in vacuum or air), the thickness required to effect a $2\pi$ relative phase shift in a single pass is about 0.4 μm for $\lambda_0$ of about 800 nm. For $n_1$ of about 1.5 (e.g., polymer or silica filling the recessed areas 201), the thickness required to effect a $2\pi$ relative phase shift in a single pass is about 0.5 µm at $\lambda_0$ of about 1500 nm. The larger the index of the medium filling the recessed areas 201, the smaller the depth of those recessed areas 201 can be while still providing a sufficiently large phase shift.

For conceptualizing and computationally designing the inventive optical element, it can be advantageous in some examples for the transmissive layer thickness to result in a phase difference of an integer multiple of $2\pi$ between the first and second optical media. For a transmissive optical element with a transmissive layer 100 (single pass and normal incidence, as in FIGS. 1A, 2A, 3A, 4A, 5A, 6A, 7A, 8A, 11A, 12A, 13A, 14A, 15A, and 16A), the corresponding design constraint is that $D_T$ is substantially equal to $D_{TN}=N\lambda_0/|n_1(\lambda_0)-n_2(\lambda_0)|$, where N is an integer. For a reflective optical element with a transmissive layer 100 (double pass and normal incidence, as in FIGS. 1B, 9A, 10A, 17A, and 18A), the corresponding design constraint is that $D_T$ is substantially equal to $D_{TN}=N\lambda_0/(2|n_1(\lambda_0)-n_2(\lambda_0)|)$, where N is an integer. In both cases, a satisfactory approximation of the desired phase transformation $\varphi(x,y)$ (i.e., providing the full range of $2\pi$ phase shift needed to approximate an arbitrary modulo $2\pi$ phase function) typically can be achieved when N=1 (i.e., when $D_{TN}=D_{T1}$). In some examples (described below), layers thinner than $D_{T1}$ can be employed while nevertheless enabling a range of phase shifts needed to adequately approximate the phase function. If the minimum thickness $D_{T1}$ is employed, then the discrete volumes 103 can be arranged so that the spatially averaged index of the transmissive layer 100 can achieve the values of $n_1$ and $n_2$ (to provide the full range of $2\pi$ phase shift). Layers of any needed or desired thickness greater than $D_{T1}$, or in some instances somewhat less than $D_{T1}$, can be employed. Thickness greater than $D_{T1}$ must be employed (to provide the full range of $2\pi$ phase shift) in examples wherein fabrication constraints do not permit the discrete volumes 103 to be arranged so that the spatially averaged index of the transmissive layer 100 can reach the values of $n_1$ and $n_2$. The minimum additional thickness needed is determined by limits on fractional areas of each of the optical media imposed by the spatially selective fabrication processes employed (discussed further below).

Similarly, in some surface-reflective examples (as in FIGS. 25A, 26A, 27A, 28A, 29A, 30A, 31A, 32A, 33A, 34A, and 35A), it can be advantageous for the depth of the recessed areas 201 to result in a phase difference of an integer multiple of $2\pi$ between reflections from the recessed areas 201 versus the non-recessed areas 202. The corresponding design constraint for normal incidence is that $D_R$ is substantially equal to $D_{RN}=[N\lambda_0]/[2n_1(\lambda_0)]$, where N is an integer. A satisfactory approximation of the desired phase transformation $\varphi(x,y)$ (i.e., providing the full range of $2\pi$ phase shift needed to approximate an arbitrary modulo $2\pi$ phase function) typically can be achieved when N=1 (i.e., when $D_R=D_{R1}$). In some examples (described below), layers thinner than $D_{R1}$ can be employed while nevertheless enabling a range of phase shifts needed to adequately approximate the phase function. If the minimum thickness $D_{R1}$ is employed, then the discrete areas 201/202 can be arranged so that the spatially averaged phase shift can achieve the full range of $2\pi$. Layers of any needed or desired thickness greater than $D_{R1}$, or in some instances somewhat less than $D_{R1}$ can be employed. Thickness greater than $D_{T1}$ must be employed (to provide the full range of $2\pi$ phase shift) in examples wherein fabrication constraints do not permit the discrete areas 201/202 to be arranged so that the phase shift can span $2\pi$ with the minimum thickness $D_{R1}$. The minimum additional thickness needed is determined by limits on fractional areas of each of the recessed areas imposed by the spatially selective fabrication processes employed (discussed further below).

In all of those categories, i.e., single-pass transmission (through layer 100, e.g., as in FIGS. 3A, 12A, and others), double-pass reflection (twice through layer 100, e.g., as in FIGS. 9A, 10A, 17A, and 18A), and first-surface reflection (e.g., as in FIGS. 25A, 33A, and others), the morphology of the optical media, interfacial surfaces between them, or reflective surfaces can in some instances result in unacceptably or undesirably high levels of optical diffraction or scattering. Undesirable optical diffraction can be a particular problem in examples wherein limited spatial resolution of a patterning tools limits the minimum size (relative to the operational wavelength) of discrete volumes of the transmissive layer or recessed areas of the reflective surface. In some examples, at least partial reflow of one or more optical media or reflective materials, after spatially selective material processing to form the transmissive layer or the reflective surface, can be employed to smooth out the morphology of the transmissive layer or reflective surface. The smoother morphology typically exhibits reduced optical diffraction or scattering, relative to the transmissive layer or reflective surface before the reflow. After such reflow, the effective phase transformation function $\varphi_{eff}(x,y,\lambda_0)$ continues to approximate the desired the phase transformation function $\varphi(x,y)$; in some instances, $\varphi_{eff}(x,y,\lambda_0)$ is a better approximation of $\varphi(x,y)$ after the reflow process than before that process, and in some instances can even approximate $\varphi(x,y)$ without any spatial averaging (referred to hereinafter as "complete reflow"). However, it has been observed that lesser degrees of reflow can nevertheless provide reduced diffraction or scattering with acceptably low phase error.

Spatially selective material processing (e.g., etching, deposition, and so forth) and subsequent reflow can be implemented in a wide variety of ways using a wide variety of materials. Some examples are described below.

Figure 2:
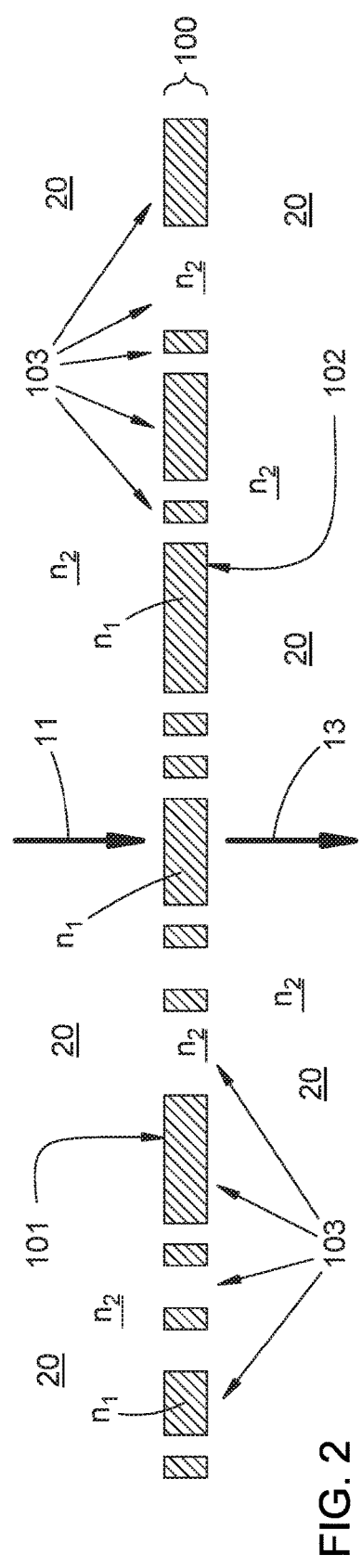
FIG. 2 illustrates schematically a transmission layer of an example transmissive optical element.

The transmissive layer 100 (e.g., as in FIGS. 1A through 18B) can be physically realized in a number of different arrangements. In perhaps the conceptually simplest example arrangement, the transmissive layer 100 has a substantially uniform thickness D, has a multitude of suitably sized and positioned perforations, and is immersed in an ambient medium that surrounds the layer 100 and fills the perforations (FIG. 2). The solid material of the layer 100 has refractive index $n_1(\lambda)$ and the ambient medium (solid, liquid, or gaseous) has refractive index $n_2(\lambda)$. The perforations and the intervening areas of the layer 100 form the discrete volumes 103, and the perforations can be sized and distributed on the layer 100 to result in the desired effective phase transformation function $\varphi_{eff}(x,y)$. The example of FIG. 2 is suitable for transmission (in a single-pass geometry); one or more additional layers can be employed to form a reflector to reflect the phase-transformed optical signal (in a double-pass geometry). In some examples the ambient medium comprises a gaseous or liquid ambient medium 20, e.g., vacuum, air, one or more inert gases, or an optical fluid. In other examples the ambient medium can be a solid; such an example could be formed, e.g., by immersing the perforated layer 100 in a liquid polymer precursor and then curing the polymer to solidify it. Given the thinness typically required for the transmissive layer 100 (e.g., <1 µm to a few µm), the example of FIG. 2 might be difficult to implement.

Figure 3A:
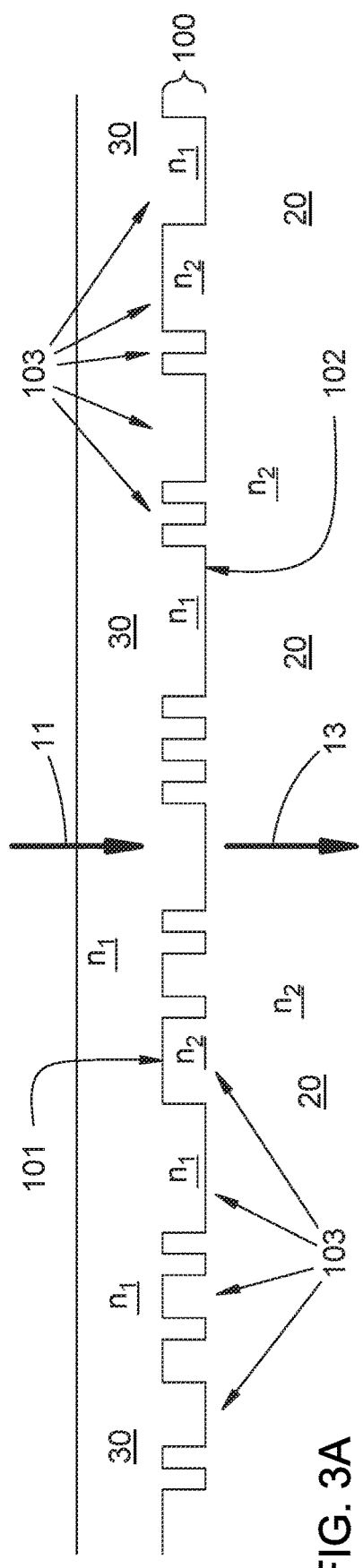

In some examples, the transmissive layer 100 is mechanically stabilized by a substrate or overlayer 30 positioned against the surface 101 (the incident surface). The substrate 30 comprises a suitably rigid and stable, substantially transparent, solid material (crystalline, polycrystalline, or amorphous), e.g., one or more of a doped or undoped dielectric material, a doped or undoped semiconductor material, or a doped or undoped polymer. The incident optical signal 11 propagates through the substrate 30; the portion 13 of the incident optical signal 11—transmitted through the transmissive layer 100 and into the ambient medium 20—is transformed substantially according to the effective phase transformation function $\varphi_{eff}(x,y)$. In the examples of FIGS. 3A/3B, 4A/4B, 11A/11B, and 12A/12B, the transmissive layer 100 comprises surface relief structure on a surface of the substrate 30, the second surface 102 of the transmissive layer 100 is in contact with the gaseous or liquid ambient medium 20, and the ambient medium 20 fills the recessed regions of the surface relief structure, thereby serving as the second optical medium. The recessed regions of the surface relief structure and the intervening non-recessed regions form the discrete volumes 103, and can be sized and distributed on the layer 100 to result in the desired effective phase transformation function $\varphi_{eff}(x,y)$ in a single-pass transmissive geometry. The surface 101 of the layer 100 substantially coincides with the depth of the recessed regions, while the surface 102 substantially coincides with the non-recessed regions.

In the examples of FIGS. 3A/3B and 11A/11B, the substrate 30 comprises the same material as the first optical medium, and the surface relief structure is formed directly on a surface of the substrate 30. In the examples of FIGS. 4A/4B and 12A/12B, the substrate material differs from the first optical medium, and the surface relief structure is formed in a surface layer of the first optical medium that was grown, deposited, or otherwise formed by any suitable process on the substrate 30 of a differing material. Any suitable process can be employed to form the surface relief structure (the term "etched" in the title represents a common example). In some examples, the surface relief structure can be formed by molding, stamping, or embossing the first optical medium. In other examples, the surface relief structure can be replicated in the first optical medium using a master structure. In still other examples, any suitable etch process can be employed, e.g., anisotropic dry etching (e.g., as in FIGS. 3A and 4A) or isotropic wet etching (e.g., as in FIGS. 11A and 12A) of the photolithographically masked surface or layer of the first optical medium. In some examples in which etching is employed, the etch depth (i.e., the thickness) is controlled by the time duration of the etch process (other process variables being equal). In some examples in which etching is employed and the first optical medium comprises a surface layer on a substrate 30 of a differing material (e.g., as in FIGS. 4A and 12A), it can be advantageous to employ an etch process that etches the first optical medium at a significantly higher rate than the substrate material (i.e., wherein the substrate acts as an etch stop; in other examples, an additional material layer between the first optical medium and the substrate can act as an etch stop layer). In that instance the etch depth is substantially equal to the thickness of the surface layer, independent of the etch time (if sufficiently long to completely remove unmasked regions of the surface layer, but not so long as to remove photoresist or other patterning or masking layer), and the interface between the first optical medium and the substrate 30 forms the first surface 101 of the transmissive layer 100. If the etch rates do not differ sufficiently, the etch depth can be controlled by the time duration of the etch process (as described above). In some examples (FIGS. 11A and 12A), some recessed regions may be etched to a lesser depth than other areas even though etched for the same duration; such an arrangement can be achieved, e.g., using a wet etch process in which smaller unmasked areas might etch at a slower rate due to slower diffusion of etchant to the etched surface. While the transmissive layer 100 in the preceding examples is considered to have a substantially uniform thickness, the etch process employed can lead to some variation of the etch depth depending on the transverse extent of the localized area being etched (e.g., wider etched regions may tend to etch deeper than narrower etched regions). Notwithstanding such processing variation, such an etched layer shall nevertheless fall within the scope of "substantially uniform thickness."

Figure 3B:
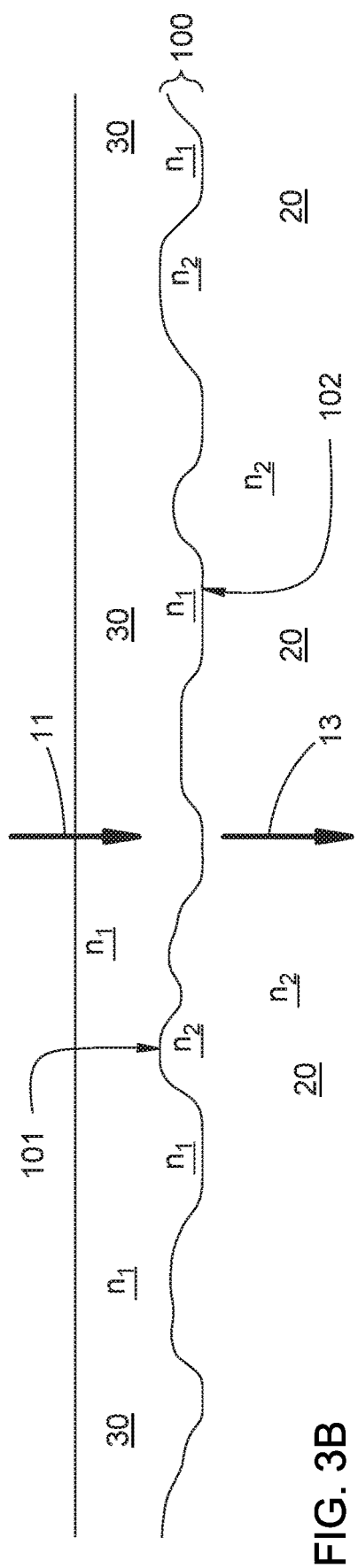
Figure 6A:
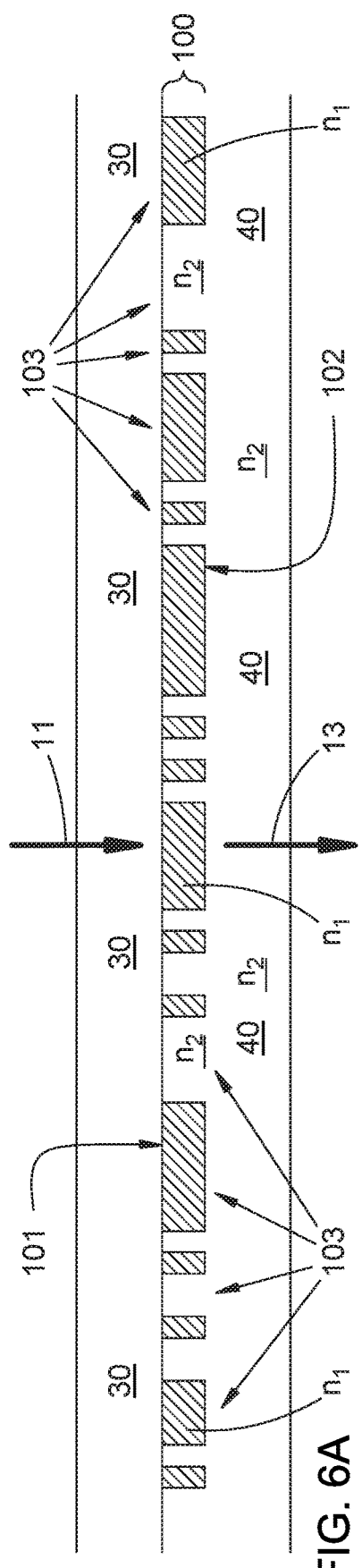
Figure 6B:
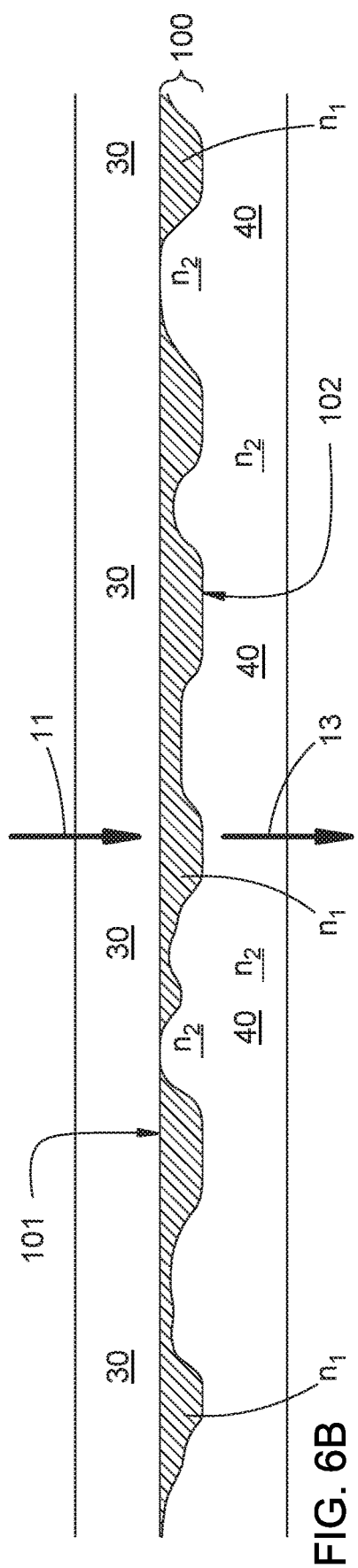

The arrangements of FIGS. 3B and 11B result from a reflow process applied to the arrangements of FIGS. 3A and 11A, respectively. Partial reflow is shown in the examples; complete reflow can be employed if needed or desired. In the examples of FIGS. 3A/3B and 11A/11B, selective heating of the etched surface of the substrate 30, or selective cooling of the opposite substrate surface, or both, typically would be required to achieve the desired reflow at the surface 102 without also causing unwanted deformation of the substrate. Such surface-selective heating or cooling (or both) can be employed to effect reflow in any of the other examples shown as well. The arrangements of FIGS. 4B and 12B result from a reflow process applied to the arrangements of FIGS. 4A and 12A, respectively. In some of those examples, the substrate material can be chosen to have a higher melting point than the material of the layer 100 (e.g., an undoped fused silica substrate 30 with a boron-, germanium-, or phosphorus-doped silica layer 100). In such examples, reflow can be effected by heating an optical element arranged as in FIG. 4A or 12A to a temperature high enough to cause at least partial reflow of the etched layer 100 without reflow or deformation of the substrate 30.

The examples of FIGS. 5A/5B, 6A/6B, 13A/13B, and 14A/14B are similar to those of FIGS. 3A/3B, 4A/4B, 11A/11B, and 12A/12B, respectively, with the addition of a substantially transparent solid overlayer 40 positioned against the second surface 102 of the transmissive layer 100. The overlayer 40 can comprise one or more of (i) one or more solid doped or undoped dielectric materials, (ii) one or more solid doped or undoped semiconductor materials, or (iii) one or more solid doped or undoped polymers. The substantially solid material comprising the overlayer 40 fills the etched regions of the substrate surface (as in FIGS. 5A/5B and 13A/13B) or the surface layer (as in FIGS. 6A/6B and 14A/14B) and therefore serves as the second optical medium. The overlayer 40 can be formed using any suitable material formed, grown, or deposited in any suitable way, including materials disclosed above. It may be desirable for the opposing surface of the overlayer 40 to be substantially flat. Examples of suitable processes for forming the overlayer 40 can include, e.g., spin deposition of a polymer, beam or vapor deposition of a dielectric material, or other process that enables the second optical medium to substantially fill the recessed regions of the surface relief structure. In the examples formed by at least partial reflow, the overlayer 40 can be applied after reflow of the etched surface layer; in other examples, the overlayer material can be applied before reflow, which alters the morphology of both the etched surface layer material and the overlayer material. As noted above, the reflow can be effected by surface-selective heating, cooling, or both, or by selection of first and second optical media that have melting points lower than that of the substrate 30.

Figure 7A:
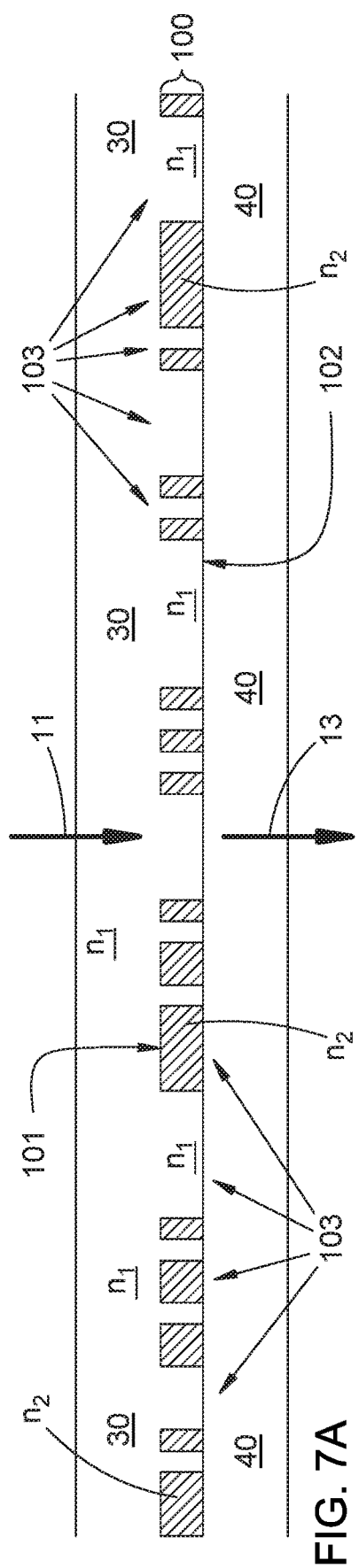
Figure 7B:
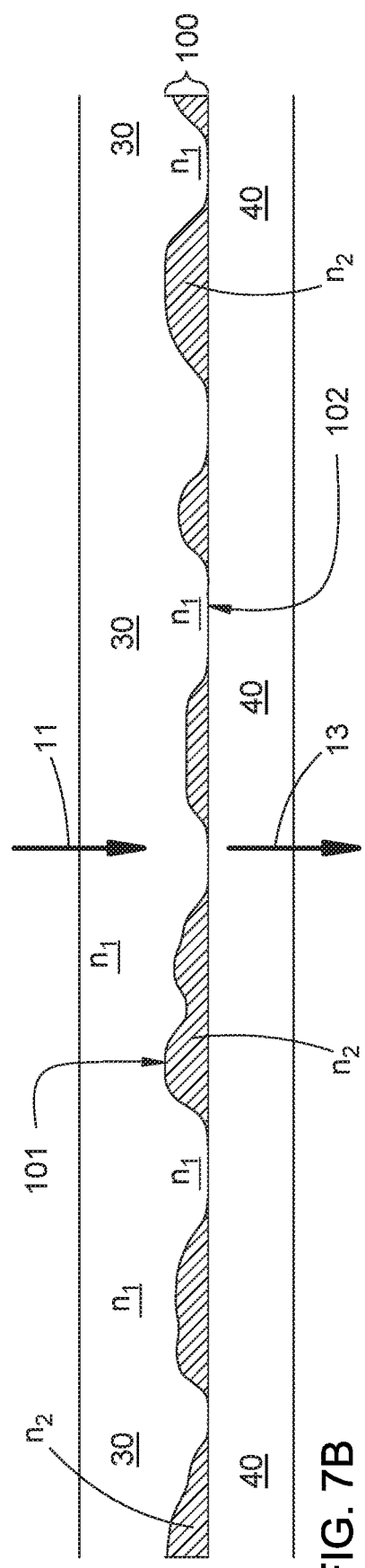

The examples of FIGS. 7A/7B, 8A/8B, 15A/15B, and 16A/16B are similar to those of FIGS. 5A/5B, 6A/6B, 13A/13B, and 14A/14B, respectively, except that the overlayer 40 comprises a solid material differing from the second optical medium. The overlayer 40 can also comprise material differing from the first optical medium. In some examples the second optical medium can be vacuum, gaseous, or liquid; in other examples, the second optical medium can comprise a solid material grown, deposited, or otherwise formed in the corresponding regions and discrete volumes 103 of the transmissive layer 100, including materials disclosed above. In some examples the overlayer 40 can comprise a substrate positioned against, and perhaps attached or adhered to, the second surface 102 of the transmissive layer 100; in other examples the overlayer 40 can be grown, deposited, or otherwise formed on the second surface 102 of the transmissive layer 100. Reflow can be effected on only the etched first optical medium (before deposition of the second optical medium), or on both the first and second optical media (before or after deposition or positioning of the overlayer 40), using materials and methods described above.

Additional examples (not shown) can be implemented that resemble FIG. 7A/7B, 8A/8B, 15A/15B, or 16A/16B but lack the substrate 30. In such examples the second optical medium is a substantially solid material that fills the recessed regions of the surface relief structure. Both the first and second optical media are in contact with an ambient medium into which the transmitted signal 13 propagates.

Any of the examples of FIGS. 3A through 8B, FIGS. 11A through 16B, and the preceding paragraph can be used in reverse, i.e., the first surface 101 of the transmissive layer 100 faces the ambient medium 20 (FIGS. 3A-4B, 11A-12B, and the preceding paragraph) or the overlayer 40 (FIGS. 5A-8B and 13A-16B); the second surface 102 of the transmissive layer 100 faces the substrate 30; the incident optical signal 11 propagates through the ambient medium 20 (FIGS. 3A-4B, 11A-12B, and the preceding paragraph) or the overlayer 40 (FIGS. 5A-8B and 13A-16B); and the transformed portion 13 of the signal is transmitted through the transmissive layer 100 and into the substrate 30.

Figure 9A:
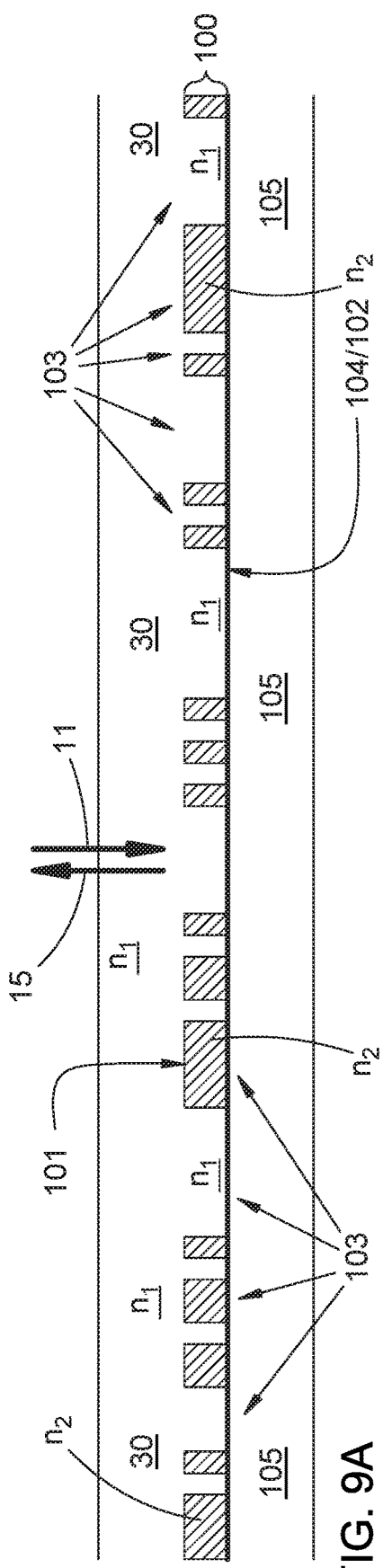
Figure 9B:
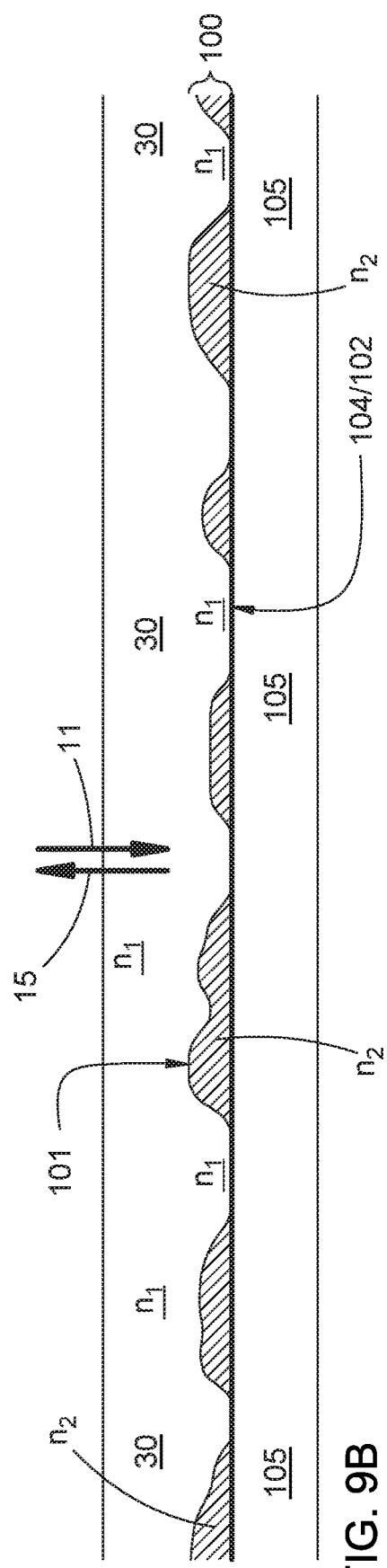
Figure 12A:
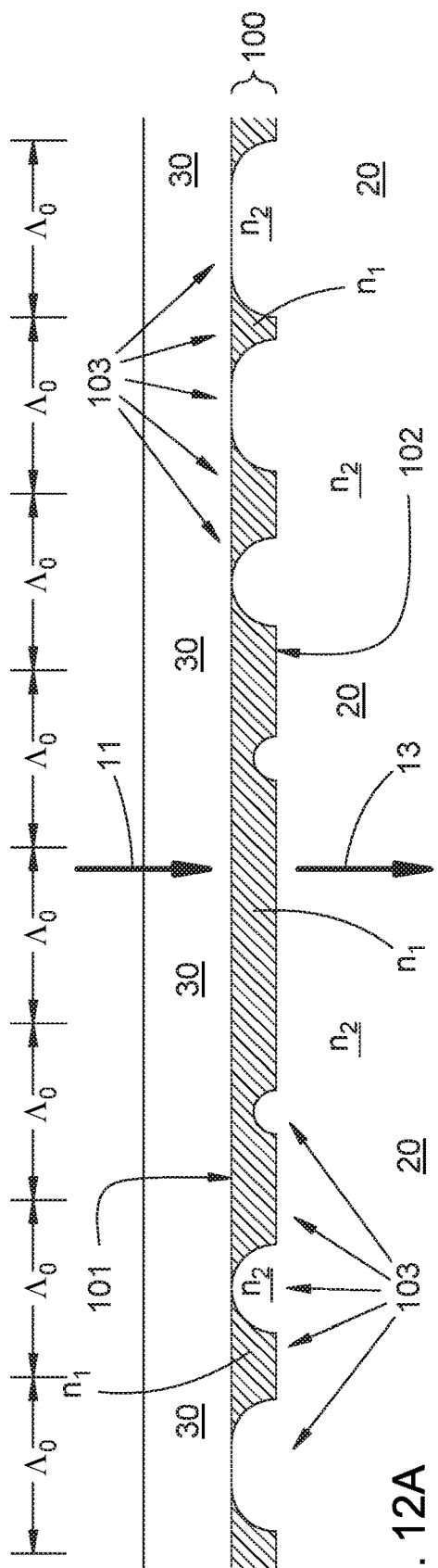
Figure 12B:
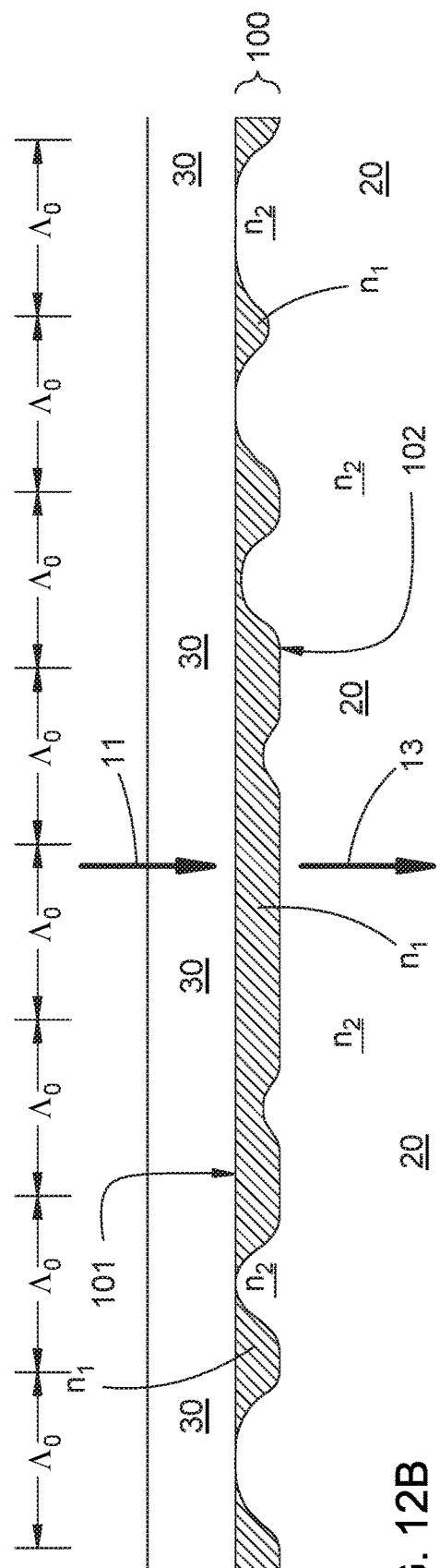
Figure 14A:
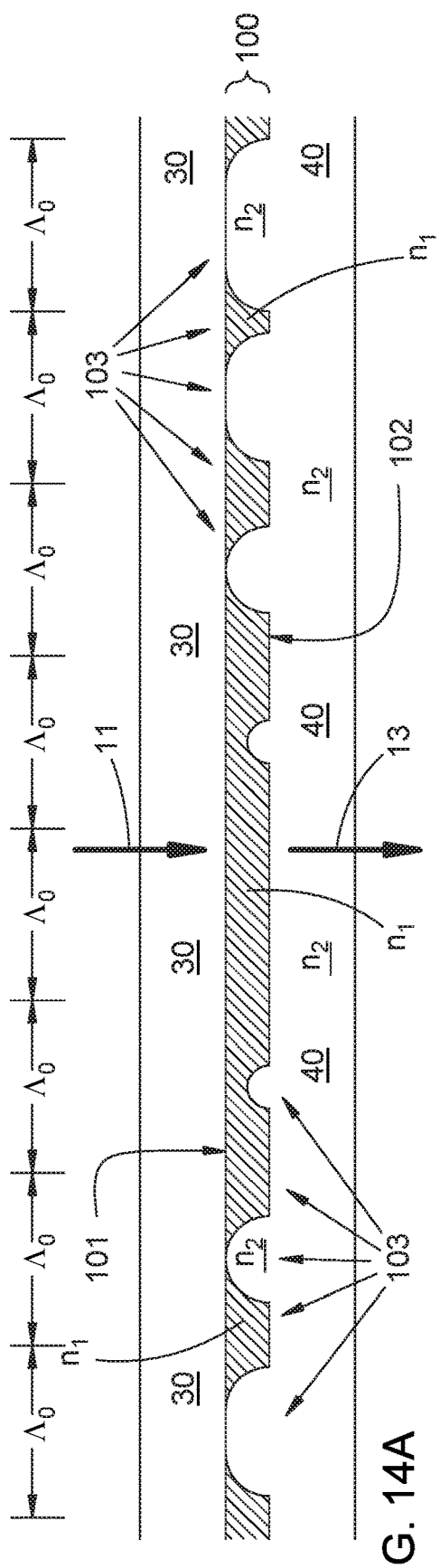
Figure 14B:
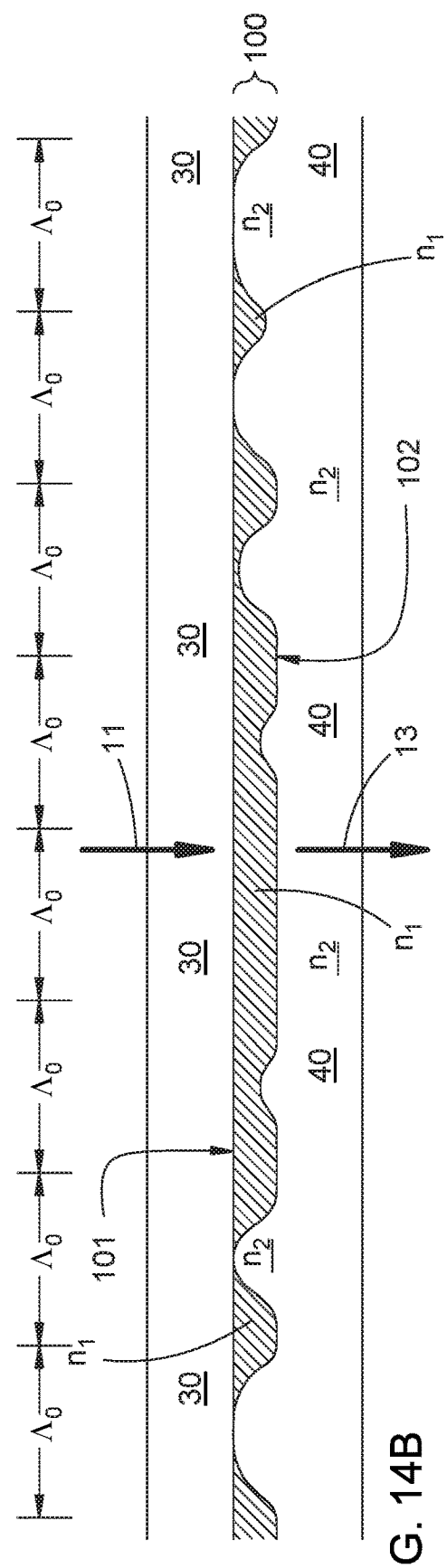
Figure 15A:
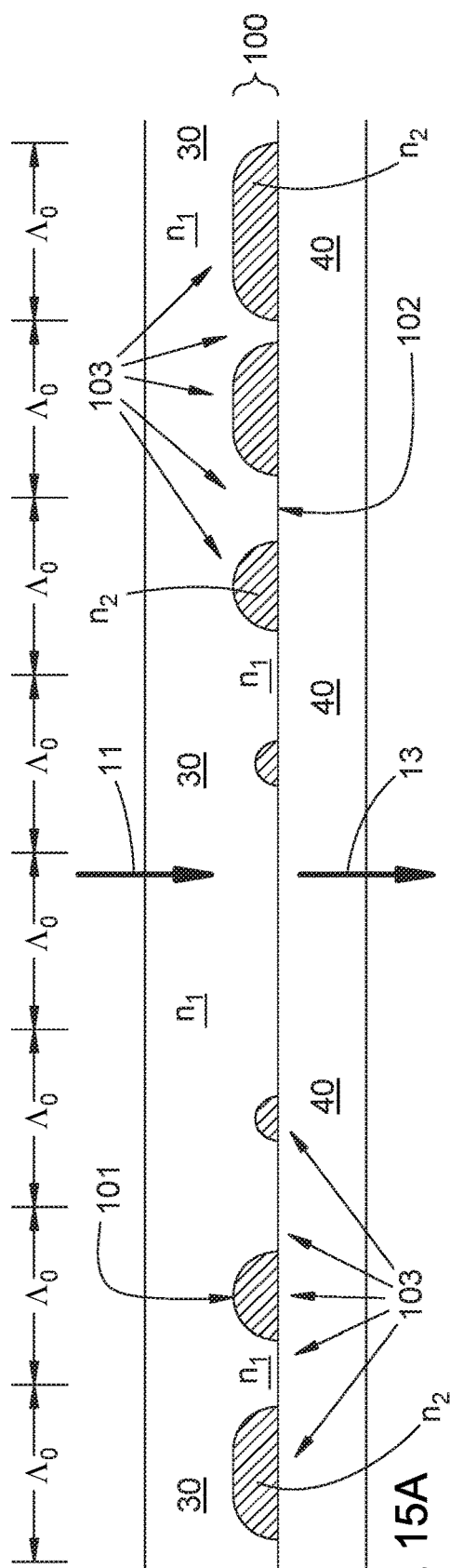
Figure 15B:
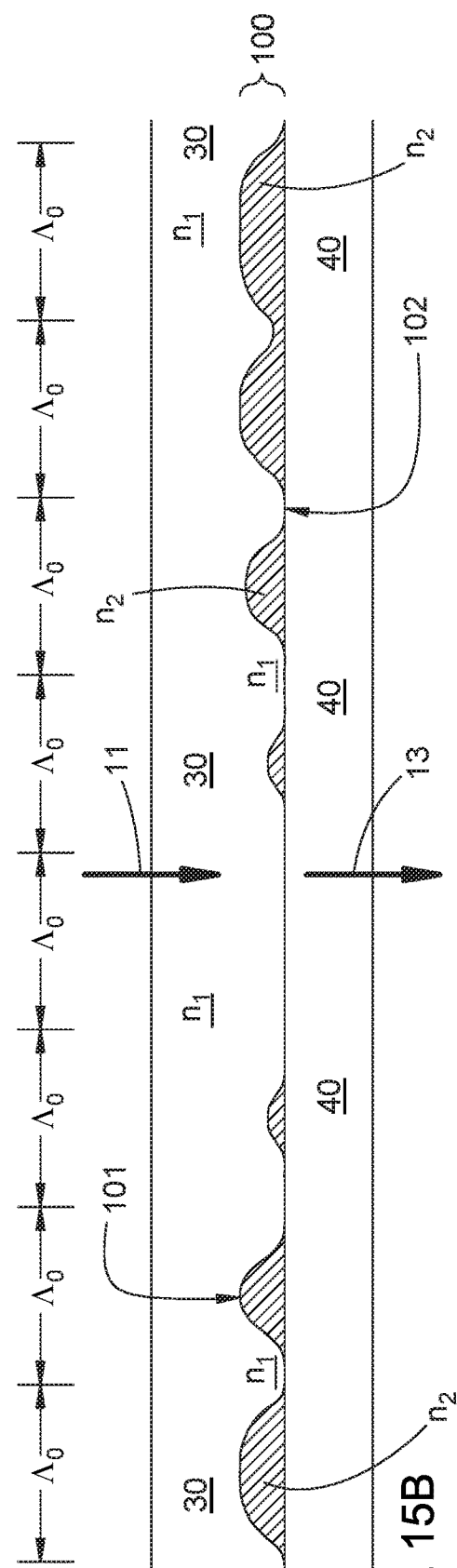
Figure 17A:
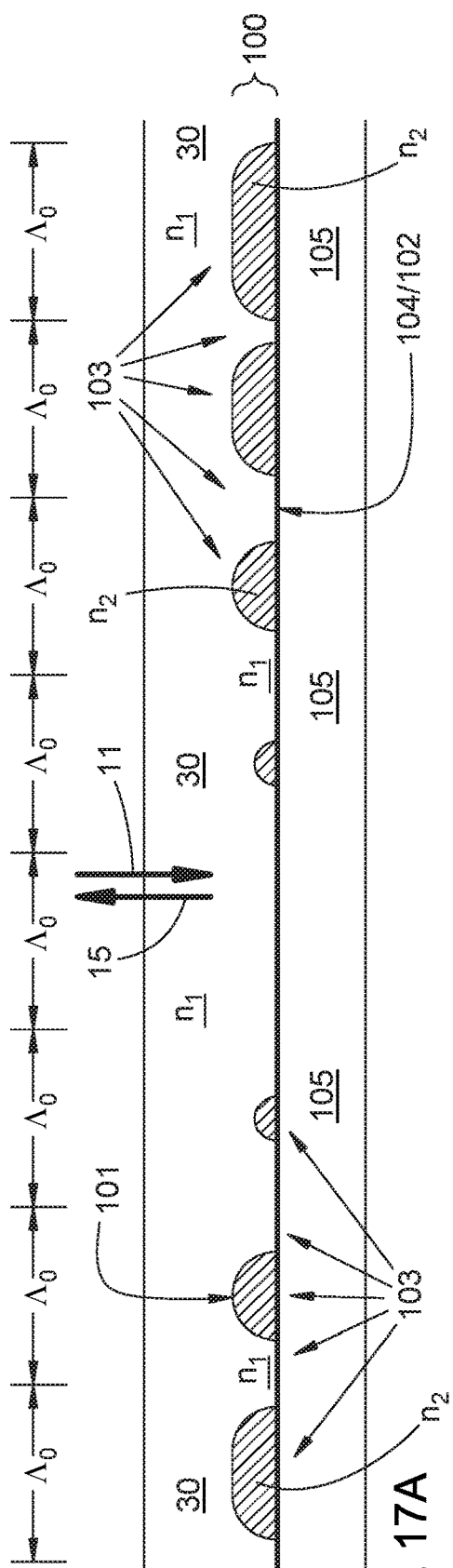
FIGS. 17A-18B illustrate schematically various example unit cell arrangements of a double-pass-reflective optical element.
Figure 17B:
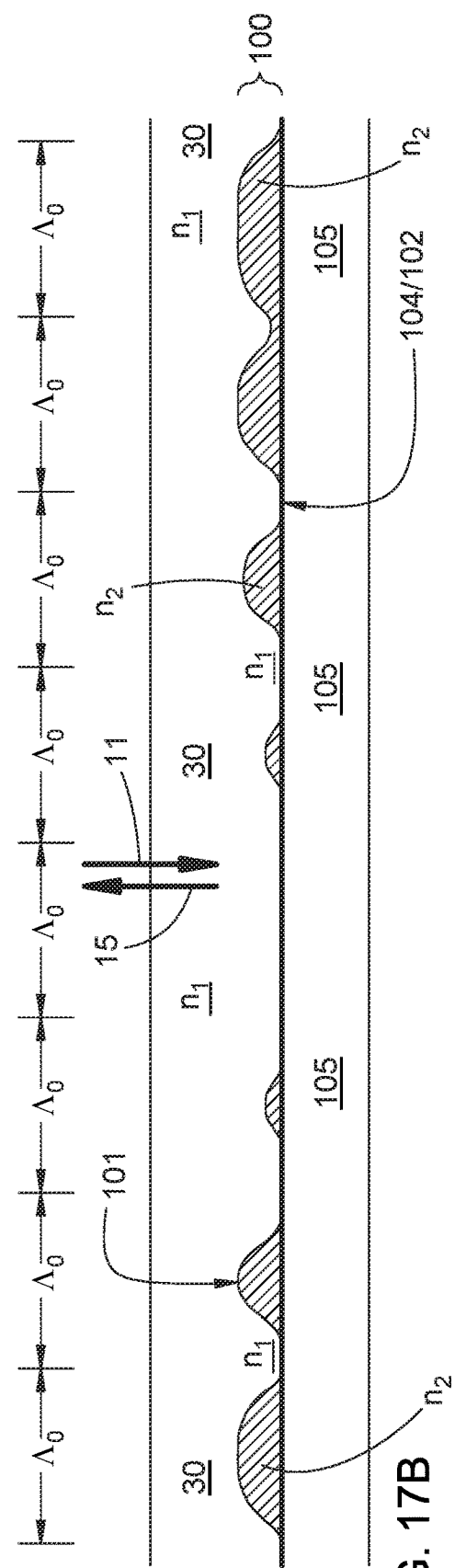
Figure 18A:
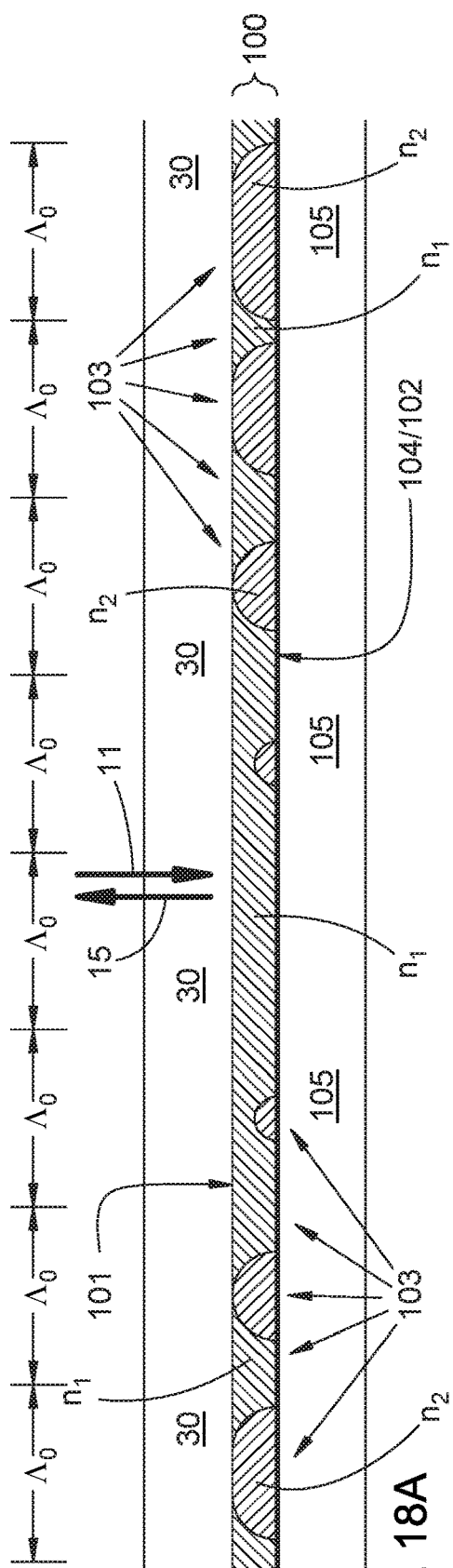
Figure 18B:
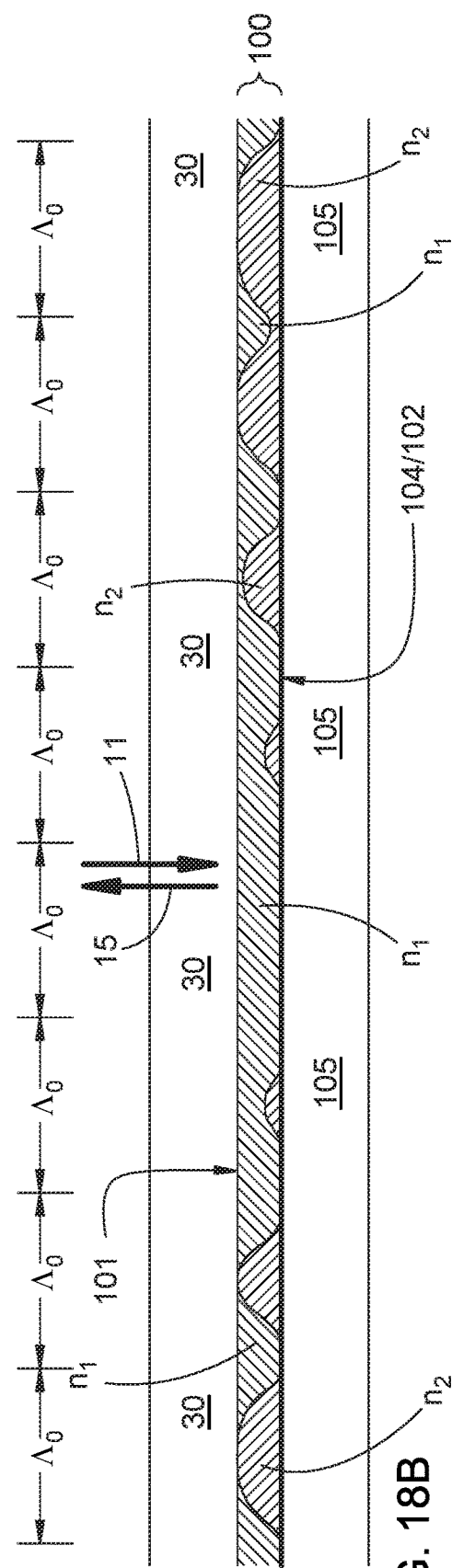

The examples of FIGS. 9A/9B, 10A/10B, 17A/17B, and 18A/18B are similar to those of FIGS. 3A/3B, 4A/4B, 11A/11B, and 12A/12B, respectively, except that they include a reflector 104 facing the second surface 102 of the transmissive layer 100. In many examples, the reflector is positioned against the second surface 102 of the transmissive layer 100. The incident optical signal 11 propagates through the substrate 30; the portion 15 of the incident optical signal 11—transmitted through the transmissive layer 100, reflected by the reflector 104, and transmitted back through the transmissive layer 100 and into the substrate 30—is transformed substantially according to the effective phase transformation function $\varphi_{eff}(x,y)$ in a double-pass geometry. The reflector can be of any suitable type, e.g., a metal coating or a dielectric stack. In some examples the second optical medium can be vacuum, gaseous, or liquid; in other examples, the second optical medium can comprise a solid material grown, deposited, or otherwise formed in the corresponding regions and discrete volumes 103 of the transmissive layer 100. In some examples the reflector 104 can be formed on a separate substrate 105 positioned against, and perhaps attached or adhered to, the second surface 102 of the transmissive layer 100 with the reflector between the second surface 102 and the substrate 105; in other examples the reflector 104 can be deposited or otherwise formed on the second surface 102 of the transmissive layer 100, in which case the substrate 105 may not be necessary. In any of those examples, at least partial reflow of one or both of the optical media can be effected in any of the ways described above.

The examples of FIGS. 11A-18B are analogous to examples of FIGS. 3A-10B, respectively, but differ with respect to the cross-sectional shape of the discrete volumes 103. The arrangements of FIGS. 3A-10B typically would arise from a directional etch process (e.g., anisotropic reactive ion etching) yielding boundaries between adjacent volumes of the first and second optical media that are vertical or nearly so. The examples of FIGS. 11A-18B typically would arise from a non-directional etch process (e.g., isotropic wet etching) yielding boundaries between adjacent volumes of the first and second optical media that are curved. Width and depth of an isotropically etched region can vary according to the transverse size of a corresponding opening in the etch mask and can be well characterized and reproducible for a given combination of etched material, etchant, etch time, and etch conditions. An etch stop employed in a wet etch process can alter the variation of etch depth with transverse size, by imposing a maximum etch depth. FIGS. 3A-10B also differ from FIGS. 11A-18B with respect to the spatial distribution employed to achieve the desired phase transformation, discussed below.

An inventive method employing an inventive optical element disclosed herein comprises (i) directing an optical signal 11 onto the first surface of the transmissive layer 100 of the optical element (e.g., as in FIGS. 3A-18B) and (ii) transmitting through or reflecting from the optical element at least a portion 13 or 15, respectively, of the optical signal transformed substantially according to the specified position-dependent effective phase transformation function $\varphi_{eff}(x,y)$. Another inventive method employing an inventive optical element disclosed herein comprises (i) directing an optical signal 211 onto the reflective surface of the optical element (e.g., as in FIGS. 25A-37B) and (ii) reflecting from the optical element at least a portion 215 of the optical signal transformed substantially according to the specified position-dependent effective phase transformation function $\varphi_{eff}(x,y)$.

An inventive method for making some examples disclosed herein (e.g., FIGS. 1A through 18B) of an optical element comprises spatially selectively processing a layer comprising the first optical medium to replace, in selected areas of the layer, the first optical medium with the second optical medium, thereby forming the transmissive layer 100 of the optical element. In some examples, the method further includes effecting at least partial reflow of one or both of the first or second optical media.

An inventive method, for making some examples disclosed herein (e.g., FIGS. 25A-27B, 34A/34B, and 36A/36B) of a surface-reflective optical element, comprises spatially selectively processing a surface of a reflective material layer 203 (that is supported by a substrate 200) to form a multitude of recessed and non-recessed areas 201/202 of the reflective surface. The reflective material 203 can be a metallic material, e.g., one or more metals or alloys such as aluminum, silver, or gold. An optical element formed in this way operates with the optical signal 211 incident on the reflective material 203 from the side opposite the substrate 200. In some examples (e.g., as in FIGS., 25A/25B, 34A/34B, and 36A/36B), the recessed areas 201 can be filled with the ambient medium 220, e.g., vacuum, air, other one or more gases, or one or more liquids or solutions. In other examples (e.g., FIGS. 26A/26B and 27A/27B), the method can further comprise filling the recessed areas 201 of the reflective surface with a transmissive solid material 230 that is substantially transparent over the operational wavelength range and characterized by the bulk refractive index $n_1(\lambda)$ (e.g., one or more of: (i) any suitable one or more doped or undoped polymers, (ii) any suitable one or more doped or undoped glasses, (iii) any suitable one or more doped or undoped dielectric materials, or (iv) any suitable one or more doped or undoped semiconductors or alloys thereof). In some examples (e.g., FIGS. 27A/27B), a medium 203 that fills the recessed areas 201 can also form a layer over the non-recessed areas 202 of the reflective surface. In such examples the medium 203 can act as a protective layer. In the examples of FIGS. 25A, 26A, 27A, 34A, and 36A, at least partial reflow of the etched reflective layer 203 can be effected to produce the examples of FIGS. 25B, 26B, 27B, 34B, and 36B, respectively, in any of the ways and using any of the material described above. In some examples, a metal reflective layer 203 will reflow at a temperature lower than that of the substrate 200. In some examples, if a material 230 is present, it can be deposited after reflow of the reflective layer 203, or it can be deposited beforehand and reflowed along with the reflective layer 203.

Another inventive method, for making some examples disclosed herein (e.g., FIGS. 28A-33B, 35A/35B, and 37A/37B) of a surface-reflective optical element, comprises spatially selectively processing a surface of a material layer 204 (supported by a substrate 200) to form a multitude of recessed and non-recessed areas of the material layer 204, and forming, depositing, or applying a reflective film 205 or layer 203 onto the recessed and non-recessed areas of the material layer 204 to form the reflective surface. The reflective film 205 or layer 203 can be a metallic film or layer, e.g., comprising one or more metals or alloys such as aluminum, silver, or gold. In some examples, the material layer 204 is a portion of the substrate 200; in other examples the substrate 200 and the layer 204 comprise one or more materials different from each other. In the examples of FIGS. 28A, 29A, 30A, 31A, 32A, 33A, 35A, and 37A, at least partial reflow of the etched material layer 204 can be effected to produce the examples of FIGS. 25B, 26B, 27B, 34B, and 36B, respectively, in any of the ways and using any of the material described above. The reflective layer 203 (if present) can be deposited before or after reflow of the etched material layer 204 (and reflowed along with it, if deposited before reflow); the reflective film 205 (if present) typically would be formed after reflow of the etched material layer 204.

In some examples of surface-reflective optical elements (e.g., FIGS. 28A-30B, 35A/35B, and 37A/37B), each recessed area of the material layer 204 (or substrate 200) forms a corresponding non-recessed area 202 of the reflective surface, and each recessed area of the material layer 204 (or substrate 200) forms a corresponding non-recessed area 201 of the reflective surface. The material layer 204 (and substrate 200) is substantially transparent over the operational wavelength range and characterized by the bulk refractive index $n_1(\lambda)$. The optical element thus made is structurally arranged so as to receive the optical signal 211 incident on the reflective surface by transmission of the optical signal 211 through the material layer 204 (and the substrate 200). The reflective layer 203 (e.g., FIGS. 29A/29B, 30A/30B, 35A/35B, and 37A/37B) or film 205 (e.g., FIGS. 28A/28B) are grown, deposited, or applied to the recessed and non-recessed areas of the material layer 204 (or substrate 200). As long as all areas are coated, the thickness or topography of the outer surface of the reflective layer 203 is largely irrelevant (since it does not interact with the optical signal). Manufacturing processes can be simplified by allowing the reflective material to fill the recessed areas of the layer 204 or substrate 200, as in FIGS. 29A/29B, 30A/30B, and 35A/35B)

In some other examples of surface-reflective optical elements (e.g., FIGS. 31A-33B), each recessed area of the material layer 204 (or substrate 200) forms a corresponding recessed area 201 of the reflective surface, and each non-recessed area of the material layer 204 (or substrate 200) forms a corresponding non-recessed area 202 of the reflective surface. A reflective film 205 (e.g., one or more metals or alloys, or other suitable one or more reflective materials), and the optical element is structurally arranged so as to receive the optical signal 211 incident on the reflective surface without transmission of the optical signal 211 through the material layer 204 (or the substrate 200). In such examples, a reflective film typically must be employed, so as to preserve the desired topography of the recessed and non-recessed areas 201/202. A transparent ambient medium 220 (vacuum, gaseous, or liquid) can fill the recessed areas 201 (as in FIGS. 31A/31B), or a solid transparent medium 230 can fill the receded areas 201 or cover the non-recessed areas 202 (as in FIGS. 32A/32B and 33A/33B), acting as a protective overlayer.

The inventive optical elements disclosed herein enable the approximation of an arbitrary phase transformation function $\varphi(x,y)$ in an optical element made using only binary spatial processing techniques, followed in some examples by at least partial reflow of one or optical media or reflective material. That result is achieved by exploiting the wave nature of the optical signal and its effective "sampling" of multiple sub-wavelength spatial features of the optical element, and in some examples employing reflow to reduce resulting unwanted diffraction or scattering. In effect, use of reflow can relax the spatial resolution required to achieve a desired effective phase transformation function, because the alteration of the morphology of the spatially processed material is at least partly "averaged out" by the reflow. However, smaller spatial features are increasingly difficult to fabricate with decreasing transverse size. Perhaps more importantly, the transverse feature size limits the corresponding thickness of those features, e.g., a 100 nm linewidth can be readily achieved by spatially selective processing of a 100 nm thick layer of material, but cannot be as readily achieved in a 1 µm thick layer of material. The thickness limitation puts a lower limit on the feature size that can be readily employed, at least in those instances wherein at least a $2\pi$ phase shift is needed or desired to approximate many phase transformation functions and sufficient thickness must be employed to achieve that phase shift.

In some examples (FIGS. 11A-18B), the transmissive layer 100 has a substantially uniform thickness $d_1(x,y)+d_2(x,y)=D_T$, and the discrete volumes of the multitude are arranged according to a regular two-dimensional grid pattern, characterized by a grid spacing of $\Lambda_0$, along the first surface of the transmissive layer. The examples of FIGS. 11A-18B include discrete volumes 103 typically arising from, e.g., an isotropic wet etch process; however, the grid-based arrangement can be implemented with discrete volumes resembling those of FIGS. 3A-10B, e.g., those typically arising from a directional dry etch process. Likewise, the examples of FIGS. 3A-10B (that are not arranged according to a grid pattern) include discrete volumes 103 typically arising from, e.g., a directional dry etch process; however, the no-grid arrangement can be implemented with discrete volumes resembling those of FIGS. 11A-18B, e.g., those typically arising from an isotropic wet etch process. The grid spacing $\Lambda_0$ is less than or about equal to $\lambda_0$ and typically greater than about equal to $\lambda_0/20$. In some of those examples, the grid spacing $\Lambda_0$ is greater than about $\lambda_0/10$ or $\lambda_0/4$ or even as large as about $\lambda_0/2$. A smaller grid size can provide a more accurate approximation of the desired phase transformation function, but also requires smaller etched features to implement, which can have a practical lower limit (as discussed above). Any suitable grid pattern can be employed, e.g., triangular, square, rectangular, hexagonal, and so forth. FIGS. 11A-18B show only a one-dimensional projection of the grid pattern. Because the discrete volumes 103 and the grid pattern include subwavelength features, typically there may be little or no unwanted coherent scattering or diffraction from the transmissive layer 100.

In some examples, the multitude of discrete volumes 103, or the multitude of recessed and non-recessed areas 201/202, is arranged so that, within each unit cell of the grid pattern, the discrete volumes 103, areas 201/202, or portions thereof encompassed by that unit cell are arranged according to one of a set of K predetermined unit arrangements, so that $(2\pi/\lambda_0) \cdot (n_1(\lambda_0) \cdot d_1(x,y) + n_2(\lambda_0) \cdot d_2(x,y))$, averaged over each unit cell of the grid pattern, can assume one of K discrete values. An example of a set of unit cell arrangement is illustrated schematically in FIG. 19, which shows ten different unit cells with 0 through 9 etched spots yielding K=10 discrete levels of phase delay. The effective refractive index of each unit cell varies from $n_1(\lambda_0)$ (no etched spots) in discrete steps with each additional etched spot toward $n_2(\lambda_0)$. If the etched spots do not overlap, the discrete effective index steps are nominally linear and stop short of reaching $n_2(\lambda_0)$ due to the areas of the first optical material remaining between the etched spots. If overlapping spots are employed, the effective index can reach $n_2(\lambda_0)$, but the discrete effective index steps may be nonlinear. In another such example similar to that of FIG. 19, the ten different unit cells can be etched to leave behind 0 through 9 non-etched columns yielding K=10 discrete levels of phase delay. The effective refractive index of each unit cell varies from $n_2(\lambda_0)$ (no columns) in discrete steps with each additional column toward $n_1(\lambda_0)$. If the columns do not overlap, the discrete effective index steps are nominally linear and stop short of reaching $n_1(\lambda_0)$ due to the etched areas remaining between the columns. If overlapping columns are employed, the effective index can reach $n_1(\lambda_0)$, but the discrete effective index steps may be nonlinear.

In other examples, each one of the volumes 103 or areas 201/202 is arranged so that, within each unit cell, a single simply connected volume of the first optical medium is surrounded by the second optical medium, or vice versa; some example unit cells are shown in FIG. 20. Each single simply connected volume may or may not extend the full thickness $D_T$ or to the maximum depth $D_R$ (e.g., in some examples all volumes 103 reach both surface 101 and 102, while in other examples some or all volumes 103 reach only one of the surfaces 101 or 102; in some examples all recessed areas 201 reach the maximum depth $D_R$, while in other examples some areas 201 do not reach the maximum depth). The effective index of each unit cell varies according to the size of the surrounded volume relative to the unit cell size. If a set of K discrete sizes are employed for the surrounded volumes, a corresponding set of K discrete effective refractive index steps can be realized; that discrete set can include $n_1(\lambda_0)$ or $n_2(\lambda_0)$ or both if one or more unit cells lack a surrounded volume or if the surrounded volume occupies the entirety of one or more unit cells. If a continuous size range is employed, an effectively continuous effective index range can be achieved. Such a continuous range typically would not include $n_1(\lambda_0)$ or $n_2(\lambda_0)$, due to limitations on the minimum etched feature size imposed by the particular etch process that is employed. Instead of a single surrounded volume, some or all unit cells can contain multiple surrounded volumes.

An example procedure for arranging the discrete volumes 103, or the multitude of recessed and non-recessed areas 201/202, to approximate the desired phase function $\varphi(x,y)$ proceeds as follows (assuming a substantially uniform thickness $D_T$ for the transmissive layer 100 and assuming $n_1 > n_2$; assuming a substantially uniform depth $D_R$ for the recessed areas 201). The optical element is divided into a grid with unit cells $\Lambda_0 \times \Lambda_0$ in size. In each unit cell, a local value of the phase shift $\varphi(x,y)$ is calculated by averaging over that $\Lambda_0 \times \Lambda_0$ unit cell. A refractive index needed to achieve that phase shift is calculated based on some or all of the thickness $D_T$, the depth $D_R$, the wavelength $\lambda_0$, the angle of incidence, and the indices $n_1(\lambda_0)$ and $n_2(\lambda_0)$. If a set of predetermined unit arrangements is employed, it is determined for each cell which of the predetermined unit arrangements yields an effective phase shift that most closely approximates the calculated phase shift for that cell. If a set of discrete or continuous sizes of a surrounded volume within each unit cell is employed, a size is determined that most closely approximates the calculated phase shift for that cell. After that procedure has been done for every $\Lambda_0 \times \Lambda_0$ unit cell, the resulting two-dimensional spatial pattern is physically realized in any suitable way, e.g., as a photolithography mask, as a master for replication, as a die or mold, and so forth, to achieve the spatially selective replacement of the first optical medium in those selected discrete volumes with the second optical medium, or spatially selective formation of the areas 201/202.

In another example procedure, wherein each volume 103 or area 201/202 is limited to transverse dimensions no smaller than about $\lambda_0/K$, where $2 \leq K \leq 20$, a given area of the transmissive layer 100 or the reflective surface having transverse dimensions about equal to $\lambda_0$ by $\lambda_0$ would include at most about $K^2$ distinct volumes 103 or areas 201/202. The desired phase transformation $\varphi(x,y)$ can therefore be approximated at each location by one of $K^2+1$ discrete levels, including (i) $2\pi \cdot n_1(\lambda_0) \cdot D/\lambda_0$, $2\pi \cdot n_2(\lambda_0) \cdot D/\lambda_0$, and at least $K^2-1$ intermediate values for the transmissive layer 100, or (ii) zero, $4\pi \cdot n_1(\lambda_0) \cdot D_R/\lambda_0$, and at least $K^2-1$ intermediate values for a reflective surface. Higher values of K can yield a more accurate approximation of $\varphi(x,y)$, but require higher-resolution spatially selective processing techniques and may limit the layer thickness and the corresponding maximum achievable phase shift. In many examples, $4 \leq K \leq 10$, i.e., the smallest distinct discrete volumes 103 have transverse dimensions between about $\lambda_0/4$ and about $\lambda_0/10$. In one specific example, $\lambda_0$ is about 1000 nm and K=4, yielding a minimum feature size of about 250 nm and division of any $\lambda_0 \times \lambda_0$ area into at most $K^2=16$ distinct discrete volumes 103. The desired phase transformation $\varphi(x,y)$ can therefore be approximated at each location by one of $K^2+1=17$ discrete levels, including $n_1(\lambda_0)$, $n_2(\lambda_0)$, and at least $K^2-1=15$ intermediate values between $n_1(\lambda_0)$ and $n_2(\lambda_0)$.

An example procedure for arranging the discrete volumes 103, or the multitude of recessed and non-recessed areas 201/202, to approximate the desired phase function $\varphi(x,y)$ proceeds as follows (assuming a substantially uniform thickness $D_T$ for the transmissive layer 100 and assuming $n_1 > n_2$; assuming a substantially uniform depth $D_R$ for the recessed areas 201). The optical element is divided into a grid with cells $\lambda_0 \times \lambda_0$ in size. In each cell, a local value of the phase shift $\varphi(x,y)$ is calculated by averaging over that $\lambda_0 \times \lambda_0$ cell.

A refractive index needed to achieve that phase shift is calculated based on some or all of the thickness $D_T$, the depth $D_R$, the wavelength $\lambda_0$, the angle of incidence, and the indices $n_1(\lambda_0)$ and $n_2(\lambda_0)$. An integer N with $0 \leq N \leq K^2$ is determined for each cell that yields a value of a phase shift that most closely approximates the calculated phase shift for that cell. For each cell, N discrete volumes, each $(\lambda_0/K) \times (\lambda_0/K)$ in size, are chosen for replacement of the first optical medium by the second optical medium, or for forming a recessed area 201. After that procedure has been done for every $\lambda_0 \times \lambda_0$ cell, the resulting two-dimensional spatial pattern is physically realized in any suitable way, e.g., as a photolithography mask, as a master for replication, as a die or mold, and so forth, to achieve the spatially selective replacement of the first optical medium in those selected discrete volumes with the second optical medium, or spatially selective formation of the areas 201/202.

Figure 23:
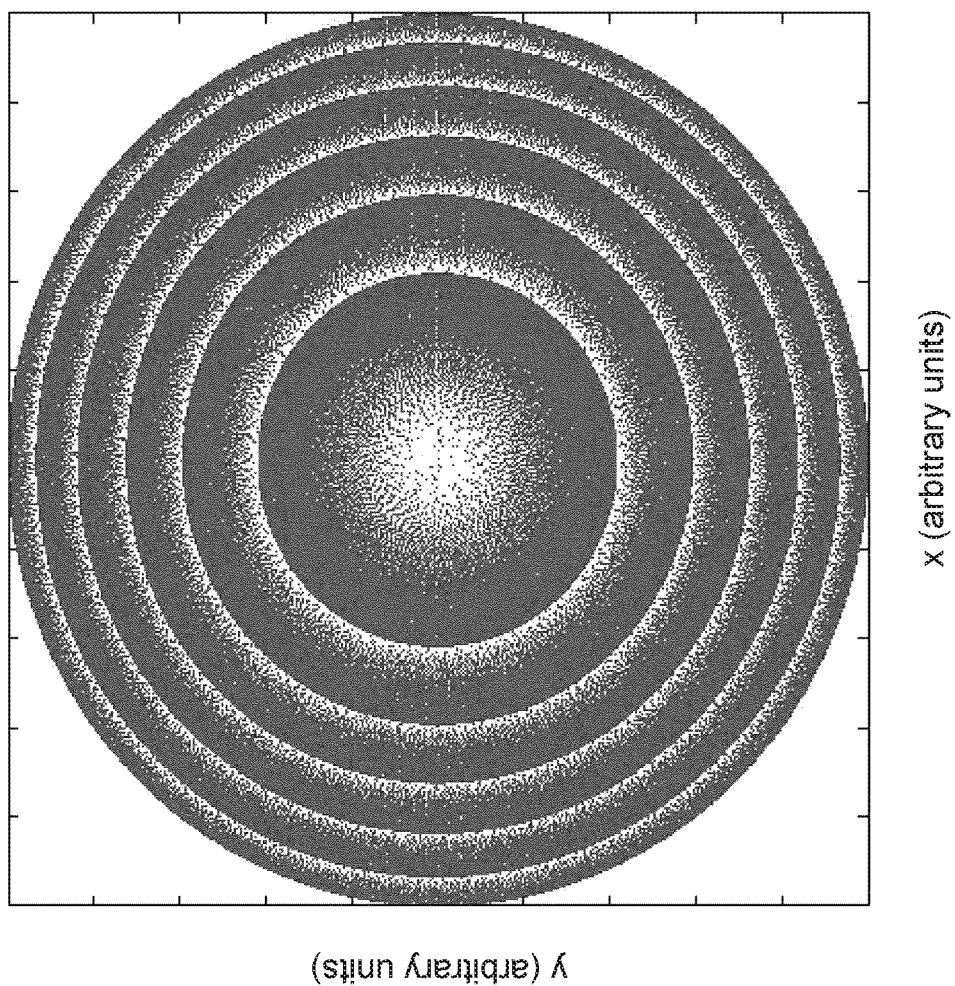
FIGS. 23 and 24 illustrate schematically a density distribution of discrete volume elements of a transmission layer of a single-pass-transmissive or double-pass-reflective optical element, or recessed areas of a surface-reflective optical element, arranged to act as a lens.
Figure 24:
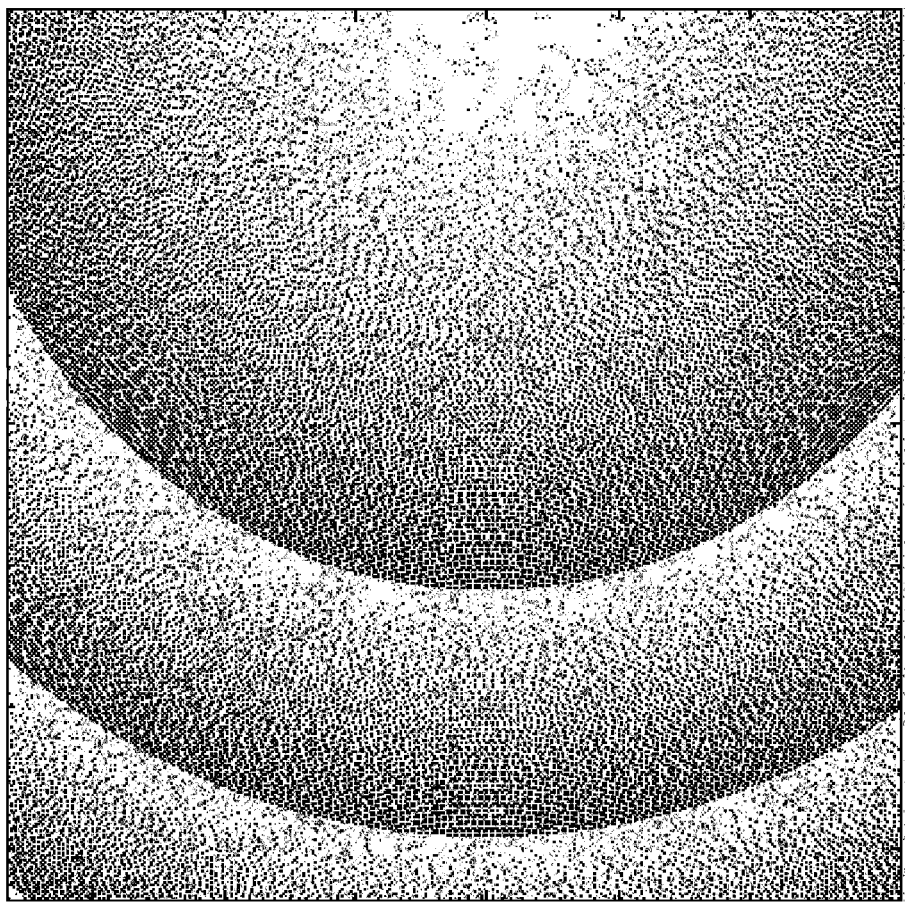
Figure 35A:
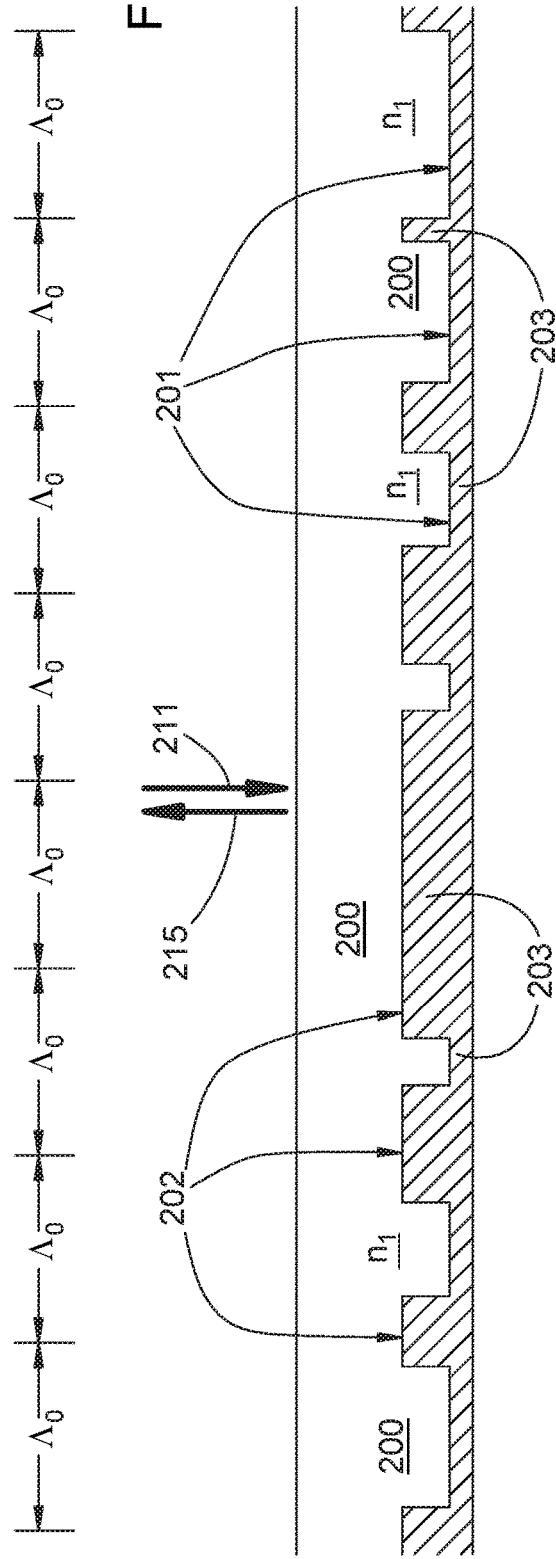
Figure 35B:
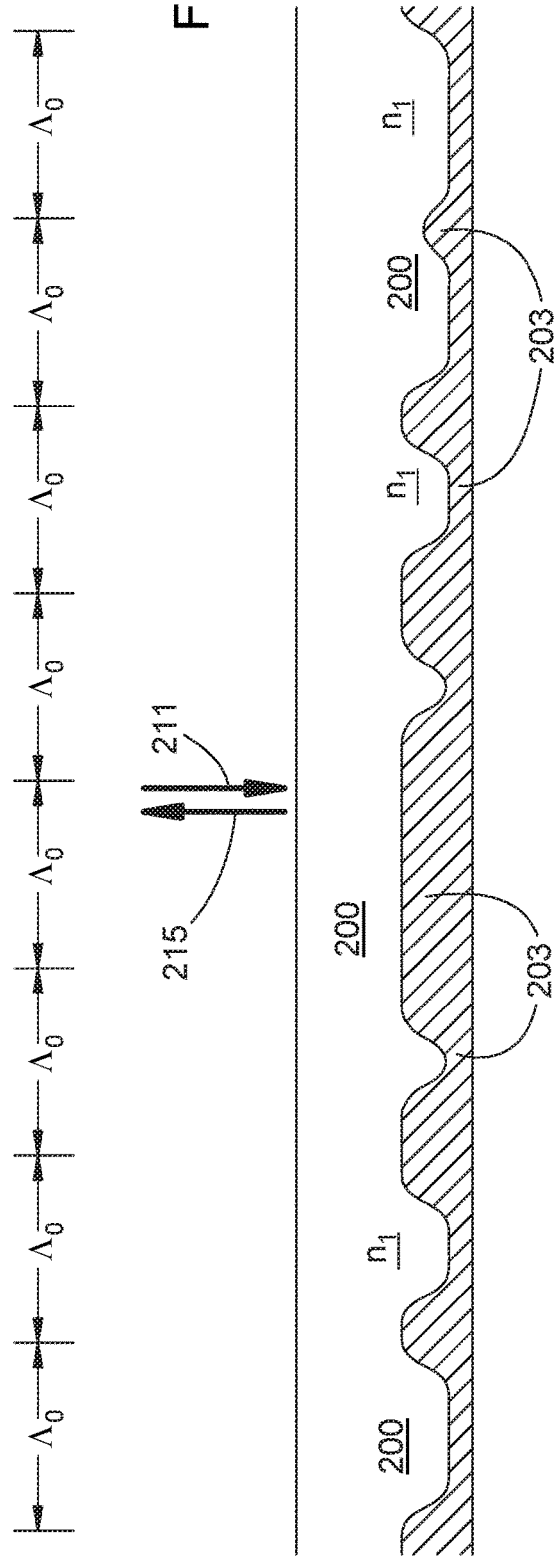
Figure 37A:
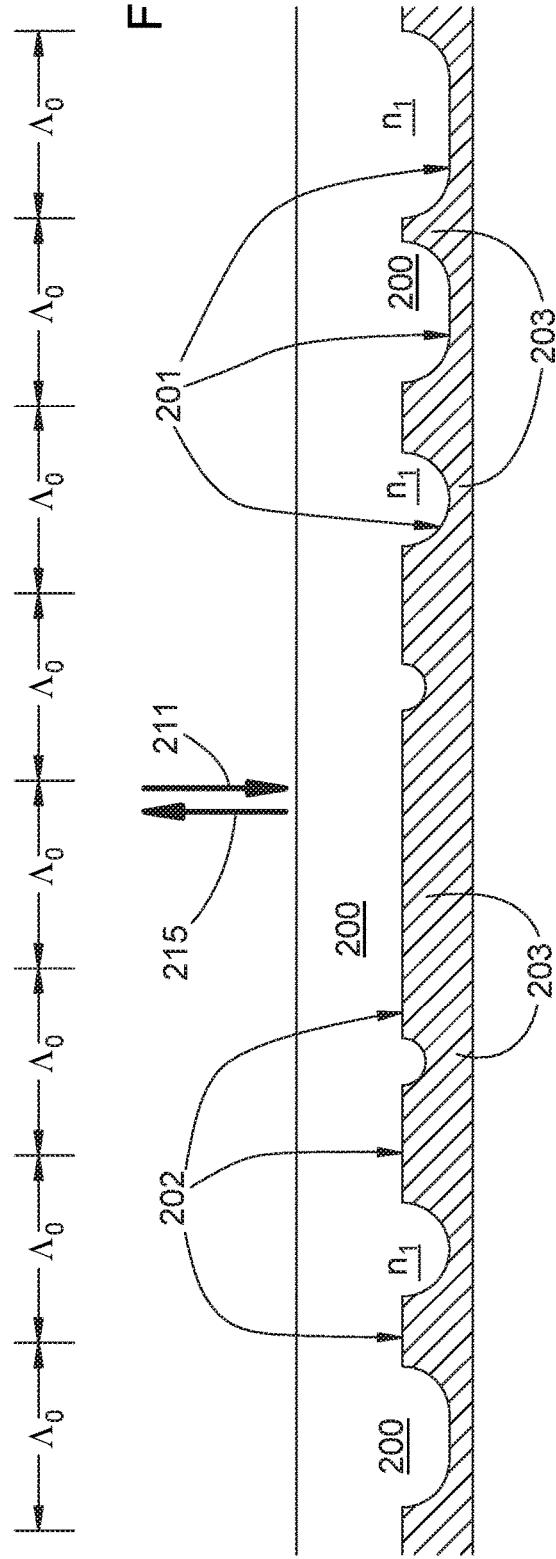
Figure 37B:
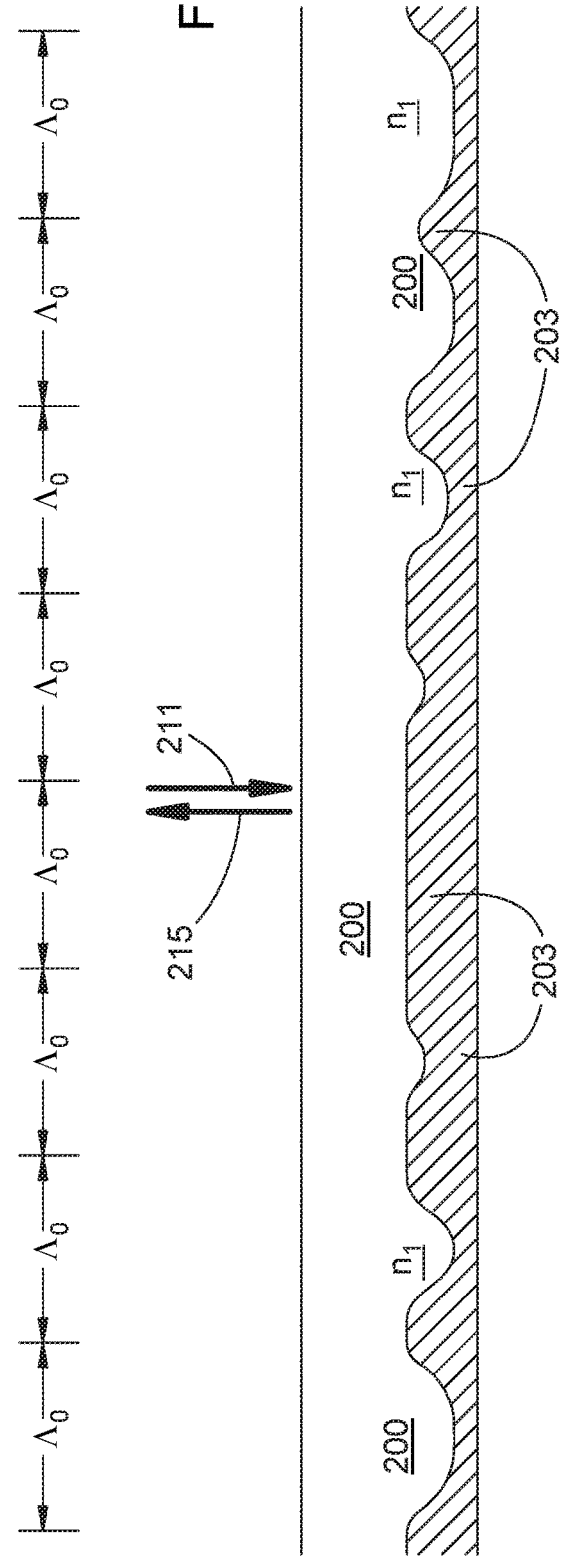

One example is illustrated schematically in FIGS. 23 and 24, which can depict: (i) a higher-index layer (light) is etched in a pattern according to one of the above procedures, with the resulting etched regions (dark) having a lower index; or (ii) recessed areas (light) formed among non-recessed areas (dark). The approximated modulo $2\pi$ quadratic phase function illustrated causes the optical element to act as a positive lens.

As noted above, the arrangements disclosed above for the volumes 103 of the transmissive layer 100 in some examples, that employ a grid or discrete patterns of spatially selective processing (e.g., as in FIGS. 19 and 20), can be equivalently employed for arranging the recessed and non-recessed areas 201/202 of the reflective surface in some examples. Two such examples are shown in FIGS. 34A/34B and 35A/35B.

Any of the spatially selective processing techniques or methodologies disclosed above for forming the transmissive payer 100 can be similarly employed for forming the recessed/non-recessed areas 201/202 or for forming any needed or desired film or layer 203/204/205. For example, directional dry etching (in some examples followed by reflow) can be employed to yield structures similar to the examples of FIG. 3A-10B or 25A-35B, or isotropic wet etching (in some examples followed by reflow) can be employed to yield structures similar to the examples of FIGS. 11A-18B, 36A/36B, and 37A/37B.

In some of the disclosed examples, it may be desirable for the distinct discrete volumes 103, or areas 201/202, to be spatially distributed across the optical element in an uncorrelated, irregular, random, or pseudo-random arrangement. Arranging the volumes 103 or areas 201/202 in an uncorrelated, irregular, random, or pseudo-random arrangement can in some instances reduce or substantially eliminate diffraction or coherent scattering of the incident optical signal. For example, a random number generator can be employed to select which N discrete volumes should be processed in each $\lambda_0 \times \lambda_0$ cell. Other algorithms can be employed, including manual manipulation of the spatial pattern In any of the preceding arrangements wherein one or both indices $n_1(\lambda_0)$ or $n_2(\lambda_0)$ are not achieved, a transmissive layer thickness $D_T$ typically would be employed that is somewhat greater than $\lambda_0/|n_1(\lambda_0)-n_2(\lambda_0)|$ (in a single-pass transmissive geometry; greater than $\lambda_0/(2|n_1(\lambda_0)-n_2(\lambda_0)|)$ for a double-pass reflective geometry) so as to provide a sufficient phase variation of at least $2\pi$ for approximating a desired phase function. In other examples, layers thinner than those values can be employed, e.g., if a full range of phase shift is not required for a particular application.

Similarly, a thickness $D_R$ can be employed in some examples that is greater than $\lambda_0/(2n_1(\lambda_0))$ to ensure that a phase shift of at least $2\pi$ can be achieved, or layers thinner than those values can be employed. For example, if the effective phase transformation function $\varphi_{\text{eff}}(x,y)$ is to be approximated by K discrete levels of phase delay (e.g., by K different types of unit cell as in FIG. 19 or 20), then $D_T$ could be as small as $(K-1) \cdot \lambda_0/(K \cdot |n_1(\lambda_0)-n_2(\lambda_0)|)$ (in a single-pass transmissive geometry) or as small as $(K-1) \cdot \lambda_0/(2K \cdot |n_1(\lambda_0)-n_2(\lambda_0)|)$ for a double-pass reflective geometry). If K=4, for instance, the K different unit cells could effect respective relative phase delays of 0, $\pi/2$, and $3\pi/2$ using a thinner layer ($2\pi$ not being needed, because 0 and $2\pi$ are equivalent; layer thickness only ¾ of that needed for a $2\pi$ phase difference). Alternatively, respective relative phase delays of $\pi$, $3\pi/2$, $2\pi$, and $5\pi/2$ could be achieved using a thicker layer (0 and $\pi/2$ not being needed, because they are equivalent to $2\pi$ and $5\pi/2$, respectively; layer thickness greater than or about equal to 5/4 of that needed for a $2\pi$ phase difference).

In any of the preceding arrangements, thorough calibration typically is required to characterize the etched feature sizes required to achieve the desired local effective index of the transmissive layer 100 or the local effective recessed depth of the reflective surface. For example, the effective index would be expected to vary roughly according to the relative volumes of the first and second optical media in a given unit cell, but of a given combination of materials, etch process, and geometry might result in deviations from that expectation. In some examples, an iterative design, fabrication, and measurement process can be employed to achieve that desired calibration. Once a calibration is done, the values for the local effective index provided by a given arrangement of discrete volumes can be relied upon for designing and fabricating the inventive etched optical elements. An example of such a calibration method includes: (A) specifying the effective phase transformation function $\varphi_{\text{eff}}(x,y)$; (B) forming an intermediate optical element by any suitable method in accordance with an estimated arrangement of the volumes or areas (with the initial estimated arrangement determined in any suitable way, including those described above); (C) measuring an intermediate phase function $\varphi_{\text{inter}}(x,y)$ imparted on a portion of an incident optical signal transmitted or reflected by the intermediate optical element; (D) altering the estimated arrangement of the volumes or areas in accordance with a difference between $\varphi_{\text{eff}}(x,y)$ and $\varphi_{\text{inter}}(x,y)$; and (E) repeating steps (B), (C), and (D) using successively altered arrangements of the volumes or areas until the difference between $\varphi_{\text{eff}}(x,y)$ and $\varphi_{\text{inter}}(x,y)$ is less than a specified allowable phase error. An intermediate optical element having the difference between $\varphi_{\text{eff}}(x,y)$ and $\varphi_{\text{inter}}(x,y)$ that is less than the specified allowable phase error is suitable for use as the optical element.

In addition to the preceding, the following Examples and the appended claims are incorporated into the description as example apparatus or methods.

Example 1

An optical element comprising a transmissive layer comprising first and second optical media, wherein: (a) the first and second optical media are substantially transparent over an operational wavelength range including a design vacuum wavelength $\lambda_0$ and are characterized by differing respective first and second wavelength-dependent bulk refractive indices $n_1(\lambda)$ and $n_2(\lambda)$, and the first optical medium comprises a substantially solid material; (b) the first and second optical media are arranged within the layer as a contiguous multitude of discrete volumes, including a non-empty subset of volumes of the multitude having a largest transverse dimension less than about $\lambda_0$, wherein each discrete volume comprises either the first optical medium or the second optical medium, but not both; (c) the optical element is structurally arranged so as to receive an optical signal, within the operational wavelength range, incident on the first surface within the transmission region and to transmit or reflect at least a portion of the incident optical signal transformed substantially according to a specified effective phase transformation function $\varphi_{\mathit{eff}}(x,y)$ that varies as a function of two-dimensional position coordinates x and y along the first surface; and (d) the discrete volumes of the multitude are variously sized and distributed on the transmissive layer so as to impart on the transmitted or reflected portion of the incident optical signal the effective phase transformation $\varphi_{\mathit{eff}}(x,y)$.

Example 2

The optical element of Example 1 wherein the first optical medium comprises a substantially solid reflowed material.

Example 3

The optical element of any one of Examples 1 or 2 wherein the optical element is structurally arranged so as to receive the incident optical signal at substantially normal incidence.

Example 4

The optical element of any one of Examples 1 or 2 wherein the optical element is structurally arranged so as to receive the incident optical signal at non-normal incidence.

Example 5

The optical element of any one of Examples 1 through 4 wherein the contiguous multitude of discrete volumes is arranged so that any given simply connected sample volume of the transmissive layer, said sample volume having both transverse dimensions about equal to $\lambda_0$ and extending through the transmissive layer from a first surface thereof to a second surface thereof, includes only the first optical medium, only the second optical medium, or both the first and second optical media of at least portions of two or more of the discrete volumes.

Example 6

The optical element of any one of Examples 1 through 5 wherein the first or second optical medium comprises one or more of: (i) one or more substantially solid doped or undoped dielectric materials, (ii) one or more substantially solid doped or undoped semiconductor materials, or (iii) one or more substantially solid doped or undoped polymers.

Example 7

The optical element of any one of Examples 1 through 6 further wherein the optical element further comprises a substantially solid substrate arranged so as to support the transmissive layer.

Example 8

The optical element of Example 7 wherein the substrate comprises material that is the same as the first optical medium.

Example 9

The optical element of Example 7 wherein the substrate comprises material differing from the first optical medium.

Example 10

The optical element of any one of Examples 7 through 9 wherein the substrate is substantially transparent over the operational wavelength range.

Example 11

The optical element of any one of Examples 7 through 10 wherein the substrate comprises one or more of: (i) one or more substantially solid doped or undoped dielectric materials, (ii) one or more substantially solid doped or undoped semiconductor materials, or (iii) one or more substantially solid doped or undoped polymers.

Example 12

The optical element of any one of Examples 1 through 11 wherein the second optical medium comprises an ambient medium that is (i) vacuum characterized by the bulk refractive index $n_2(\lambda)=1$, or (ii) gaseous or liquid material characterized by the bulk refractive index $n_2(\lambda)$.

Example 13

The optical element of any one of Examples 1 through 11 wherein the second optical medium comprises substantially solid material characterized by the bulk refractive index $n_2(\lambda)$.

Example 14

The optical element of Example 13 wherein the second optical medium comprises a substantially solid reflowed material.

Example 15

The optical element of any one of Examples 1 through 14 wherein the contiguous multitude of discrete volumes is arranged so that: (i) any locally perpendicular straight-line path, extending from a first surface of the transmissive layer to a second surface of the transmissive layer, passes through only the first optical medium, through only the second optical medium, or through only one discrete volume of each of the first and second optical media; and (ii) the discrete volumes of the multitude are distributed on the transmissive layer according to local thicknesses $d_1(x,y)$ and $d_2(x,y)$ through the first and second optical media, respectively, along the locally perpendicular straight-line path through a given position (x,y).

Example 16

The optical element of Example 15 wherein the transmissive layer includes areal regions for which either $d_1(x,y)$ or $d_2(x,y)$, but not both, is substantially equal to zero.

Example 17

The optical element of any one of Examples 15 or 16 wherein the transmissive layer includes (i) areal regions for which $d_1(x,y) \neq 0$ and $d_2(x,y)=0$, and (ii) areal regions for which $d_1(x,y)=0$ and $d_2(x,y) \neq 0$.

Example 18

The optical element of any one of Examples 15 or 16 wherein the transmissive layer includes (i) areal regions for which $d_1(x,y) \neq 0$ and $d_2(x,y)=0$, (ii) areal regions for which $d_1(x,y)=0$ and $d_2(x,y) \neq 0$, and (iii) areal regions for which $d_1(x,y) \neq 0$ and $d_2(x,y) \neq 0$.

Example 19

The optical element of any one of Examples 15 through 17 wherein, at any given position (x,y), either $d_1(x,y)$ or $d_2(x,y)$, but not both, is substantially equal to zero.

Example 20

The optical element of any one of Examples 15 through 19 wherein the transmissive layer has a substantially uniform thickness $d_1(x,y)+d_2(x,y)=D$.

Example 21

The optical element of any one of Examples 15 through 20 wherein the contiguous multitude of discrete volumes is arranged so that $(2\pi/\lambda_0) \cdot (n_1(\lambda_0) \cdot d_1(x,y) + n_2(\lambda_0) \cdot d_2(x,y))$, averaged over a sampling area having a largest transverse dimension about equal to $\lambda_0$ along the first surface, is either (i) substantially proportional to $\varphi_{eff}(x,y)$ for a transmitting optical element or (ii) substantially proportional to $\frac{1}{2} \cdot \varphi_{eff}(x,y)$ for a reflecting optical element.

Example 22

The optical element of any one of Examples 15 through 20 wherein the contiguous multitude of discrete volumes is arranged so that $(2\pi/\lambda_0) \cdot (n_1(\lambda_0) \cdot d_1(x,y) + n_2(\lambda_0) \cdot d_2(x,y))$, averaged over a sampling area having a largest transverse dimension about equal to $\lambda_0$ along the first surface, is either (i) substantially equal to $\varphi_{eff}(x,y)$ for a transmitting optical element or (ii) substantially equal to $\frac{1}{2} \cdot \varphi_{eff}(x,y)$ for a reflecting optical element.

Example 23

The optical element of any one of Examples 15 through 22 wherein the transmissive layer has a substantially uniform thickness $d_1(x,y)+d_2(x,y)=D$ that is substantially equal to $N\lambda_0/(2|n_1(\lambda_0)-n_2(\lambda_0)|)$, where N is a non-zero integer.

Example 24

The optical element of Example 23 wherein N=1.

Example 25

The optical element of Example 23 wherein N=2.

Example 26

The optical element of any one of Examples 1 through 25 further comprising a solid substrate or overlayer positioned against the first surface of the transmissive layer, wherein the substrate or overlayer against the first surface is substantially transparent over the operational wavelength range.

Example 27

The optical element of Example 26 wherein the transmissive layer comprises a surface relief structure on a surface of the substrate or overlayer against the first surface with the second optical medium substantially filling recessed regions of the surface relief structure.

Example 28

The optical element of Example 27 wherein the substrate or overlayer against the first surface comprises material differing from the first and second optical media, and the surface relief structure is formed in a surface layer of the first optical medium on the substrate.

Example 29

The optical element of Example 27 wherein the substrate or overlayer against the first surface comprises the same material as the first optical medium, and the surface relief structure is formed on a surface of the substrate.

Example 30

The optical element of any one of Examples 26 through 29 wherein the substrate or overlayer against the first surface comprises the same material as the first or second optical medium.

Example 31

The optical element of any one of Examples 26 through 29 wherein the substrate or overlayer against the first surface comprises material differing from the first and second optical media.

Example 32

The optical element of any one of Examples 26 through 31 wherein the substrate or overlayer comprises one or more of: (i) one or more substantially solid doped or undoped dielectric materials, (ii) one or more substantially solid doped or undoped semiconductor materials, or (iii) one or more substantially solid doped or undoped polymers.

Example 33

The optical element of any one of Examples 1 through 32 wherein: (c') the optical element is structurally arranged so as to receive the incident optical signal on the first surface within the transmission region and to transmit at least a portion of the incident optical signal transformed substantially according to the effective phase transformation function $\varphi_{eff}(x,y)$; and (d') the discrete volumes of the multitude are variously sized and distributed on the transmissive layer so as to impart on the transmitted portion of the incident optical signal the effective phase transformation $\varphi_{eff}(x,y)$.

Example 34

The optical element of Example 33 further comprising a solid substrate or overlayer positioned against the second surface of the transmissive layer, wherein the substrate or overlayer against the second surface is substantially transparent over the operational wavelength range.

Example 35

The optical element of Example 34 wherein the transmissive layer comprises a surface relief structure on a surface of the substrate or overlayer against the second surface with the second optical medium substantially filling recessed regions of the surface relief structure.

Example 36

The optical element of Example 35 wherein the substrate or overlayer against the second surface comprises material differing from the first and second optical media, and the surface relief structure is formed in a surface layer of the first optical medium on the substrate or overlayer.

Example 37

The optical element of Example 35 wherein the substrate or overlayer against the second surface comprises the same material as the first optical medium, and the surface relief structure is formed on a surface of the substrate or overlayer.

Example 38

The optical element of any one of Examples 34 through 37 wherein the substrate or overlayer against the second surface comprises the same material as the first or second optical medium.

Example 39

The optical element of any one of Examples 34 through 37 wherein the substrate or overlayer against the second surface comprises material differing from the first and second optical media.

Example 40

The optical element of any one of Examples 34 through 39 wherein the substrate or overlayer comprises one or more of: (i) one or more substantially solid doped or undoped dielectric materials, (ii) one or more substantially solid doped or undoped semiconductor materials, or (iii) one or more substantially solid doped or undoped polymers.

Example 41

The optical element of any one of Examples 1 through 32 further comprising a reflector facing the second surface of the transmissive layer, wherein: (c') the optical element is structurally arranged so as to receive the incident optical signal on the first surface within the transmission region and to reflect at least a portion of the incident optical signal transformed substantially according to the effective phase transformation function $\varphi_{eff}(x,y)$; and (d') the discrete volumes of the multitude are variously sized and distributed on the transmissive layer so as to impart on the reflected portion of the incident optical signal the effective phase transformation $\varphi_{eff}(x,y)$.

Example 42

The optical element of Example 41 wherein the reflector is positioned against the second surface of the transmissive layer.

Example 43

The optical element of any one of Examples 41 or 42 further comprising a substrate positioned against the reflector with the reflector positioned between the substrate and the second surface of the transmissive layer.

Example 44

The optical element any one of Examples 41 through 43 wherein the optical element further comprises a substantially solid overlayer that is substantially transparent over the operational wavelength range, and the transmissive layer is positioned between the reflector and the overlayer.

Example 45

The optical element of Example 44 wherein the overlayer comprises the first or second optical medium.

Example 46

The optical element of Example 44 wherein the overlayer comprises material different from the first and second optical media.

Example 47

The optical element of any one of Examples 44 through 46 wherein the overlayer comprises one or more of: (i) a substantially solid doped or undoped dielectric materials, (ii) one or more substantially solid doped or undoped semiconductor materials, or (iii) one or more substantially solid doped or undoped polymers.

Example 48

The optical element of any one of Examples 41 through 47 wherein the reflector includes metallic material.

Example 49

The optical element of any one of Examples 41 through 48 wherein the reflector includes one or more dielectric layers.

Example 50

The optical element of any one of Examples 1 through 49 wherein $\varphi_{eff}(x,y)$ varies with both x and y.

Example 51

The optical element of any one of Examples 1 through 50 wherein the position-dependent effective phase transformation function $\varphi_{eff}(x,y)$ is a modulo $2\pi$ function.

Example 52

The optical element of any one of Examples 1 through 51 wherein the effective phase transformation function $\varphi_{\mathit{eff}}(x,y)$ approximates a function of the form $\varphi(x,y)=Ax^2+By^2$, or $\varphi(x,y)=Ax^2+By^2$ modulo $2\pi$, where A and B are non-zero, positive or negative real numbers.

Example 53

The optical element of Example 52 wherein A=B.

Example 54

The optical element of any one of Examples 1 through 51 wherein the effective phase transformation function $\varphi_{\mathit{eff}}(x,y)$ approximates a function of the form $\varphi(\theta)=M\theta$, or $\varphi(\theta)=M\theta$ modulo $2\pi$, for $0 \le \theta < 2\pi$, where $\theta$ is related to x and y by $\cos\theta = x/(x^2+y^2)^{1/2}$ and $\sin\theta=y/(x^2+y^2)^{1/2}$ and M is a non-zero integer.

Example 55

The optical element of Example 54 wherein $M=\pm 1$.

Example 56

The optical element of any one of Examples 1 through 51 wherein the effective phase transformation function $\varphi_{\mathit{eff}}(x,y)$ approximates a sum, or a modulo $2\pi$ sum, of distinct, specified, position-dependent phase transformation functions $\varphi_1(x,y)$ and $\varphi_2(x,y)$.

Example 57

The optical element of Example 56 wherein (i) $\varphi_1(x,y)=Ax^2+By^2$, or $\varphi_1(x,y)=Ax^2+By^2$ modulo $2\pi$, where A and B are non-zero, positive or negative real numbers, and (ii) $\varphi_2(x,y)=M\theta$, or $\varphi_2(\theta)=M\theta$ modulo $2\pi$, for $0\le\theta<2\pi$, where $\theta$ is related to x and y by $\cos\theta=x/(x^2+y^2)^{1/2}$ and $\sin\theta=y/(x^2+y^2)^{1/2}$ and M is a non-zero integer.

Example 58

The optical element of any one of Examples 1 through 57 wherein each discrete volume of the multitude has a smallest transverse dimension no smaller than about $\lambda_0/K$, where $2 \le K \le 20$.

Example 59

The optical element of Example 58 wherein $4 \le K \le 10$.

Example 60

The optical element of any one of Examples 58 or 59 wherein (i) the transmissive layer has a substantially uniform thickness D, (ii) at any given position (x,y), either $d_1(x,y)=D$ and $d_2(x,y)=0$, or $d_1(x,y)=0$ and $d_2(x,y)=D$, where $d_1(x,y)$ and $d_2(x,y)$ are local thicknesses through the first and second optical media, respectively, along a locally perpendicular straight-line path through the transmissive layer at a given position (x,y), and (iii) $(2\pi/\lambda_0)\cdot(n_1(\lambda_0)\cdot d_1(x,y)+n_2(\lambda_0)\cdot d_2(x,y))$, averaged over a sampling area having transverse dimensions about equal to $\lambda_0$ by $\lambda_0$ along the first surface of the transmissive layer, can assume one of at least $K^2+1$ discrete values.

Example 61

The optical element of Example 60 wherein the at least $K^2+1$ discrete values include $2\pi\cdot n_1(\lambda_0)\cdot D/\lambda_0$, $2\pi\cdot n_2(\lambda_0)\cdot D/\lambda_0$, and at least $K^2-1$ intermediate values therebetween.

Example 62

The optical element of any one of Examples 1 through 61 wherein the discrete volumes are spatially distributed across the transmission region of the transmissive layer in an uncorrelated, irregular, random, or pseudo-random arrangement.

Example 63

The optical element of any one of Examples 1 through 57 wherein (i) the transmissive layer has a substantially uniform thickness D, and (ii) the discrete volumes of the multitude are arranged according to a regular two-dimensional grid pattern along the first surface of the transmissive layer characterized by a grid spacing of $\Lambda_0$ between about $\lambda_0/20$ and about $\lambda_0$.

Example 64

The optical element of Example 63 wherein the grid spacing is between about $\lambda_0/10$ and about $\lambda_0/2$.

Example 65

The optical element of any one of Examples 63 or 64 wherein the multitude of discrete volumes is arranged so that, within each unit cell of the grid pattern, the discrete volumes or portions thereof encompassed by that unit cell are arranged according to one of a set of K predetermined unit arrangements, so that $(2\pi/\lambda_0)\cdot(n_1(\lambda_0)\cdot d_1(x,y)+n_2(\lambda_0)\cdot d_2(x,y))$, averaged over each unit cell of the grid pattern, can assume one of K discrete values, where $d_1(x,y)$ and $d_2(x,y)$ are local thicknesses through the first and second optical media, respectively, along a locally perpendicular straight-line path through the transmissive layer at a given position (x,y), and $d_1(x,y)+d_2(x,y)=D$.

Example 66

The optical element of Example 65 wherein the K discrete values include $2\pi\cdot n_1(\lambda_0)\cdot D/\lambda_0$, $2\pi\cdot n_2(\lambda_0)\cdot(K-1)/(K\cdot D/\lambda_0)$, and $K-2$ intermediate values therebetween.

Example 67

The optical element of any one of Examples 63 or 64 wherein the multitude of discrete volumes is arranged so that (i) the discrete volumes or portions thereof encompassed by each unit cell of the grid pattern are arranged as a single simply connected volume of the first optical medium surrounded by the second optical medium and one or both of the first and second surfaces or (ii) the discrete volumes or portions thereof encompassed by each unit cell of the grid pattern are arranged as a single simply connected volume of the second optical medium surrounded by the first optical medium and one or both of the first and second surfaces, so that $(2\pi/\lambda_0)\cdot(n_1(\lambda_0)\cdot d_1(x,y)+n_2(\lambda_0)\cdot d_2(x,y))$, averaged over each unit cell of the grid pattern, can assume a substantially continuous range of values according to a size of each unit cell occupied by the corresponding simply connected volume.

Example 68

The optical element of Example 67 wherein the substantially continuous range of values extends from about $2\pi \cdot n_1(\lambda_0) \cdot D/\lambda_0$ to about $2\pi \cdot n_2(\lambda_0) \cdot D/\lambda_0$.

Example 69

A method employing the optical element of any one of Examples 1 through 68, the method comprising (i) directing an optical signal onto the first surface of the transmissive layer of the optical element and (ii) transmitting through or reflecting from the optical element at least a portion of the incident optical signal transformed substantially according to the effective phase transformation function $\varphi_{\mathit{eff}}(x,y)$.

Example 70

A method for making the optical element of any one of Examples 1 through 68, the method comprising spatially selectively processing a layer comprising the first optical medium to replace, in selected volumes of the layer, the first optical medium with the second optical medium, thereby forming the transmissive layer of the optical element.

Example 71

A method for making the optical element of any one of Examples 1 through 68, the method comprising: (A) specifying the effective phase transformation function $\varphi_{\mathit{eff}}(x,y)$; (B) forming an intermediate optical element by spatially selectively processing a layer comprising the first optical medium to replace, in selected volumes of the first optical medium, the first optical medium with the second optical medium, in accordance with an estimated arrangement of the volumes of the multitude; (C) measuring an intermediate phase function $\varphi_{\mathit{inter}}(x,y)$ imparted on a portion of an incident optical signal transmitted or reflected by the intermediate optical element; (D) altering the estimated arrangement of the volumes of the multitude in accordance with a difference between $\varphi_{\mathit{eff}}(x,y)$ and $\varphi_{\mathit{inter}}(x,y)$; and (E) repeating steps (B), (C), and (D) using successively altered arrangements of the volumes of the multitude until the difference between $\varphi_{\mathit{eff}}(x,y)$ and $\varphi_{\mathit{inter}}(x,y)$ is less than a specified allowable phase error, (F) wherein the optical element is the intermediate optical element having the difference between $\varphi_{\mathit{eff}}(x,y)$ and $\varphi_{\mathit{inter}}(x, y)$ that is less than the specified allowable phase error.

Example 72

A method for making the optical element of any one of Examples 1 through 68, the method comprising: (A) spatially selectively processing a layer comprising the first optical medium to remove the first optical medium from selected volumes of the first optical medium, so that the first optical medium is arranged according to a local thickness $d_1(x,y)$ through the first optical medium along a locally perpendicular straight-line path through the transmissive layer at a given position (x,y) along the transmissive layer; (B) heating the transmissive layer so as to cause at least partial reflow of the first optical medium, so that (i) the first optical medium is arranged according to a local thickness $d_{1R}(x,y)$ through the first optical medium along a locally perpendicular straight-line path through the transmissive layer at a given position (x,y) along the transmissive layer, and (ii) over at least a portion of the transmissive layer, $d_{1R}(x,y) \neq d_1(x,y)$; and (C) arranging a second optical medium to form a portion of the transmissive layer, so that the second optical medium is arranged according to a local thickness $d_{2R}(x,y)$ through the second optical medium along a locally perpendicular straight-line path through the transmissive layer at a given position (x,y) along the transmissive layer, wherein: (D) the first and second optical media are substantially transparent over an operational wavelength range including a design vacuum wavelength $\lambda_0$ and are characterized by differing respective first and second wavelength-dependent bulk refractive indices $n_1(\lambda)$ and $n_2(\lambda)$, and the first optical medium comprises substantially solid material; (E) after part (A) and before part (B), (i) the transmissive layer is arranged as a contiguous multitude of discrete volumes, including a non-empty subset of volumes of the multitude having a largest transverse dimension less than about $\lambda_0$, and (ii) each volume of the multitude either comprises the first optical medium or is one of the selected volumes from which the first optical medium was removed in part (A); (F) the optical element is structurally arranged so as to receive an optical signal incident on the transmissive layer and to transmit or reflect at least a portion of the incident optical signal transformed substantially according to a specified effective phase transformation function $\varphi_{\mathit{eff}}(x,y)$ that varies as a function of two-dimensional position coordinates x and y along the first surface; and (G) the discrete volumes of the multitude are variously sized and distributed on the transmissive layer so that, after parts (A), (B), and (C), the transmissive layer is arranged so as to impart on the transmitted or reflected portion of the incident optical signal the effective phase transformation $\varphi_{\mathit{eff}}(x,y)$.

Example 73

A method for making an optical element comprising a transmissive layer comprising first and second optical media, the method comprising: (A) spatially selectively processing a layer comprising the first optical medium to remove the first optical medium from selected volumes of the first optical medium, so that the first optical medium is arranged according to a local thickness $d_1(x,y)$ through the first optical medium along a locally perpendicular straight-line path through the transmissive layer at a given position (x,y) along the transmissive layer; (B) heating the transmissive layer so as to cause at least partial reflow of the first optical medium, so that (i) the first optical medium is arranged according to a local thickness $d_{1R}(x,y)$ through the first optical medium along a locally perpendicular straight-line path through the transmissive layer at a given position (x,y) along the transmissive layer, and (ii) over at least a portion of the transmissive layer, $d_{1R}(x,y) \neq d_1(x,y)$; and (C) arranging a second optical medium to form a portion of the transmissive layer, so that the second optical medium is arranged according to a local thickness $d_{2R}(x,y)$ through the second optical medium along a locally perpendicular straight-line path through the transmissive layer at a given position (x,y) along the transmissive layer, wherein: (D) the first and second optical media are substantially transparent over an operational wavelength range including a design vacuum wavelength $\lambda_0$ and are characterized by differing respective first and second wavelength-dependent bulk refractive indices $n_1(\lambda)$ and $n_2(\lambda)$, and the first optical medium comprises substantially solid material; (E) after part (A) and before part (B), (i) the transmissive layer is arranged as a contiguous multitude of discrete volumes, including a non-empty subset of volumes of the multitude having a largest transverse dimension less than about $\lambda_0$, and (ii) each volume of the multitude either comprises the first optical medium or is one of the selected volumes from which the first optical medium was removed in part (A); (F) the optical element is structurally arranged so as to receive an optical signal incident on the transmissive layer and to transmit or reflect at least a portion of the incident optical signal transformed substantially according to a specified effective phase transformation function $\varphi_{eff}(x,y)$ that varies as a function of two-dimensional position coordinates x and y along the first surface; and (G) the discrete volumes of the multitude are variously sized and distributed on the transmissive layer so that, after parts (A), (B), and (C), the transmissive layer is arranged so as to impart on the transmitted or reflected portion of the incident optical signal the effective phase transformation $\varphi_{eff}(x,y)$.

Example 74

The method of Example 73, the method further comprising: (A') specifying the effective phase transformation function $\varphi_{eff}(x,y)$; (B') performing the method of claim 70 to form an intermediate optical element in accordance with an estimated arrangement of the volumes of the multitude and an estimated reflow process sequence; (C') measuring an intermediate phase function $\varphi_{inter}(x,y)$ imparted on a portion of an incident optical signal transmitted or reflected by the intermediate optical element; (D') altering the estimated arrangement of the volumes of the multitude, or the reflow process sequence, in accordance with a difference between $\varphi_{eff}(x,y)$ and $\varphi_{inter}(x,y)$; and (E') repeating steps (B'), (C'), and (D') using successively altered arrangements of the volumes of the multitude or reflow process sequences until the difference between $\varphi_{eff}(x,y)$ and $\varphi_{inter}(x,y)$ is less than a specified allowable phase error, (F') wherein the optical element is the intermediate optical element having the difference between $\varphi_{eff}(x,y)$ and $\varphi_{inter}(x, y)$ that is less than the specified allowable phase error.

Example 75

The method of any one of Examples 73 or 74 wherein, after part (A) and before part (B), any locally perpendicular straight-line path through the transmissive layer passes through only a volume comprising the first optical medium, through only a volume from which the first optical medium was removed in part (A), or through only one volume of each type.

Example 76

The method of any one of Examples 73 through 75 wherein the optical element is structurally arranged so as to receive the incident optical signal at substantially normal incidence.

Example 77

The method of any one of Examples 73 through 75 wherein the optical element is structurally arranged so as to receive the incident optical signal at non-normal incidence.

Example 78

The method of any one of Examples 73 through 77 wherein the first or second optical medium comprises one or more of: (i) one or more substantially solid doped or undoped dielectric materials, (ii) one or more substantially solid doped or undoped semiconductor materials, or (iii) one or more substantially solid doped or undoped polymers.

Example 79

The method of any one of Examples 73 through 78 further wherein the optical element further comprises a substantially solid substrate arranged so as to support the transmissive layer.

Example 80

The method of Example 79 wherein the substrate comprises material that is the same as the first optical medium.

Example 81

The method of Example 79 wherein the substrate comprises material that is different from the first optical medium.

Example 82

The method of any one of Examples 79 through 81 wherein the substrate is substantially transparent over the operational wavelength range.

Example 83

The method of any one of Examples 79 through 82 wherein the substrate comprises one or more of: (i) one or more substantially solid doped or undoped dielectric materials, (ii) one or more substantially solid doped or undoped semiconductor materials, or (iii) one or more a substantially solid doped or undoped polymers.

Example 84

The method of any one of Examples 73 through 83 wherein the second optical medium comprises an ambient medium that is (i) vacuum characterized by the bulk refractive index $n_2(\lambda)=1$, or (ii) gaseous or liquid material characterized by the bulk refractive index $n_2(\lambda)$.

Example 85

The method of any one of Examples 73 through 83 wherein the second optical medium comprises substantially solid material characterized by the bulk refractive index $n_2(\lambda)$.

Example 86

The method of Example 85 wherein part (C) is performed only after part (B).

Example 87

The method of Example 85 wherein: (H) the second optical medium comprises substantially solid material; (I) part (A) includes replacing, in the selected volumes of the first optical medium, the first optical medium with the second optical medium, so that the second optical medium is arranged according to a local thickness $d_2(x,y)$ through the second optical medium along a locally perpendicular straight-line path through the transmissive layer at a given position (x,y) along the transmissive layer; and (J) part (C) includes the heating of part (B) that causes at least partial reflow of the second optical medium, so that (i) the second optical medium is arranged according to the local thickness $d_{2R}(x,y)$ through the second optical medium along a locally perpendicular straight-line path through the transmissive layer at a given position (x,y) along the transmissive layer, and (ii) over at least a portion of the transmissive layer, $d_{2R}(x,y) \neq d_2(x,y)$.

Example 88

The method of Example 87 wherein, after part (A) and before the heating of part (B), the first and second optical media are arranged according to the respective local thicknesses $d_1(x,y)$ and $d_2(x,y)$ so that $(2\pi/\lambda_0) \cdot (n_1(\lambda_0) \cdot d_1(x,y) + n_2(\lambda_0) \cdot d_2(x,y))$, averaged over a sampling area having a largest transverse dimension about equal to $\lambda_0$ along the transmissive layer, is substantially equal to $\varphi_{eff}(x,y)$ for a transmitting optical element or substantially equal to $\frac{1}{2} \cdot \varphi_{eff}(x,y)$ for a reflecting optical element.

Example 89

The method of any one of Examples 87 or 88 wherein, after part (A) and before the heating of part (B), the transmissive layer has a substantially uniform thickness $d_1(x,y) + d_2(x,y) = D$.

Example 90

The method of any one of Examples 87 through 89 wherein, after part (A) and before the heating of part (B), the transmissive layer includes areal regions for which either $d_1(x,y)$ or $d_2(x,y)$, but not both, is substantially equal to zero.

Example 91

The method of any one of Examples 87 through 90 wherein, after part (A) and before the heating of part (B), the transmissive layer includes (i) areal regions for which $d_1(x,y) \neq 0$ and $d_2(x,y) = 0$ and (ii) areal regions for which $d_1(x,y) = 0$ and $d_2(x,y) \neq 0$.

Example 92

The method of any one of Examples 87 through 90 wherein, after part (A) and before the heating of part (B), the transmissive layer includes (i) areal regions for which $d_1(x,y) \neq 0$ and $d_2(x,y) = 0$, (ii) areal regions for which $d_1(x,y) = 0$ and $d_2(x,y) \neq 0$, and (iii) areal regions for which $d_1(x,y) \neq 0$ and $d_2(x,y) \neq 0$.

Example 93

The method of any one of Examples 85 through 92 wherein the second optical medium is arranged so that $d_{2R}(x,y) \neq 0$ over the entire transmissive layer.

Example 94

The method of any one of Examples 73 through 93 wherein, after parts (A), (B), and (C), the transmissive layer is arranged so that $(2\pi/\lambda_0) \cdot (n_1(\lambda_0) \cdot d_{1R}(x,y) + n_2(\lambda_0) \cdot d_{2R}(x,y))$, as a function of two-dimensional position coordinates x and y along the transmissive layer, averaged over a sampling area having a largest transverse dimension about equal to $\lambda_0$ along the transmissive layer, is substantially proportional to a specified position-dependent effective phase transformation function $\varphi_{eff}(x,y)$ for a transmitting optical element, or substantially proportional to $\frac{1}{2} \cdot \varphi_{eff}(x,y)$ for a reflecting optical element.

Example 95

The method of any one of Examples 73 through 93 wherein, after parts (A), (B), and (C), the transmissive layer is arranged so that $(2\pi/\lambda_0) \cdot (n_1(\lambda_0) \cdot d_{1R}(x,y) + n_2(\lambda_0) \cdot d_{2R}(x,y))$, as a function of two-dimensional position coordinates x and y along the transmissive layer, averaged over a sampling area having a largest transverse dimension about equal to $\lambda_0$ along the transmissive layer, is substantially equal to a specified position-dependent effective phase transformation function $\varphi_{eff}(x,y)$ for a transmitting optical element, or substantially equal to $\frac{1}{2} \cdot \varphi_{eff}(x,y)$ for a reflecting optical element.

Example 96

The method of any one of Examples 73 through 95 wherein the transmissive layer has a substantially uniform thickness $d_1(x,y) + d_2(x,y) = D$ that is substantially equal to $N\lambda_0/(2|n_1(\lambda_0) - n_2(\lambda_0)|)$, where N is a non-zero integer.

Example 97

The method of Example 96 wherein N=1.

Example 98

The method of Example 96 wherein N=2.

Example 99

The method of any one of Examples 73 through 98 wherein: (F') the optical element is structurally arranged so as to receive an optical signal incident on the transmissive layer and to transmit at least a portion of the incident optical signal transformed substantially according to the effective phase transformation function $\varphi_{eff}(x,y)$; and (G') the discrete volumes of the multitude are variously sized and distributed on the transmissive layer so that, after parts (A), (B), and (C), the transmissive layer is arranged so as to impart on the transmitted portion of the incident optical signal the effective phase transformation $\varphi_{eff}(x,y)$.

Example 100

The method of Example 99 wherein the optical element further comprises a substantially solid substrate arranged so as to support the transmissive layer, and the substrate is substantially transparent over the operational wavelength range.

Example 101

The method of Example 100 wherein the substrate comprises material that is the same as the first optical medium.

Example 102

The method of Example 100 wherein the substrate comprises material that is different from the first optical medium.

Example 103

The method of any one or Examples 100 through 102 wherein the optical element further comprises a substantially solid overlayer that is substantially transparent over the operational wavelength range, and the transmissive layer is positioned between the substrate and the overlayer.

Example 104

The method of Example 103 wherein the overlayer comprises the first or second optical medium.

Example 105

The method of Example 103 wherein the overlayer comprises material different from the first and second optical media.

Example 106

The method of any one of Examples 103 through 105 wherein the overlayer comprises one or more of: (i) one or more substantially solid doped or undoped dielectric materials, (ii) one or more substantially solid doped or undoped semiconductor materials, or (iii) one or more substantially solid doped or undoped polymers.

Example 107

The method of any one of Examples 73 through 98 wherein the optical element further comprises a reflector positioned on a surface of the transmissive layer, and wherein: (F') the optical element is structurally arranged so as to receive an optical signal incident on the transmissive layer and to reflect at least a portion of the incident optical signal transformed substantially according to the effective phase transformation function $\varphi_{eff}(x,y)$; and (G') the discrete volumes of the multitude are variously sized and distributed on the transmissive layer so that, after parts (A), (B), and (C), the transmissive layer is arranged so as to impart on the reflected portion of the incident optical signal the effective phase transformation $\varphi_{eff}(x,y)$.

Example 108

The method of Example 107 wherein the optical element further comprises a substantially solid substrate arranged so as to support the transmissive layer, and the reflector is positioned between the substrate and the transmissive layer.

Example 109

The method of Example 108 wherein the optical element further comprises a substantially solid overlayer that is substantially transparent over the operational wavelength range, and the transmissive layer is positioned between the reflector and the overlayer.

Example 110

The method of Example 109 wherein the overlayer comprises the first or second optical medium.

Example 111

The method of Example 109 wherein the overlayer comprises material different from the first and second optical media.

Example 112

The method of any one of Examples 109 through 111 wherein the overlayer comprises one or more of: (i) one or more substantially solid doped or undoped dielectric materials, (ii) one or more substantially solid doped or undoped semiconductor materials, or (iii) one or more substantially solid doped or undoped polymer.

Example 113

The method of Example 107 wherein the optical element further comprises a substantially solid substrate arranged so as to support the transmissive layer, the transmissive layer is positioned between the substrate and the reflector, and the substrate is substantially transparent over the operational wavelength range.

Example 114

The method of Example 113 wherein the substrate comprises material that is the same as the first optical medium.

Example 115

The method of Example 113 wherein the substrate comprises material that is different from the first optical medium.

Example 116

The method of any one of Examples 108 through 115 wherein the substrate comprises one or more of: (i) one or more substantially solid doped or undoped dielectric materials, (ii) one or more substantially solid doped or undoped semiconductor materials, or (iii) one or more substantially solid doped or undoped polymers.

Example 117

The method of any one of Examples 107 through 116 wherein the reflector includes metallic material.

Example 118

The method of any one of Examples 107 through 117 wherein the reflector includes one or more dielectric layers.

Example 119

The method of any one of Examples 73 through 118 wherein $\varphi_{eff}(x,y)$ varies with both x and y.

Example 120

The method of any one of Examples 73 through 119 wherein the position-dependent effective phase transformation function $\varphi_{eff}(x,y)$ is a modulo $2\pi$ function.

Example 121

The method of any one of Examples 73 through 120 wherein the effective phase transformation function $\varphi_{eff}(x,y)$ approximates a function of the form $\varphi(x,y)=Ax^2+By^2$, or $\varphi(x,y)=Ax^2+By^2$ modulo $2\pi$, where A and B are non-zero, positive or negative real numbers.

Example 122

The method of Example 121 wherein A=B.

Example 123

The method of any one of Examples 73 through 120 wherein the effective phase transformation function $\varphi_{eff}(x,y)$ approximates a function of the form $\varphi(\theta)=M\theta$, or $\varphi(\theta)=M\theta$ modulo $2\pi$, for $0\leq\theta<2\pi$, where $\theta$ is related to x and y by $\cos\theta=x/(x^2+y^2)^{1/2}$ and $\sin\theta=y/(x^2+y^2)^{1/2}$ and M is a non-zero integer.

Example 124

The method of Example 123 wherein $M=\pm 1$.

Example 125

The method of any one of Examples 73 through 120 wherein the effective phase transformation function $\varphi_{eff}(x,y)$ approximates a sum, or a modulo $2\pi$ sum, of distinct, specified, position-dependent phase transformation functions $\varphi_1(x,y)$ and $\varphi_2(x,y)$.

Example 126

The method of Example 125 wherein (i) $\varphi_1(x,y)=Ax^2+By^2$, or $\varphi_1(x,y)=Ax^2+By^2$ modulo $2\pi$, where A and B are non-zero, positive or negative real numbers, and (ii) $\varphi_2(x,y)=M\theta$, or $\varphi_2(\theta)=M\theta$ modulo $2\pi$, for $0\leq\theta<2\pi$, where $\theta$ is related to x and y by $\cos\theta=x/(x^2+y^2)^{1/2}$ and $\sin\theta=y/(x^2+y^2)^{1/2}$ and M is a non-zero integer.

Example 127

The method of any one of Examples 73 through 126 wherein each discrete volume of the multitude has a smallest transverse dimension no smaller than about $\lambda_0/K$, where $2\leq K\leq 20$.

Example 128

The method of Example 127 wherein $4\leq K\leq 10$.

Example 129

The method of any one of Examples 127 or 128 wherein, after part (A) and before the heating of part (B), (i) the transmissive layer has a substantially uniform thickness D, (ii) at any given position (x,y), either $d_1(x,y)=D$ and $d_2(x,y)=0$, or $d_1(x,y)=0$ and $d_2(x,y)=D$, and (iii) $(2\pi/\lambda_0)\cdot(n_1(\lambda_0)\cdot d_1(x,y)+n_2(\lambda_0)\cdot d_2(x,y))$, averaged over a sampling area having transverse dimensions about equal to $\lambda_0$ by $\lambda_0$ along the first surface of the transmissive layer, can assume one of at least $K^2+1$ discrete values.

Example 130

The method of Example 129 wherein the at least $K^2+1$ discrete values include $2\pi\cdot n_1(\lambda_0)\cdot D/\lambda_0$, $2\pi\cdot n_2(\lambda_0)\cdot D/\lambda_0$, and at least $K^2-1$ intermediate values therebetween.

Example 131

The method of any one of Examples 73 through 129 wherein, after part (A) and before the heating of part (B), the discrete volumes are spatially distributed across the transmission region of the transmissive layer in an uncorrelated, irregular, random, or pseudo-random arrangement.

Example 132

The method of any one of Examples 73 through 126 wherein, after part (A) and before the heating of part (B), (i) the transmissive layer has a substantially uniform thickness $d_1(x,y)+d_2(x,y)=D$, and (ii) the discrete volumes of the multitude are arranged according to a regular two-dimensional grid pattern along the first surface of the transmissive layer characterized by a grid spacing of $\Lambda_0$ between about $\lambda_0/20$ and about $\lambda_0$.

Example 133

The method of Example 132 wherein the grid spacing of $\Lambda_0$ is between about $\lambda_0/10$ and about $\lambda_0/2$.

Example 134

The method of any one of Examples 132 or 133 wherein, after part (A) and before the heating of part (B), the multitude of discrete volumes is arranged so that, within each unit cell of the grid pattern, the discrete volumes or portions thereof encompassed by that unit cell are arranged according to one of a set of K predetermined unit arrangements, so that $(2\pi/\lambda_0)\cdot(n_1(\lambda_0)\cdot d_1(x,y)+n_2(\lambda_0)\cdot d_2(x,y))$, averaged over each unit cell of the grid pattern, can assume one of K discrete values.

Example 135

The method of Example 134 wherein the K discrete values include $2\pi\cdot n_1(\lambda_0)\cdot D/\lambda_0$, $2\pi\cdot n_2(\lambda_0)\cdot D\cdot(K-1)/(K\cdot\lambda_0)$, and K−2 intermediate values therebetween.

Example 136

The method of any one of Examples 132 or 133 wherein, after part (A) and before the heating of part (B), the multitude of discrete volumes is arranged so that (i) the discrete volumes or portions thereof encompassed by each unit cell of the grid pattern are arranged as a single simply connected volume of the first optical medium surrounded by the second optical medium and one or both of the first and second surfaces or (ii) the discrete volumes or portions thereof encompassed by each unit cell of the grid pattern are arranged as a single simply connected volume of the second optical medium surrounded by the first optical medium and one or both of the first and second surfaces, so that $(2\pi/\lambda_0)\cdot(n_1(\lambda_0)\cdot d_1(x,y)+n_2(\lambda_0)\cdot d_2(x,y))$, averaged over each unit cell of the grid pattern, can assume a substantially continuous range of values according to a size of each unit cell occupied by the corresponding simply connected volume.

Example 137

The method of Example 136 wherein the substantially continuous range of values extends from about $2\pi\cdot n_1(\lambda_0)\cdot D/\lambda_0$ to about $2\pi\cdot n_2(\lambda_0)\cdot D/\lambda_0$.

It is intended that equivalents of the disclosed example embodiments and methods shall fall within the scope of the present disclosure or appended claims. It is intended that the disclosed example embodiments and methods, and equivalents thereof, may be modified while remaining within the scope of the present disclosure or appended claims.

In the foregoing Detailed Description, various features may be grouped together in several example embodiments for the purpose of streamlining the disclosure. This method of disclosure is not to be interpreted as reflecting an intention that any claimed embodiment requires more features than are expressly recited in the corresponding claim. Rather, as the appended claims reflect, inventive subject matter may lie in less than all features of a single disclosed example embodiment. Thus, the appended claims are hereby incorporated into the Detailed Description, with each claim standing on its own as a separate disclosed embodiment. However, the present disclosure shall also be construed as implicitly disclosing any embodiment having any suitable set of one or more disclosed or claimed features (i.e., a set of features that are neither incompatible nor mutually exclusive) that appear in the present disclosure or the appended claims, including those sets that may not be explicitly disclosed herein. In addition, for purposes of disclosure, each of the appended dependent claims shall be construed as if written in multiple dependent form and dependent upon all preceding claims with which it is not inconsistent. It should be further noted that the scope of the appended claims does not necessarily encompass the whole of the subject matter disclosed herein.

For purposes of the present disclosure and appended claims, the conjunction "or" is to be construed inclusively (e.g., "a dog or a cat" would be interpreted as "a dog, or a cat, or both"; e.g., "a dog, a cat, or a mouse" would be interpreted as "a dog, or a cat, or a mouse, or any two, or all three"), unless: (i) it is explicitly stated otherwise, e.g., by use of "either . . . or," "only one of," or similar language; or (ii) two or more of the listed alternatives are mutually exclusive within the particular context, in which case "or" would encompass only those combinations involving non-mutually-exclusive alternatives. For purposes of the present disclosure and appended claims, the words "comprising," "including," "having," and variants thereof, wherever they appear, shall be construed as open-ended terminology, with the same meaning as if the phrase "at least" were appended after each instance thereof, unless explicitly stated otherwise. For purposes of the present disclosure or appended claims, when terms are employed such as "about equal to," "substantially equal to," "greater than about," "less than about," and so forth, in relation to a numerical quantity, standard conventions pertaining to measurement precision and significant digits shall apply, unless a differing interpretation is explicitly set forth. For null quantities described by phrases such as "substantially prevented," "substantially absent," "substantially eliminated," "about equal to zero," "negligible," and so forth, each such phrase shall denote the case wherein the quantity in question has been reduced or diminished to such an extent that, for practical purposes in the context of the intended operation or use of the disclosed or claimed apparatus or method, the overall behavior or performance of the apparatus or method does not differ from that which would have occurred had the null quantity in fact been completely removed, exactly equal to zero, or otherwise exactly nulled.

For purposes of the present disclosure and appended claims, any labelling of elements, steps, limitations, or other portions of an example or claim (e.g., first, second, etc., (a), (b), (c), etc., or (i), (ii), (iii), etc.) is only for purposes of clarity, and shall not be construed as implying any sort of ordering or precedence of the portions so labelled. If any such ordering or precedence is intended, it will be explicitly recited in the example or claim or, in some instances, it will be implicit or inherent based on the specific content of the example or claim. In the appended claims, if the provisions of 35 USC § 112(f) are desired to be invoked in an apparatus claim, then the word "means" will appear in that apparatus claim. If those provisions are desired to be invoked in a method claim, the words "a step for" will appear in that method claim. Conversely, if the words "means" or "a step for" do not appear in a claim, then the provisions of 35 USC § 112(f) are not intended to be invoked for that claim.

If any one or more disclosures are incorporated herein by reference and such incorporated disclosures conflict in part or whole with, or differ in scope from, the present disclosure, then to the extent of conflict, broader disclosure, or broader definition of terms, the present disclosure controls. If such incorporated disclosures conflict in part or whole with one another, then to the extent of conflict, the later-dated disclosure controls.

The Abstract is provided as required as an aid to those searching for specific subject matter within the patent literature. However, the Abstract is not intended to imply that any elements, features, or limitations recited therein are necessarily encompassed by any particular claim. The scope of subject matter encompassed by each claim shall be determined by the recitation of only that claim.

What is claimed is:

1. An optical element comprising a transmissive layer comprising first and second optical media, wherein:
   (a) the first and second optical media are substantially transparent over an operational wavelength range including a design vacuum wavelength $\lambda_0$ and are characterized by differing respective first and second wavelength-dependent bulk refractive indices $n_1(\lambda)$ and $n_2(\lambda)$, and the first optical medium comprises a substantially solid reflowed material;
   (b) the first and second optical media are arranged within the layer as a contiguous multitude of discrete volumes, including a non-empty subset of volumes of the multitude having a largest transverse dimension less than about $\lambda_0$, wherein each discrete volume comprises either the first optical medium or the second optical medium, but not both;
   (c) the optical element is structurally arranged so as to receive an optical signal, within the operational wavelength range, incident on the first surface within a transmission region and to transmit or reflect at least a portion of the incident optical signal transformed substantially according to a specified effective phase transformation function $\varphi_{eff}(x,y)$ that varies as a function of two-dimensional position coordinates x and y along the first surface; and
   (d) the discrete volumes of the multitude are variously sized and distributed on the transmissive layer so as to impart on the transmitted or reflected portion of the incident optical signal the effective phase transformation $\varphi_{eff}(x,y)$.

2. The optical element of claim 1 wherein the second optical medium comprises an ambient medium that is (i) vacuum characterized by the bulk refractive index $n_2(\lambda)=1$, or (ii) gaseous or liquid material characterized by the bulk refractive index $n_2(\lambda)$.

3. The optical element of claim 1 wherein the second optical medium comprises substantially solid material characterized by the bulk refractive index $n_2(\lambda)$.

4. The optical element of claim 3 wherein the second optical medium comprises a substantially solid reflowed material.

5. The optical element of claim 1 wherein the contiguous multitude of discrete volumes is arranged so that: (i) any locally perpendicular straight-line path, extending from the first surface of the transmissive layer to a second surface of the transmissive layer, passes through only the first optical medium, through only the second optical medium, or through only one discrete volume of each of the first and second optical media; and (ii) the discrete volumes of the multitude are distributed on the transmissive layer according to local thicknesses $d_{1R}(x,y)$ and $d_{2R}(x,y)$ through the first and second optical media, respectively, along the locally perpendicular straight-line path through a given position $(x,y)$.

6. The optical element of claim 5 wherein the transmissive layer includes areal regions for which either $d_{1R}(x,y)$ or $d_{2R}(x,y)$, but not both, is substantially equal to zero.

7. The optical element of claim 5 wherein the transmissive layer includes (i) areal regions for which $d_{1R}(x,y)\neq 0$ and $d_{2R}(x,y)=0$, (ii) areal regions for which $d_{1R}(x,y)=0$ and $d_{2R}(x,y)\neq 0$, and (iii) areal regions for which $d_{1R}(x,y)\neq 0$ and $d_{2R}(x,y)\neq 0$.

8. The optical element of claim 5 wherein the contiguous multitude of discrete volumes is arranged so that $(2\pi/\lambda_0)\cdot(n_1(\lambda_0)\cdot d_{1R}(x,y)+n_2(\lambda_0)\cdot d_{2R}(x,y))$, averaged over a sampling area having a largest transverse dimension about equal to $\lambda_0$ along the first surface, is either (i) substantially equal to or substantially proportional to $\varphi_{eff}(x,y)$ for a transmitting optical element or (ii) substantially equal to or substantially proportional to $½\cdot\varphi_{eff}(x,y)$ for a reflecting optical element.

9. The optical element of claim 1 further comprising a solid substrate or overlayer positioned against the first surface of the transmissive layer, wherein the substrate or overlayer against the first surface is substantially transparent over the operational wavelength range.

10. The optical element of claim 9 wherein the transmissive layer comprises a surface relief structure on a surface of the substrate or overlayer against the first surface with the second optical medium substantially filling recessed regions of the surface relief structure.

11. The optical element of claim 1 wherein:
(c') the optical element is structurally arranged so as to receive the incident optical signal on the first surface within the transmission region and to transmit at least a portion of the incident optical signal transformed substantially according to the effective phase transformation function $\varphi_{eff}(x,y)$; and
(d') the discrete volumes of the multitude are variously sized and distributed on the transmissive layer so as to impart on the transmitted portion of the incident optical signal the effective phase transformation $\varphi_{eff}(x,y)$.

12. The optical element of claim 11 further comprising a solid substrate or overlayer positioned against the second surface of the transmissive layer, wherein the substrate or overlayer against the second surface is substantially transparent over the operational wavelength range.

13. The optical element of claim 12 wherein the transmissive layer comprises a surface relief structure on a surface of the substrate or overlayer against the second surface with the second optical medium substantially filling recessed regions of the surface relief structure.

14. The optical element of claim 1 further comprising a reflector facing the second surface of the transmissive layer, wherein:
(c') the optical element is structurally arranged so as to receive the incident optical signal on the first surface within the transmission region and to reflect at least a portion of the incident optical signal transformed substantially according to the effective phase transformation function $\varphi_{eff}(x,y)$; and
(d') the discrete volumes of the multitude are variously sized and distributed on the transmissive layer so as to impart on the reflected portion of the incident optical signal the effective phase transformation $\varphi_{eff}(x,y)$.

15. The optical element of claim 14 further comprising a substrate positioned against the reflector with the reflector positioned between the substrate and the second surface of the transmissive layer.

16. The optical element of claim 14 wherein the optical element further comprises a substantially solid overlayer that is substantially transparent over the operational wavelength range, and the transmissive layer is positioned between the reflector and the overlayer.

17. The optical element of claim 1 wherein the effective phase transformation function $\varphi_{eff}(x,y)$ approximates a function of the form $\varphi(x,y)=Ax^2+By^2$, or $\varphi(x,y)=Ax^2+By^2$ modulo $2\pi$, where A and B are non-zero, positive or negative real numbers.

18. The optical element of claim 1 wherein the effective phase transformation function $\varphi_{eff}(x,y)$ approximates a function of the form $\varphi(\theta)=M\theta$, or $\varphi(\theta)=M\theta$ modulo $2\pi$, for $0\leq\theta<2\pi$, where $\theta$ is related to x and y by $\cos\theta=x/(x^2+y^2)^{1/2}$ and $\sin\theta=y/(x^2+y^2)^{1/2}$ and M is a non-zero integer.

19. The optical element of claim 1 wherein the effective phase transformation function $\varphi_{eff}(x,y)$ approximates a sum, or a modulo $2\pi$ sum, of distinct, specified, position-dependent phase transformation functions $\varphi_1(x,y)$ and $\varphi_2(x,y)$.

20. The optical element of claim 19 wherein (i) $\varphi_1(x,y)=Ax^2+By^2$, or $\varphi_1(x,y)=Ax^2+By^2$ modulo $2\pi$, where A and B are non-zero, positive or negative real numbers, and (ii) $\varphi_2(x,y)=M\theta$, or $\varphi_2(\theta)=M\theta$ modulo $2\pi$, for $0\leq\theta<2\pi$, where $\theta$ is related to x and y by $\cos\theta=x/(x^2+y^2)^{1/2}$ and $\sin\theta=y/(x^2+y^2)^{1/2}$ and M is a non-zero integer.

21. A method employing the optical element of claim 1, the method comprising (i) directing an optical signal onto the first surface of the transmissive layer of the optical element and (ii) transmitting through or reflecting from the optical element at least a portion of the incident optical signal transformed substantially according to the effective phase transformation function $\varphi_{eff}(x,y)$.

22. A method for making an optical element comprising a transmissive layer comprising first and second optical media, the method comprising:
(A) spatially selectively processing a layer comprising the first optical medium to remove the first optical medium from selected volumes of the first optical medium, so that the first optical medium is arranged according to a local thickness $d_1(x,y)$ through the first optical medium along a locally perpendicular straight-line path through the transmissive layer at a given position $(x,y)$ along the transmissive layer;
(B) heating the transmissive layer so as to cause at least partial reflow of the first optical medium, so that (i) the first optical medium is arranged according to a local thickness $d_{1R}(x,y)$ through the first optical medium along a locally perpendicular straight-line path through the transmissive layer at a given position $(x,y)$ along the transmissive layer, and (ii) over at least a portion of the transmissive layer, where $d_{1R}(x,y)\neq d_1(x,y)$; and
(C) arranging a second optical medium to form a portion of the transmissive layer, so that the second optical medium is arranged according to a local thickness $d_{2R}(x,y)$ through the second optical medium along a locally perpendicular straight-line path through the transmissive layer at a given position (x,y) along the transmissive layer, wherein:
- (D) the first and second optical media are substantially transparent over an operational wavelength range including a design vacuum wavelength $\lambda_0$ and are characterized by differing respective first and second wavelength-dependent bulk refractive indices $n_1(\lambda)$ and $n_2(\lambda)$, and the first optical medium comprises substantially solid material;
- (E) after part (A) and before part (B), (i) the transmissive layer is arranged as a contiguous multitude of discrete volumes, including a non-empty subset of volumes of the multitude having a largest transverse dimension less than about $\lambda_0$, and (ii) each volume of the multitude either comprises the first optical medium or is one of the selected volumes from which the first optical medium was removed in part (A);
- (F) the optical element is structurally arranged so as to receive an optical signal incident on the transmissive layer and to transmit or reflect at least a portion of the incident optical signal transformed substantially according to a specified effective phase transformation function $\varphi_{eff}(x,y)$ that varies as a function of two-dimensional position coordinates x and y along the first surface; and
- (G) the discrete volumes of the multitude are variously sized and distributed on the transmissive layer so that, after parts (A), (B), and (C), the transmissive layer is arranged so as to impart on the transmitted or reflected portion of the incident optical signal the effective phase transformation $\varphi_{eff}(x,y)$.

23. The method of claim 22, the method further comprising:
- (A') specifying the effective phase transformation function $\varphi_{eff}(x,y)$;
- (B') forming the method of claim 22 to form an intermediate optical element in accordance with an estimated arrangement of the volumes of the multitude and an estimated reflow process sequence;
- (C') measuring an intermediate phase function $\varphi_{inter}(x,y)$ imparted on a portion of an incident optical signal transmitted or reflected by the intermediate optical element;
- (D') altering the estimated arrangement of the volumes of the multitude, or the reflow process sequence, in accordance with a difference between $\varphi_{eff}(x,y)$ and $\varphi_{inter}(x,y)$; and
- (E') repeating steps (B'), (C'), and (D') using successively altered arrangements of the volumes of the multitude or reflow process sequences until the difference between $\varphi_{eff}(x,y)$ and $\varphi_{inter}(x,y)$ is less than a specified allowable phase error,
- (F') wherein the optical element is the intermediate optical element having the difference between $\varphi_{eff}(x,y)$ and $\varphi_{inter}(x,y)$ that is less than the specified allowable phase error.

24. The method of claim 22 wherein, after part (A) and before part (B), any locally perpendicular straight-line path through the transmissive layer passes through only a volume comprising the first optical medium, through only a volume from which the first optical medium was removed in part (A), or through only one volume of each type.

25. The method of claim 22 further wherein the optical element further comprises a substantially solid substrate arranged so as to support the transmissive layer.

26. The method of claim 25 wherein the substrate is substantially transparent over the operational wavelength range.

27. The method of claim 22 wherein the second optical medium comprises an ambient medium that is (i) vacuum characterized by the bulk refractive index $n_2(\lambda)=1$, or (ii) gaseous or liquid material characterized by the bulk refractive index $n_2(\lambda)$.

28. The method of claim 22 wherein the second optical medium comprises substantially solid material characterized by the bulk refractive index $n_2(\lambda)$.

29. The method of claim 28 wherein part (C) is performed only after part (B).

30. The method of claim 28 wherein:
- (H) the second optical medium comprises substantially solid material;
- (I) part (A) includes replacing, in the selected volumes of the first optical medium, the first optical medium with the second optical medium, so that the second optical medium is arranged according to a local thickness $d_2(x,y)$ through the second optical medium along a locally perpendicular straight-line path through the transmissive layer at a given position (x,y) along the transmissive layer; and
- (J) part (C) includes the heating of part (B) that causes at least partial reflow of the second optical medium, so that (i) the second optical medium is arranged according to the local thickness $d_{2R}(x,y)$ through the second optical medium along a locally perpendicular straight-line path through the transmissive layer at a given position (x,y) along the transmissive layer, and (ii) over at least a portion of the transmissive layer, where $d_{2R}(x,y) \neq d_2(x,y)$.

31. The method of claim 30 wherein, after part (A) and before the heating of part (B), the first and second optical media are arranged according to the respective local thicknesses $d_1(x,y)$ and $d_2(x,y)$ so that $(2\pi/\lambda_0) \cdot (n_1(\lambda_0) \cdot d_1(x,y) + n_2(\lambda_0) \cdot d_2(x,y))$, averaged over a sampling area having a largest transverse dimension about equal to $\lambda_0$ along the transmissive layer, is substantially equal to or substantially proportional to $\varphi_{eff}(x,y)$ for a transmitting optical element, or substantially equal to or substantially proportional to $\frac{1}{2} \cdot \varphi_{eff}(x,y)$ for a reflecting optical element.

32. The method of claim 30 wherein, after part (A) and before the heating of part (B), the transmissive layer has a substantially uniform thickness $d_1(x,y)+d_2(x,y)=D$.

33. The method of claim 30 wherein, after part (A) and before the heating of part (B), the transmissive layer includes areal regions for which either $d_1(x,y)$ or $d_2(x,y)$, but not both, is substantially equal to zero.

34. The method of claim 30 wherein, after part (A) and before the heating of part (B), the transmissive layer includes (i) areal regions for which $d_1(x,y) \neq 0$ and $d_2(x,y)=0$ and (ii) areal regions for which $d_1(x,y)=0$ and $d_2(x,y) \neq 0$.

35. The method of claim 22 wherein, after parts (A), (B), and (C), the transmissive layer is arranged so that $(2\pi/\lambda_0) \cdot (n_1(\lambda_0) \cdot d_{1R}(x,y) + n_2(\lambda_0) \cdot d_{2R}(x,y))$, as a function of two-dimensional position coordinates x and y along the transmissive layer, averaged over a sampling area having a largest transverse dimension about equal to $\lambda_0$ along the transmissive layer, is substantially equal to or substantially proportional to a specified position-dependent effective phase transformation function $\varphi_{eff}(x,y)$ for a transmitting optical element, or substantially equal to or substantially proportional to $\frac{1}{2} \cdot \varphi_{eff}(x,y)$ for a reflecting optical element.

36. The method of claim 22 wherein the transmissive layer has a substantially uniform thickness $d_1(x,y)+$ $d_2(x,y)=D$ that is substantially equal to $N\lambda_0/(2|n_1(\lambda_0)-n_2(\lambda_0)|)$, where N is a non-zero integer.

37. The method of claim 36 wherein N=1 or N=2.

38. The method of claim 22 wherein:
(F') the optical element is structurally arranged so as to receive the optical signal incident on the transmissive layer and to transmit at least a portion of the incident optical signal transformed substantially according to the effective phase transformation function $\varphi_{eff}(x,y)$; and
(G') the discrete volumes of the multitude are variously sized and distributed on the transmissive layer so that, after parts (A), (B), and (C), the transmissive layer is arranged so as to impart on the transmitted portion of the incident optical signal the effective phase transformation $\varphi_{eff}(x,y)$.

39. The method of claim 38 wherein the optical element further comprises a substantially solid substrate arranged so as to support the transmissive layer, and the substrate is substantially transparent over the operational wavelength range.

40. The method of claim 39 wherein the optical element further comprises a substantially solid overlayer that is substantially transparent over the operational wavelength range, and the transmissive layer is positioned between the substrate and the overlayer.

41. The method of claim 22 wherein the optical element further comprises a reflector positioned on a surface of the transmissive layer, and wherein:
(F') the optical element is structurally arranged so as to receive an optical signal incident on the transmissive layer and to reflect at least a portion of the incident optical signal transformed substantially according to the effective phase transformation function $\varphi_{eff}(x,y)$; and
(G') the discrete volumes of the multitude are variously sized and distributed on the transmissive layer so that, after parts (A), (B), and (C), the transmissive layer is arranged so as to impart on the reflected portion of the incident optical signal the effective phase transformation $\varphi_{eff}(x,y)$.

42. The method of claim 41 wherein the optical element further comprises a substantially solid substrate arranged so as to support the transmissive layer, and the reflector is positioned between the substrate and the transmissive layer.

43. The method of claim 42 wherein the optical element further comprises a substantially solid overlayer that is substantially transparent over the operational wavelength range, and the transmissive layer is positioned between the reflector and the overlayer.

44. The method of claim 41 wherein the optical element further comprises a substantially solid substrate arranged so as to support the transmissive layer, the transmissive layer is positioned between the substrate and the reflector, and the substrate is substantially transparent over the operational wavelength range.

45. The method of claim 22 wherein, after part (A) and before the heating of part (B), (i) the transmissive layer has a substantially uniform thickness $d_1(x,y)+d_2(x,y)=D$, and (ii) the discrete volumes of the multitude are arranged according to a regular two-dimensional grid pattern along the first surface of the transmissive layer characterized by a grid spacing of $\Lambda_0$ between about $\lambda_0/20$ and about $\lambda_0$.

46. The method of claim 45 wherein, after part (A) and before the heating of part (B), the multitude of discrete volumes is arranged so that, within each unit cell of the grid pattern, the discrete volumes or portions thereof encompassed by that unit cell are arranged according to one of a set of K predetermined unit arrangements, so that $(2\pi/\lambda_0)\cdot(n_1(\lambda_0)\cdot d_1(x,y)+n_2(\lambda_0)\cdot d_2(x,y))$, averaged over each unit cell of the grid pattern, can assume one of K discrete values.

47. The method of claim 45 wherein, after part (A) and before the heating of part (B), the multitude of discrete volumes is arranged so that (i) the discrete volumes or portions thereof encompassed by each unit cell of the grid pattern are arranged as a single simply connected volume of the first optical medium surrounded by the second optical medium and one or both of the first and second surfaces or (ii) the discrete volumes or portions thereof encompassed by each unit cell of the grid pattern are arranged as a single simply connected volume of the second optical medium surrounded by the first optical medium and one or both of the first and second surfaces, so that $(2\pi/\lambda_0)\cdot(n_1(\lambda_0)\cdot d_1(x,y)+n_2(\lambda_0)\cdot d_2(x,y))$, averaged over each unit cell of the grid pattern, can assume a substantially continuous range of values according to a size of each unit cell occupied by the corresponding simply connected volume.

* * * * *